United States Patent
Momiyama

(10) Patent No.: US 8,759,918 B2
(45) Date of Patent: Jun. 24, 2014

(54) SEMICONDUCTOR DEVICE AND SEMICONDUCTOR LOGIC CIRCUIT DEVICE

(75) Inventor: Youichi Momiyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 192 days.

(21) Appl. No.: 13/398,056

(22) Filed: Feb. 16, 2012

(65) Prior Publication Data

US 2012/0146149 A1 Jun. 14, 2012

Related U.S. Application Data

(63) Continuation of application No. PCT/JP2009/067499, filed on Oct. 7, 2009.

(51) Int. Cl.
*H01L 27/12* (2006.01)

(52) U.S. Cl.
USPC .................................. 257/351; 257/E27.062

(58) Field of Classification Search
USPC .......................................... 257/351, E27.062
See application file for complete search history.

(56) References Cited

U.S. PATENT DOCUMENTS

| | | | |
|---|---|---|---|
| 2004/0124439 A1 | 7/2004 | Minami et al. | |
| 2005/0205938 A1 | 9/2005 | Yagishita | |
| 2005/0280052 A1 | 12/2005 | Holz et al. | |
| 2009/0050965 A1 | 2/2009 | Okamoto | |
| 2009/0159938 A1 | 6/2009 | Nuttinck et al. | |

FOREIGN PATENT DOCUMENTS

| | | |
|---|---|---|
| JP | 2000-332120 A | 11/2000 |
| JP | 2004-103613 A | 4/2004 |
| JP | 2005-197462 A | 7/2005 |
| JP | 2005-340579 A | 12/2005 |
| JP | 2006-502573 A | 1/2006 |
| JP | 2009-049171 A | 3/2009 |
| JP | 2009-522800 A | 6/2009 |
| WO | 2004/034458 A1 | 4/2004 |
| WO | 2007/077540 A1 | 7/2007 |

OTHER PUBLICATIONS

International Search Report of PCT/JP2009/067499, mailing date Dec. 22, 2009.

*Primary Examiner* — Timor Karimy
(74) *Attorney, Agent, or Firm* — Westerman, Hattori, Daniels & Adrian, LLP

(57) ABSTRACT

A semiconductor device includes two Dt-MOS transistors each having insulation regions respectively under the source and drain regions, the two Dt-MOS transistors sharing a diffusion region as a source region of one Dt-MOS transistor and a drain region of the other Dt-MOS transistor, wherein the insulation regions have respective bottom edges located lower than bottom edges of respective body regions of the Dt-MOS transistors, and wherein the bottom edges of the respective body regions are located deeper than respective bottom edges of the source and drain regions of the Dt-MOS transistors.

11 Claims, 50 Drawing Sheets

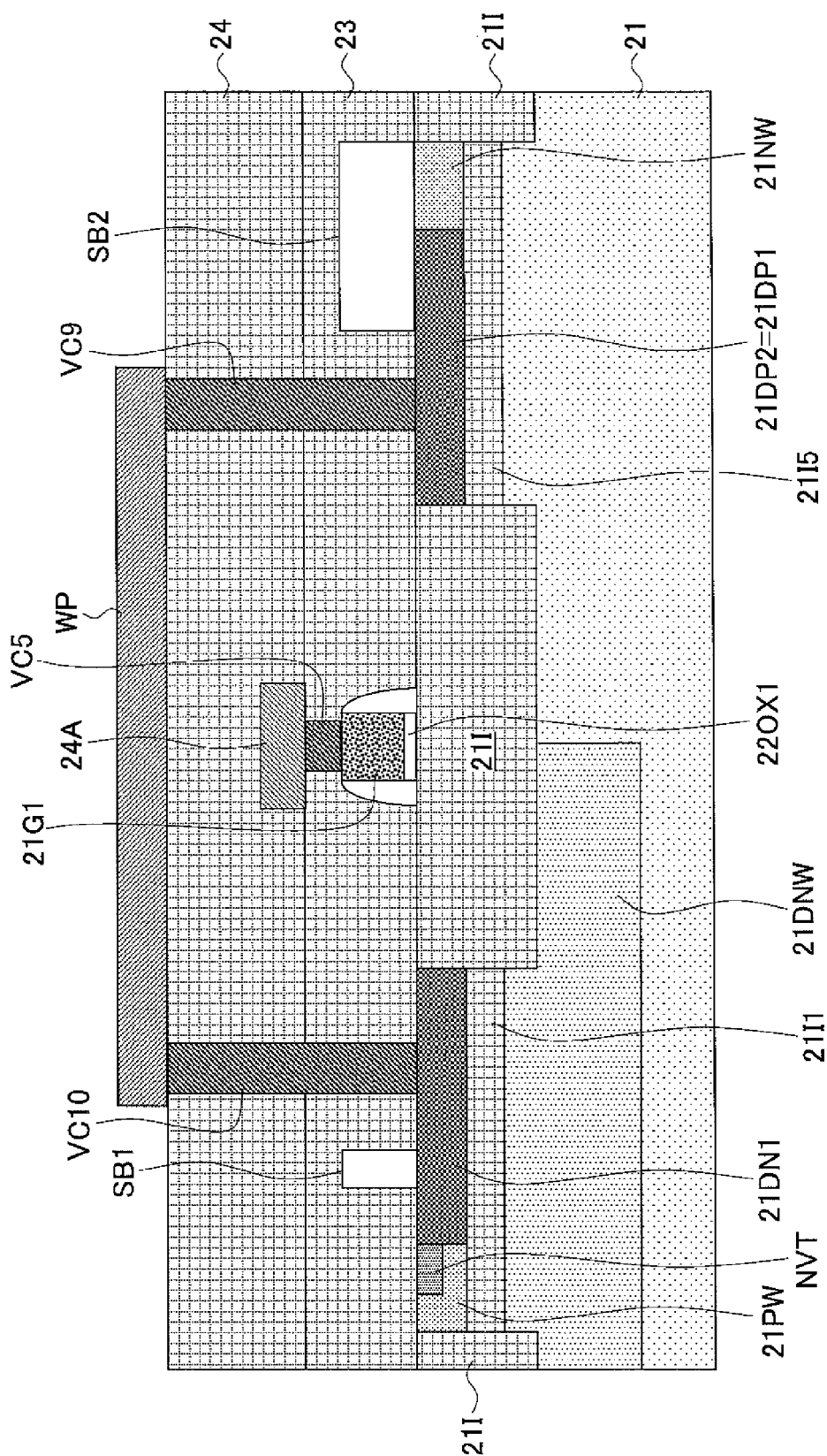

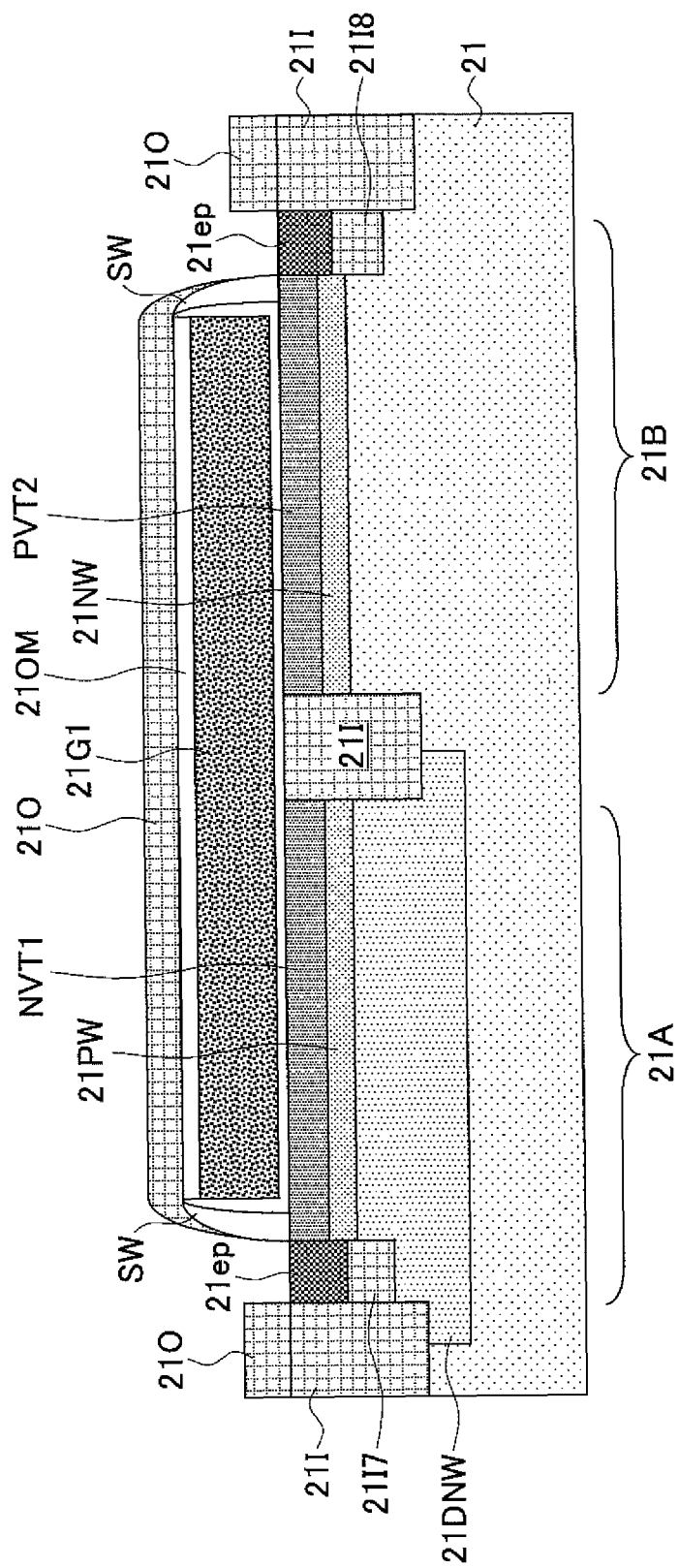

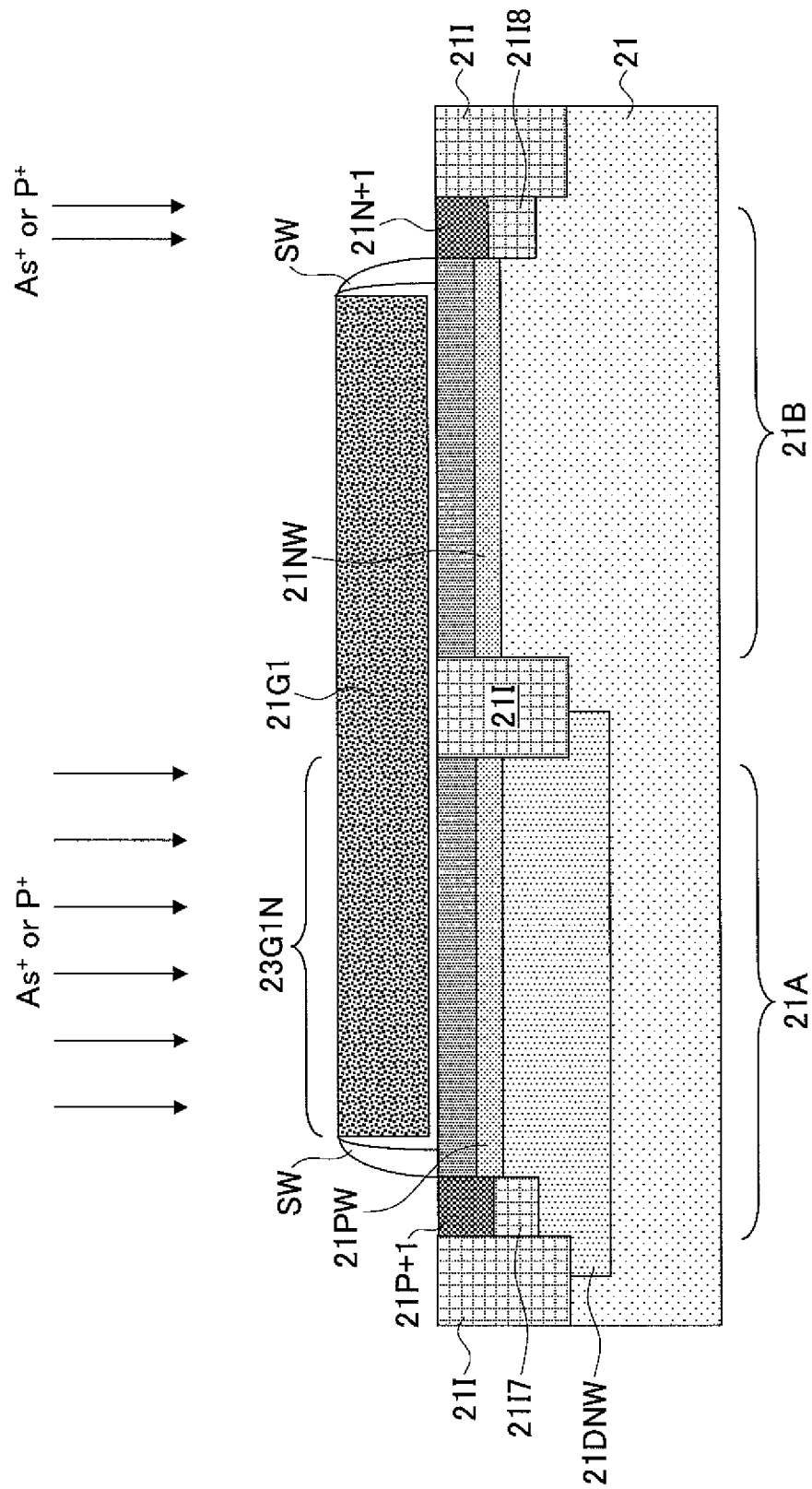

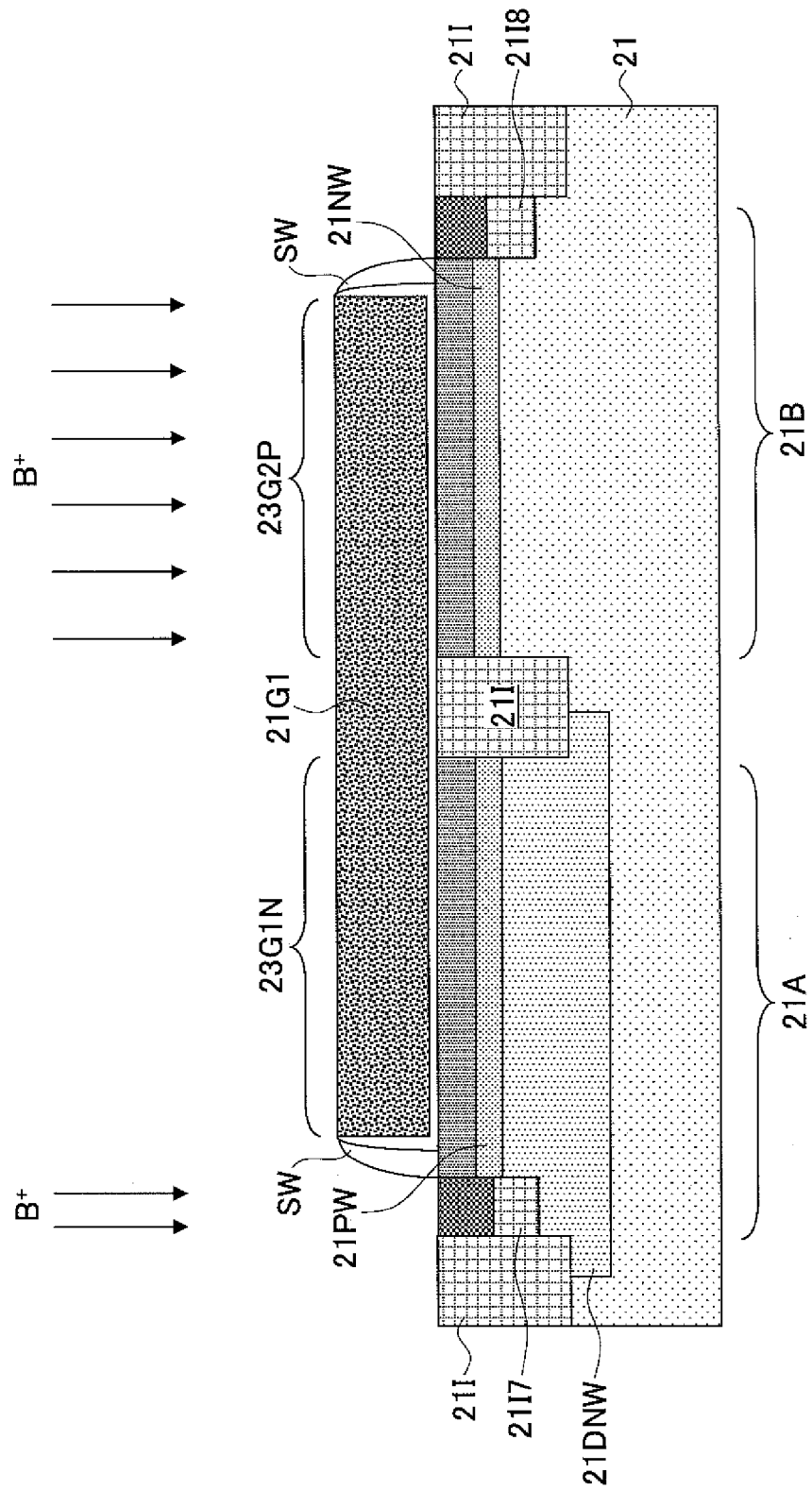

US 8,759,918 B2

SEMICONDUCTOR DEVICE AND SEMICONDUCTOR LOGIC CIRCUIT DEVICE

CROSS-REFERENCE TO RELATED APPLICATIONS

This application is a U.S. continuation application filed under 35 USC 111a and 365c of PCT application JP2009/067499, filed Oct. 7, 2009. The foregoing application is hereby incorporated herein by reference.

FIELD

The embodiments described herein relate to a semiconductor device that uses a dynamic threshold MOS transistor (referred to hereinafter as Dt-MOS transistor).

BACKGROUND

A Dt-MOS transistor is a MOS transistor having a gate electrode connected to a semiconductor layer or well region in which a channel region is formed. Thus, an input signal is applied simultaneously to the gate electrode and the semiconductor layer or the well layer in which the channel region is formed. A Dt-MOS transistor is characterized by low threshold voltage and is yet capable of realizing low OFF-current and large ON-current. Thus, a Dt-MOS transistor is thought suitable for low power consumption operation under low supply voltage. The semiconductor layer or the well region in which the channel region is formed is called "body".

PRIOR ART REFERENCES

Patent References

Patent Reference 1 Japanese Laid-Open Patent Application 2008-205322
Patent Reference 2 Japanese Laid-Open Patent Application 2005-19859
Patent Reference 3 Japanese Laid-Open Patent Application 2001-203348
Patent Reference 4 Japanese Laid-Open Patent Application 2002-208696

Non-Patent References

Non-Patent Reference 1 Assaderaaghi, F. et al., IEEE Electron Device Lett. 15, pp. 510- (1994)
Non-Patent Reference 2 Sharp Gihou Vol. 79, 2001, April

SUMMARY

In an aspect, there is provided a semiconductor device including two Dt-MOS transistors each having insulation regions respectively under the source and drain regions, the two Dt-MOS transistors sharing a diffusion region as a source region of one Dt-MOS transistor and a drain region of the other Dt-MOS transistor, wherein the insulation regions have respective bottom edges located lower than bottom edges of respective body regions of the Dt-MOS transistors, and wherein the bottom edges of the respective body regions are located deeper than respective bottom edges of the source and drain regions of the Dt-MOS transistors.

BRIEF DESCRIPTION OF THE DRAWINGS

FIG. 9 is a cross-sectional diagram taken along a line E-E' of FIG. 4;

DESCRIPTION OF EMBODIMENT

First Embodiment

Figure 1:
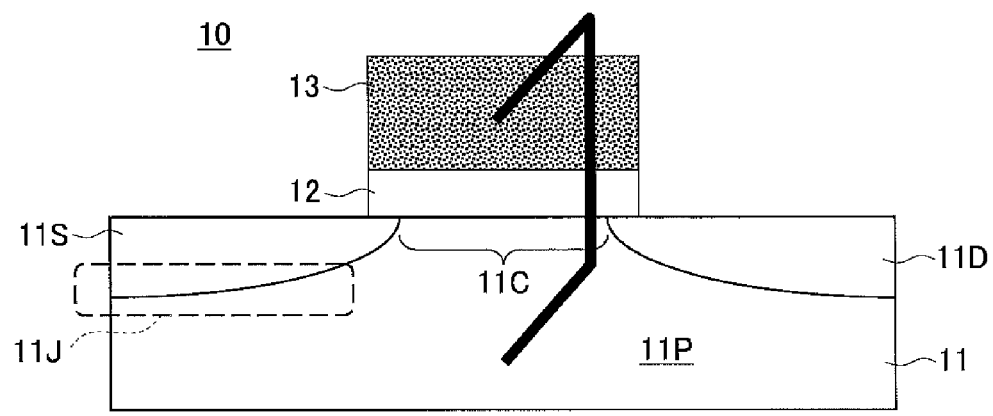
FIG. 1 is a diagram explaining the fundamental construction of a Dt-MOS transistor.
Figure 2:
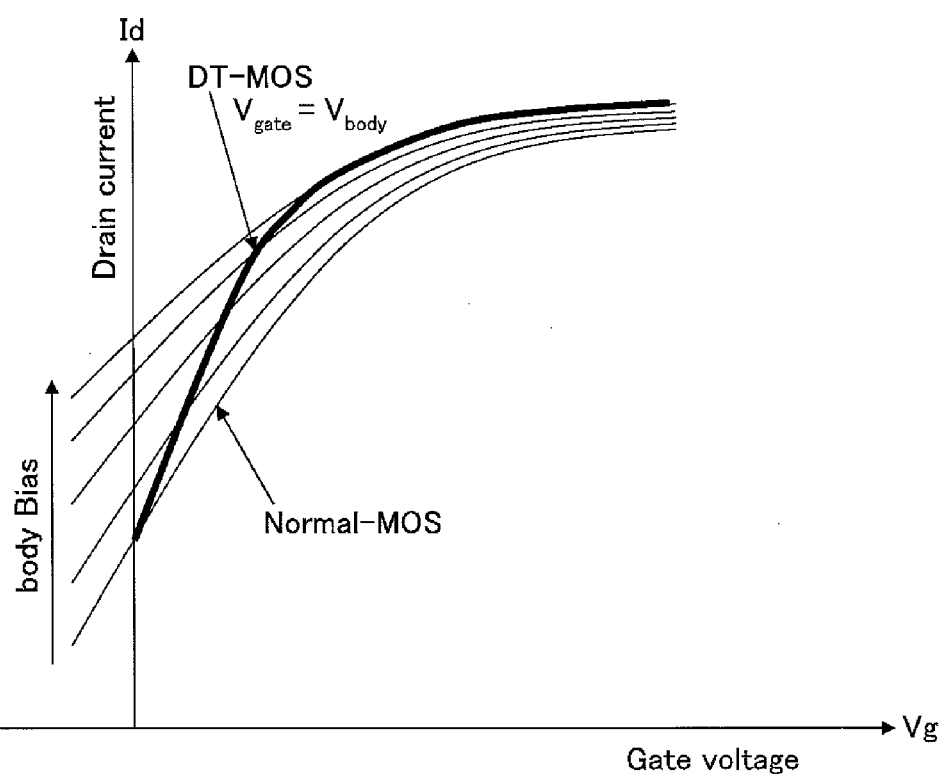
FIG. 2 is a graph representing a typical operational characteristic of a Dt-MOS transistor.

FIG. 1 is a diagram explaining the principle of a general Dt-MOS transistor 10 while FIG. 2 is a graph representing the operational characteristic of the Dt-MOS transistor 10 of FIG. 1.

Referring to FIG. 1, the exemplary Dt-MOS transistor 10 is an n-channel MOS transistor and is formed on a silicon substrate 11 in which a p-type well 11P is formed. The p-type well 11P includes a source region 11S and a drain region 11D doped to n-type. Further, on the silicon substrate 11, there is formed a gate electrode 13 of an n-type polysilicon over a channel region 11C between the source region 11S and the drain region 11D via a gate insulation film 12.

In the Dt-MOS transistor 10 of FIG. 1, the gate electrode 13 is further connected to the p-type well 11P, and hence to the body, electrically, and the signal voltage applied to the gate electrode 13 is applied also to the body 11P. As a result, the signal voltage functions to decrease the threshold voltage of the Dt-MOS transistor 10, and the operational characteristic of the Dt-MOS transistor 10 approaches the operational characteristic of a MOS transistor of low threshold voltage with increase of the signal voltage. Thus, the Dt-MOS transistor 10 switches ON with a low signal voltage.

On the other hand, in the case the signal voltage is low such as 0V or near 0V, the potential of the body 11P becomes 0V or near 0V, and the operational characteristic of the Dt-MOS transistor 10 approaches the operational characteristic of the MOS transistor having a high threshold voltage. Thus, the threshold voltage of the Dt-MOS transistor 10 is not different from that of an ordinary n-channel MOS transistor having a high threshold voltage, and as a result, the Dt-MOS transistor 10 shows a switch OFF operation characterized by low OFF current or leakage current as represented in FIG. 2.

With such a Dt-MOS transistor, it should be noted that a junction part 11J between the source region 11S and the body 11P indicated by a circle in FIG. 1 is subjected to forward biasing, and because of this, it is not possible to apply a large supply voltage between the source region 11S and the drain region 11D. In the case a silicon substrate is used for the substrate 11, there is imposed a constraint that the supply voltage has to be set to 0.7V or lower in correspondence to a built-in potential of a silicon p/n junction.

Further, it should be noted that the foregoing explanation holds also in the case of a p-channel MOS transistor in which the p-type and the n-type are reversed.

When such a Dt-MOS transistor is formed on an ordinary silicon substrate sliced out from a monocrystalline silicon ingot (referred to hereinafter as "silicon bulk substrate"), there arises a problem of increase of source or drain leakage current. Further, there arises a problem of increase of junction capacitance between the source region or drain region and the body. Such increase of junction capacitance affects the time constant and invites the problem of decrease of operational speed of the Dt-MOS transistor. Thus, conventional Dt-MOS transistors have been formed generally on an SOI substrate (Non-Patent Reference 1). The characteristic of FIG. 2 is of a Dt-MOS transistor described in Non-Patent Reference 2, which in turn is formed on an SOI substrate.

However, contrary to a simple, stand-alone Dt-MOS transistor, many semiconductor devices are required to be constructed in the form of integrated circuit, in which not only the Dt-MOS transistors that perform the dynamic threshold operation but also various other transistors are integrated on the same substrate as in the case of SoC (system-on-chip), in which a whole system is mounted on a single substrate. Such transistors may include those which should not perform the dynamic threshold operation as in the case of the input/output transistors or the transistors for analog applications.

In such a case, it would become necessary to fix the body potential with these transistors, by individually providing contacts for grounding the body, or the like. However, such a construction invites the problem of decrease of integration density and complexity of fabrication process, in addition to the increase of cost with the use of expensive SOI substrate. Further, there arises a problem that the potential of the body cannot follow the change of the input signal in case there is supplied a high-frequency signal as the input signal.

Further, in the case a Dt-MOS transistor is formed on an SOI substrate, the thickness of the silicon film 11P constituting the body becomes too thin and there is caused a problem of increase of the resistance of the body, which in turn leads to the decrease of the operational speed of the transistor caused by the time constant effect.

Conventionally, there have been made attempts to form a Dt-MOS transistor on a silicon bulk substrate. For example, Non-Patent Reference 2 proposes a structure that forms the source region and the drain region on the device isolation structure in the form of so-called elevated source/drain structure for decreasing the junction capacitance between the source or drain region and the body while avoiding the increase of device area at the same time.

However, with this conventional structure, although it is possible to solve the problem of increase of source leakage current or increase of junction capacitance, there is caused the problem of narrowing of the current path between the body and the source region or the drain region, which in turn leads to the problem of increase of the source resistance. Further, because the gate electrode is formed adjacent to the source region or drain region via an insulation film with such a structure, there arises a problem of increase of parasitic capacitance between the gate electrode and the source region or the drain region. Further, there is a problem that the fabrication process becomes complex.

Hereinafter, a semiconductor logic circuit device 20 according to a first embodiment that uses a Dt-MOS transistor will be explained.

Figure 3:
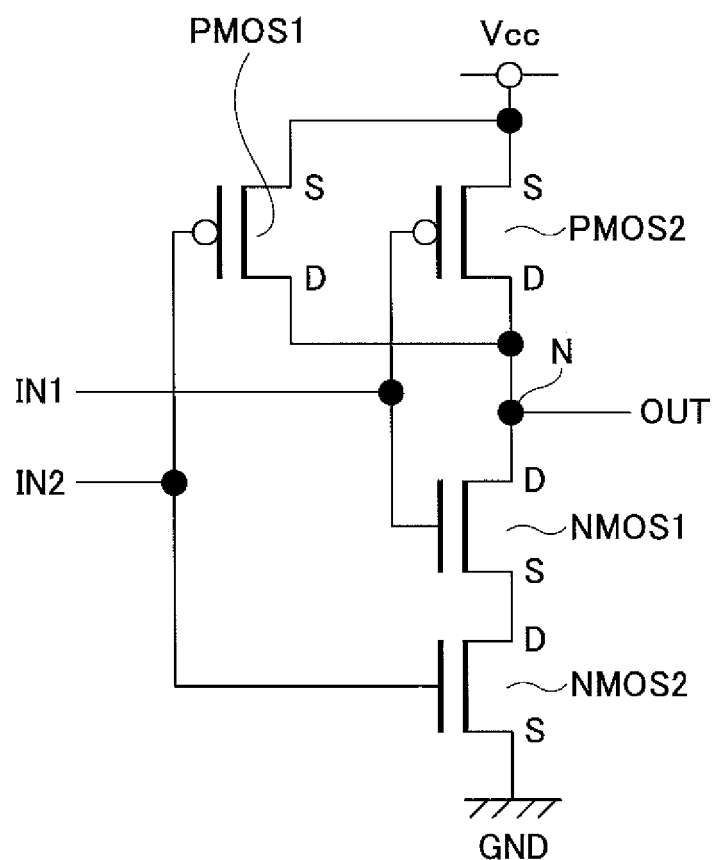
FIG. 3 is an equivalent circuit diagram of a semiconductor logic circuit device according to a first embodiment.
Figure 4:
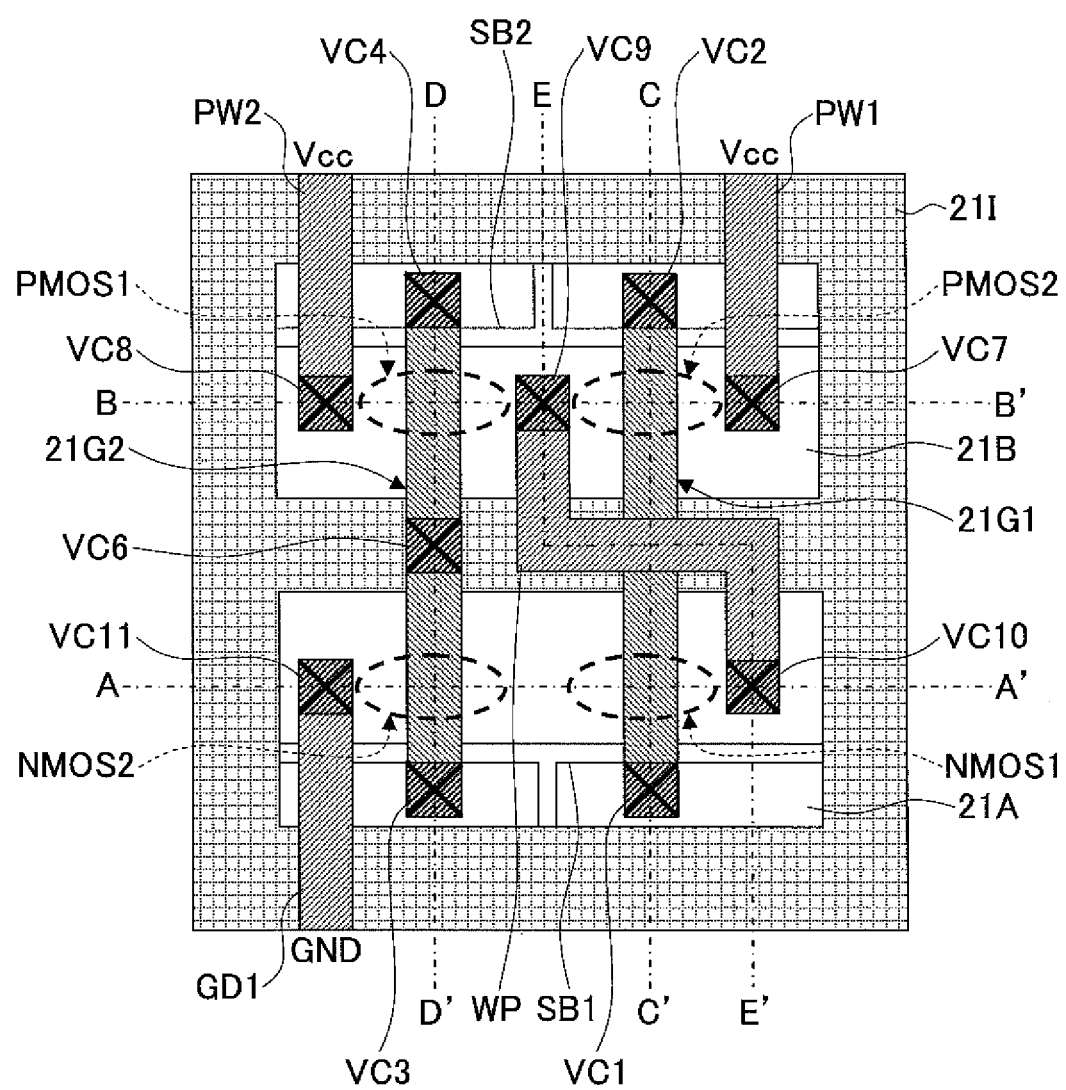
FIG. 4 is a plan view diagram representing a layout of the semiconductor logic circuit device of FIG. 3.

FIG. 3 is an equivalent circuit diagram of the semiconductor logic circuit device 20 of the first embodiment and FIG. 4 is a plan view diagram representing the layout thereof. Further, FIGS. 5-9 are cross-sectional diagrams respectively representing cross-sections taken along a line A-A', B-B', C-C', D-D' and E-E' of FIG. 4.

As can be seen from the equivalent circuit diagram of FIG. 3, the semiconductor logic circuit device 20 is a dual input NAND device and is formed of two p-channel MOS transistors PMOS1 and PMOS 2 connected parallel with each other and two n-channel MOS transistors NMOS1 and NMOS2 connected in series thereto. In the present embodiment, these p-channel MOS transistors PMOS1 and PMOS2 and n-channel MOPS transistors NMOS1 and NMOS2 are formed on a silicon bulk substrate 21 doped to p$^-$-type (reference should be made to FIGS. 5-9).

The p-channel MOS transistors PMOS1 and PMOS2 thus connected parallel have respective sources connected commonly to a power supply Vcc. Further, the p-channel MOS transistors PMOS1 and PMOS2 connected parallel have respective drains connected commonly to a drain D of the n-channel MOS transistor NMOS1. Further, the n-channel MOS transistor NMOS1 has a source connected to a drain D of the n-channel MOS transistor NMOS2 and the n-channel MOS transistor NMOS2 has a source S connected to the ground power supply GND.

Further, a first input signal IN1 is supplied to the respective gate electrodes of the p-channel MOS transistor PMOS2 and the n-channel MOS transistor NMOS1, and a second input signal IN2 is supplied to the respective gate electrodes of the p-channel MOS transistor PMOS1 and the n-channel MOS transistor NMOS2. Further, a logic output signal is obtained at a node N where the drains D of the p-channel MOS transistors PMOS1 and PMOS2 are connected to the drain D of the n-channel MOS transistor NMOS1.

Next, referring to the plan view diagram of FIG. 4, it can be seen that the silicon bulk substrate 21 is defined with a first device region 21A and a second device region 21B by a device isolation region 21I of the STI structure, wherein the device region 21A is formed with the n-channel MOS transistor NMOS1 with the gate electrode provided by a polysilicon pattern 21G1 and the n-channel MOS transistor NMOS2 with the gate electrode provided by a polysilicon pattern 21G2.

The polysilicon patterns 21G1 and 21G2 extend further into the device region 21B, in which the p-channel MOS transistors PMOS2 and PMOS1 are formed with the polysilicon patterns 21G1 and 21G2 as the respective gate electrodes.

The polysilicon pattern 21G1 is connected electrically to the device regions 21A and 21B respectively at the via-contacts VC1 and VC2. Likewise, the polysilicon pattern 21G2 is connected electrically to the device regions 21A and 21B respectively at the via-contacts VC3 and VC4. With this, the n-channel MOS transistors NMOS1 and NMOS2 and the p-channel MOS transistors PMOS1 and PMOS2 all perform the dynamic threshold operation explained previously with reference to FIG. 2.

Further, it should be noted that the p-channel MOS transistor PMOS1 shares the drain thereof with the drain of the p-channel MOS transistor PMOS2. Likewise, the n-channel MOS transistor NMOS1 shares the source thereof with the drain of the n-channel MOS transistor NMOS2. As a result of such a construction, it becomes possible to decrease the device area of the semiconductor logic circuit device 20 as compared with the case in which the p-channel MOS transistors PMOS1 and PMOS2 and the n-channel MOS transistors NMOS1 and NMOS2 are formed in the respective device regions that are formed with mutual separation by the device isolation structure.

Figure 7:
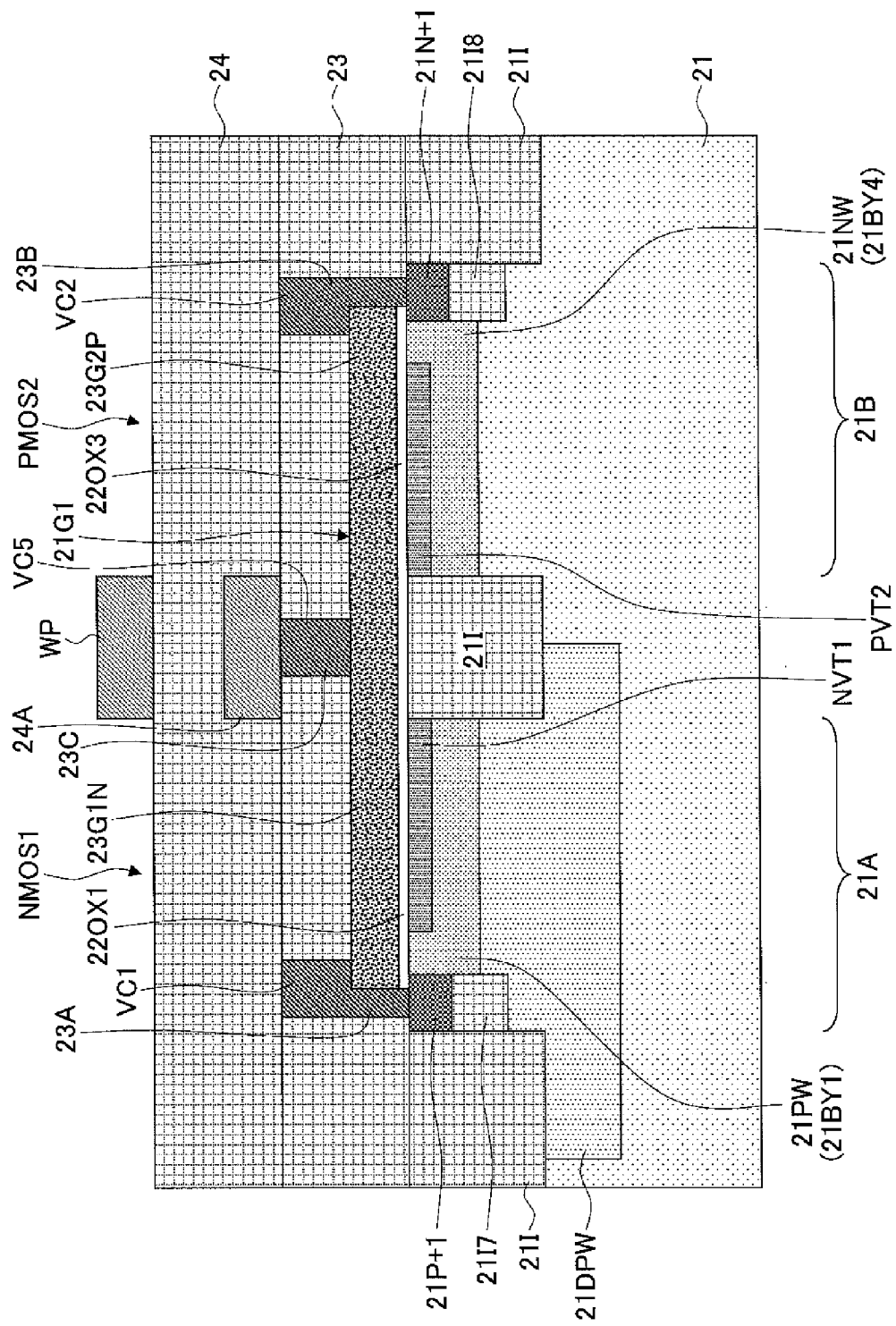
FIG. 7 is a cross-sectional diagram taken along a line C-C' of FIG. 4.

Further, while it is not visible in the plan view of FIG. 4, there is also formed a via-contact VC5 supplied with the input signal A in the polysilicon pattern 21G1 on the device isolation region 21I at the location between the device regions 21A and 21B (Reference should be made to FIG. 7). Similarly, the polysilicon pattern 21G2 is formed with a via-contact VC6 supplied with the input signal B on the device isolation region 21I at the location between the device regions 21A and 21B.

Further, in order to construct the circuit of FIG. 3, the device region 21B is formed with via-contacts VC7 and VC8 for supplying the power supply voltage Vcc to the respective sources S of the p-channel MOS transistors PMOS1 and PMOS2 from respective power supply patterns PW1 and PW2, and the common drain region D of the p-channel MOS transistors PMOS1 and PMOS2 is connected to a via-contact VC10 provided to the drain D of the n-channel MOS transistor NMOS1 by way of a via-contact VC9 and a wiring pattern WP. Further, the source region of the n-channel MOS transistor NMOS2 is connected to the ground GND via a via-contact VC11 and a ground pattern GD1, and the output of the semiconductor logic circuit 20 is obtained on the wiring pattern WP.

In the plan view of FIG. 4, it can be seen that there is formed an insulation pattern SB1 in the device region 21A so as to isolate the via-contacts VC1 and VC3 from each other and further from the via-contacts VC10 and VC11. The insulation pattern SB1 works as a silicide block structure, and thus, the problem of short circuit between the via-contact VC1 and any of the via-contacts VC3, VC10 and VC11 is avoided successfully even in the case there is formed a silicide layer (not illustrated) in the device region 21A. Likewise, as a result of the formation of the insulation pattern SB1, the problem of short circuit between the via-contact VC3 and any of the via-contacts VC1, VC10 and VC11 is successfully avoided even in the case there is formed a silicide layer (not illustrated) in the device region 21A.

Similarly, in the plan view of FIG. 4, it can be seen that there is formed another insulation pattern SB2 in the device region 21B so as to isolate the via-contacts VC2 and VC4 from each other and further from the via-contacts VC7 and VC8. The insulation pattern SB2, too, works as a silicide block structure, and thus, the problem of short circuit between the via-contact VC2 and any of the via-contacts VC4, VC7 and VC8 is avoided successfully even in the case there is formed a silicide layer (not illustrated) in the device region 21B. Likewise, as a result of the formation of the insulation pattern SB2, the problem of short circuit between the via-contact VC4 and any of the via-contacts VC2, VC7 and VC8 is successfully avoided even in the case there is formed a silicide layer (not illustrated) in the device region 21B.

The insulation patterns SB1 and SB2 can be formed at the time of formation of the sidewall insulation films to the polysilicon patterns 21G1 and 21G2 by adding a mask process.

Figure 5:
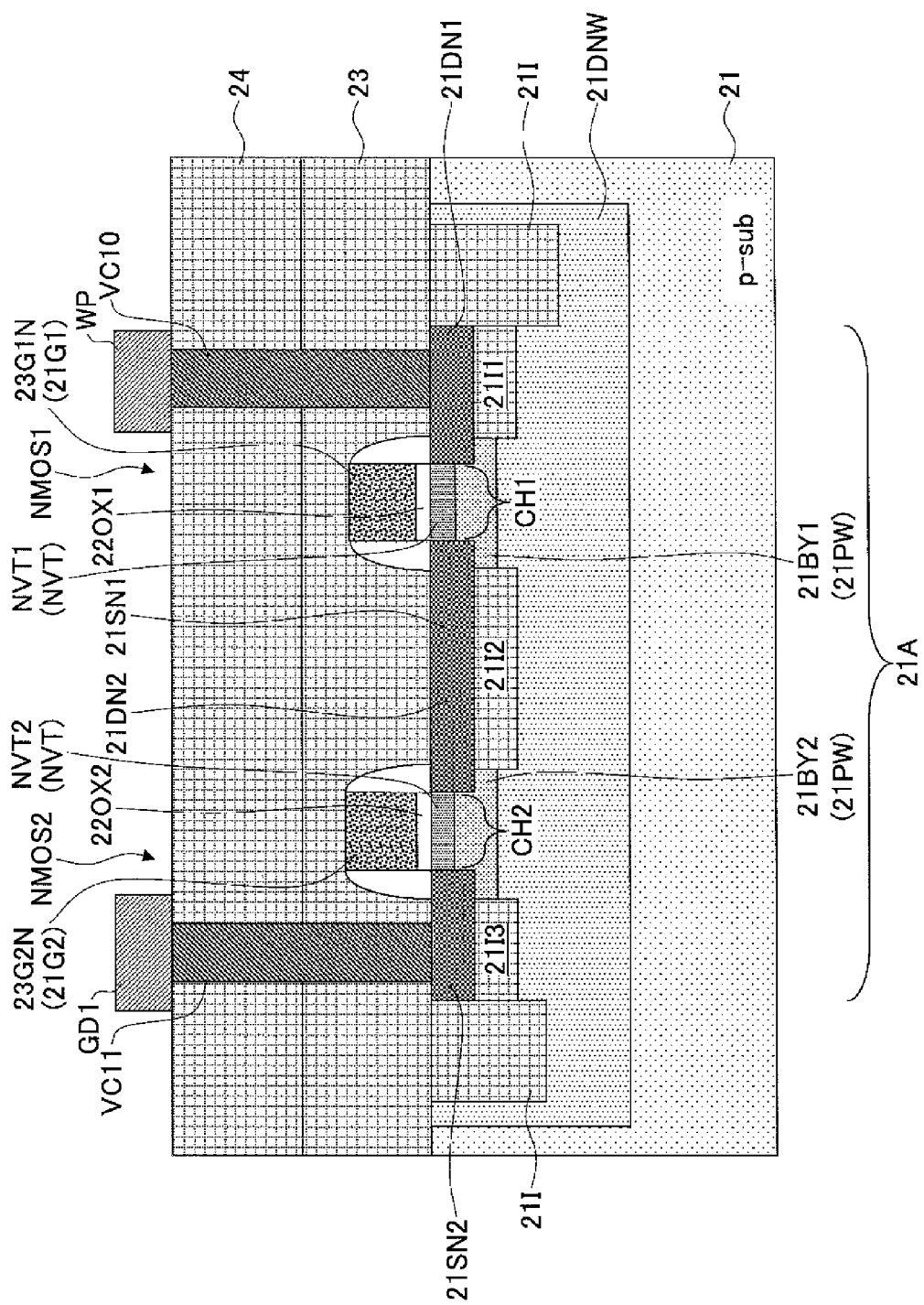
FIG. 5 is a cross-sectional diagram taken along a line A-A' of FIG. 4.

FIG. 5 is a cross-sectional view taken along a line A-A' in the plan view of FIG. 4.

Referring to FIG. 5, the device region 21A is formed with a deep n-type well 21DNW, wherein the surface part of the n-type well 21DNW is formed with a shallow p-type well 21PW constituting the body 21BY1 and 21BY2 of the n-channel MOS transistors NMOS1 and NMOS2 respectively in correspondence to the part right underneath the gate electrode 23G1N formed by the polysilicon pattern 21G1 and doped to n-type and in correspondence to the part right underneath the gate electrode 23G2N formed of the polysilicon pattern 21G2 and doped to n-type.

Further, there are formed p-type channel dope regions 21NVT1 and 21NVT2 respectively in correspondence to the surface part of the p-type bodies 21BY1 and 21BY2, and hence respectively in correspondence to the channel region CH1 of the MOS transistor NMOS1 right underneath the gate electrode 23G1 and the channel region CH2 of the MOS transistor NMOS2 right underneath the gate electrode 23G2N, for the purpose of threshold control, wherein the channel dope regions 21NVT1 and 21NVT2 are formed as a part of a p-type injection region 21NVT. Here, it should be noted that the function of the channel dope regions 21NVT1 and 21NVT2 may be provided by the p-type well 21PW that constitutes the body 21BY1 and 21BY2.

As represented in FIG. 4, the polysilicon pattern 21G1 constituting the gate electrode 23G1N is connected electrically to the body 21BY1 at the via-contact VC1, and as a result, the input signal IN1 applied to the gate electrode 23G1N is applied also to the body 21BY1 simultaneously. Thus, the n-channel MOS transistor NMOS1 performs the dynamic threshold operation. Similarly, the polysilicon pattern 21G2 constituting the gate electrode 23G2N is connected electrically to the body 21BY2 at the via-contact VC3, and as a result, the input signal IN2 applied to the gate electrode 23G2N is applied also to the body 21BY2 simultaneously. Thus, the n-channel MOS transistor NMOS2 performs the dynamic threshold operation explained previously with reference to FIG. 2, for example.

The gate electrodes 21G1N and 21G2N are formed on the silicon bulk substrate 21 respectively via gate insulation films 22Ox1 and 22Ox2, and in the deep well 21DNW, there are formed an n-type diffusion region 21DN1 constituting the drain of the n-channel MOS transistor NMOS1 at a first side of the channel region CH1. Further, there is formed an n-type diffusion region 21SN1 constituting the source of the n-channel MOS transistor NMOS1 at a side opposite to the diffusion region 21DN1 across the channel region CH1.

Similarly, the deep well 21DNW is formed with an n-type diffusion region 21DN2 constituting the drain of the n-channel MOS transistor NMOS2 at a first side of the channel region CH2, and there is further formed an n-type diffusion region 21SN2 constituting the source of the n-channel MOS transistor NMOS2 at the side opposite to the n-type diffusion region 21DN2 across the channel region CH2. Here, the n-type diffusion region 21SN1 and the n-type diffusion reaction 21DN2 are actually formed by the same n-type diffusion region, and because of this, it is possible with the present embodiment to reduce the area occupied by the semiconductor logic circuit 20 as explained previously.

Further, in the structure of FIG. 5, it should be noted that there are formed insulation regions 21I1, 21I2 and 21I3 of a silicon oxide film right underneath the n-type diffusion region 21DN1, the n-type diffusion region 21SN1, and hence the n-type diffusion region 21DN2, and the n-type diffusion region 21SN2, respectively.

It should be noted that the insulation region 21I1 continues to the adjacent device isolation region 21I, while the insulation region 21I3 continues to the adjacent device isolation region 21I. Further, the insulation regions 21I1, 21I2 and 21I3 are formed such that the respective bottom edges are located at a depth deeper than the bottom edge of the shallow p-type well 21PW constituting the bodies 21BY1 and 21BY2. As a result, the bodies 21BY1 and 21BY2 are eclectically isolated with each other, and there occurs no interference between the input signals IN1 and IN2.

Further, it should be noted that the bottom edges of the n-type diffusion regions 21DN1, 21SN1 and hence 21DN2, and 21SN2 are formed such that the respective bottom edges are located at a depth shallower than the bottom edge of the shallow p-type well 21PW. As a result, there is no risk that these n-type diffusion regions cause a short circuit with the n-type well 21NW underneath.

Further, with the construction of FIG. 5, it can be seen that there are laminated interlayer insulation films 23 and 24 over the silicon bulk substrate 21, and the via-contact VC10 is formed to penetrate through the interlayer insulation films 23 and 24 and makes a contact with the diffusion region 21DN1. Similarly, the via-contact VC11 makes a contact with the diffusion region 21SN2 after penetrating through the interlayer insulation films 23 and 24. The via-contact VC10 is contacted with the wiring pattern WP formed on the interlayer insulation film, and the via-contact VC11 is connected with the wiring pattern GD1, which in turn is formed on the interlayer insulation film 24 in connection with the ground voltage supply GND.

Figure 6:
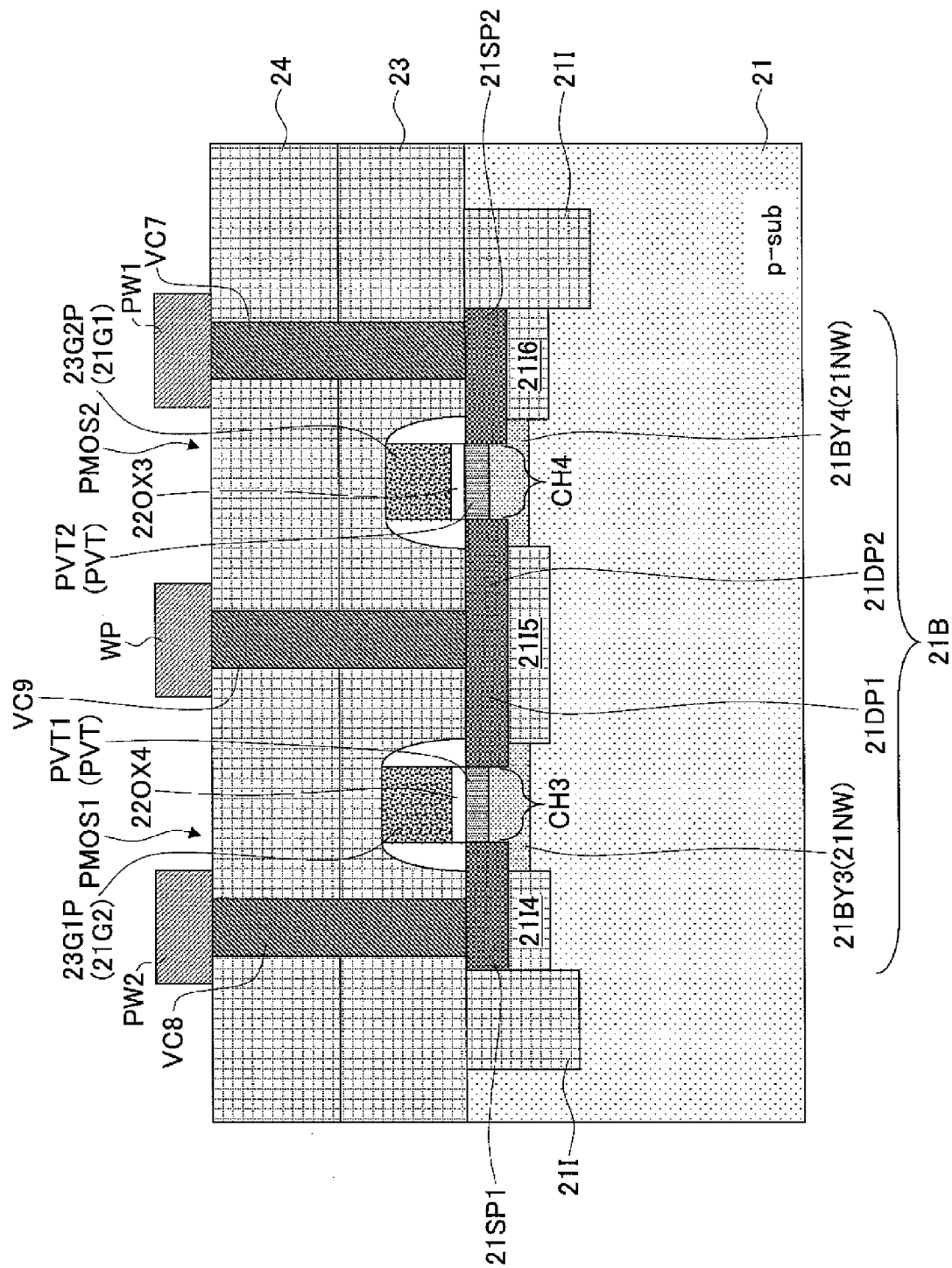
FIG. 6 is a cross-sectional diagram taken along a line B-B' of FIG. 4.

FIG. 6 is a cross-sectional view taken along a line B-B' in the plan view of FIG. 4.

Referring to FIG. 6, there is formed a shallow n-type well 21NW constituting the respective bodies 21BY4 and 21BY3 of the p-channel MOS transistors PMOS2 and PMOS2 in the surface part of the device region 21B respectively right underneath the p-doped gate electrode 23G2P constituted by the polysilicon pattern 21G1 and right underneath the p-doped gate electrode 21G1P constituted by the polysilicon pattern 21G2.

Further, there are formed n-type channel dope regions 21PVT1 and 21PVT2 respectively in correspondence to the surface part of the n-type bodies 21BY3 and 21BY4, and hence respectively in correspondence to the channel region CH3 of the MOS transistor PMOS1 right underneath the gate electrode 23G1P and the channel region CH4 of the MOS transistor PMOS2 right underneath the gate electrode 23G2P, for the purpose of threshold control, wherein the channel dope regions 21PVT1 and 21PVT2 are formed as a part of a n-type injection region 21PVT. Here, it should be noted that the function of the n-type channel dope regions 21PVT1 and 21PVT2 may be provided by the n-type well 21NW that constitutes the bodies 21BY3 and 21BY4.

As represented in FIG. 4, the polysilicon pattern 21G1 constituting the gate electrode 23G2P is connected electrically to the body 21BY4 at the via-contact VC2, and as a result, the input signal IN1 applied to the gate electrode 23G2P is applied also to the body 21BY4 simultaneously. Thus, the p-channel MOS transistor PMOS2 performs the dynamic threshold operation. Similarly, the polysilicon pattern 21G2 constituting the gate electrode 23G1P is connected electrically to the body 21BY3 at the via-contact VC4, and as a result, the input signal IN2 applied to the gate electrode 23G1P is applied also to the body 21BY3 simultaneously.

Thus, the p-channel MOS transistor PMOS1 performs the dynamic threshold operation explained previously with reference to FIG. 1, for example.

The gate electrodes 21G2P and 21G1P are formed on the silicon bulk substrate 21 respectively via gate insulation films 22Ox3 and 22Ox4, and in p-type silicon bulk substrate 21, there is formed a p-type diffusion region 21SP2 constituting the drain of the p-channel MOS transistor PMOS2 at a first side of the channel region CH4. Further, there is formed a p-type diffusion region 21DP2 constituting the source of the p-channel MOS transistor PMOS2 at a side opposite to the diffusion region 21SP2 across the channel region CH4.

Similarly, the p-type diffusion region 21DP1 is formed in the p-type silicon bulk substrate 21 constituting the drain of the p-channel MOS transistor PMOS1 at a first side of the channel region CH3, and there is further formed a p-type diffusion region 21SP1 constituting the source of the p-channel MOS transistor PMOS1 at the side opposite to the p-type diffusion region 21DP1 across the channel region CH3. Here, the p-type diffusion region 21DP2 and the p-type diffusion region 21DP1 are actually formed of the same p-type diffusion region, and the via-contact VP9 of FIG. 4 is connected to these. Thus, by constituting the p-type diffusion region 21DP2 and the p-type diffusion region 21DP1 by the same p-type diffusion region, it becomes possible with the present embodiment to reduce the area occupied by the semiconductor logic circuit as explained before.

The via-contact VP9 extends through the interlayer insulation films 23 and 24 and is connected to the wiring pattern WP formed on the interlayer insulation film 24.

In the structure of FIG. 6, it should be noted that there are formed insulation regions 21I4, 21I5 and 21I6 of a silicon oxide film right underneath the p-type diffusion region 21SP1, the p-type diffusion region 21DP1, and hence the p-type diffusion region 21DP2, the n-type diffusion region 21SP1, respectively.

The insulation region 21I4 continues to the adjacent device isolation region 21I, and the insulation region 21I6 also continues to the adjacent device isolation region 21I. Further, the insulation regions 21I3, 21I4 and 21I5 are formed such that the respective bottom edges are located at a depth deeper than the bottom edge of the shallow n-type well 21NW constituting the bodies 21BY3 and 21BY4. As a result, the bodies 21BY3 and 21BY4 are eclectically isolated with each other, and there occurs no interference between the input signals IN1 and IN2.

Further, it should be noted that the bottom edges of the p-type diffusion regions 21SP1, 21DP1 and hence 21DP2, and 21SP2 are formed such that the respective bottom edges are located at a depth shallower than the bottom edge of the shallow well 21NW. As a result, there is no risk that these p-type diffusion regions cause a short circuit with the p-type silicon bulk substrate 21 underneath.

Further, in the construction of FIG. 6, the via-contact VC1 makes a contact with the diffusion region 21SP2 after passing through the interlayer insulation films 23 and 24. Similarly, the via-contact VC8 makes a contact with the diffusion region 21SP1 after penetrating through the interlayer insulation films 23 and 24. The via-contact VC7 is contacted with the power supply pattern PW1 formed on the interlayer insulation film 24, and the via-contact VC8 is contacted with the power supply pattern PW2 on the interlayer insulation film 24.

FIG. 7 shows the cross-section of the semiconductor logic circuit 20 taken along a line C-C' of FIG. 4.

Referring to FIG. 7, it can be seen that the shallow p-type well 21PW including therein the channel dope region NVT1 is formed right underneath the gate electrode 23G1N constituted by a part of the polysilicon pattern 21G1, and the shallow p-type well 21PW is formed with a p-type region 21P+ of high concentration for ohmic connection in correspondence to the part of the polysilicon pattern 21G1 that constitutes the gate electrode 23G1N in the device region 21A. Further, the interlayer insulation film 23 is formed with an opening 23A exposing the p-type region 21P+ and the end of the gate electrode 23G1N, and the gate electrode 23G1N is connected to the shallow well 21PW by filling the opening 21A with a via contact VC1 formed of a metal plug.

Similarly, the shallow n-type well 21NW including therein the channel dope region PVT2 is formed right underneath the gate electrode 23G2P constituted by a part of the polysilicon pattern 21G1 in the device region 21B, and the shallow n-type well 21NW is formed with an n-type region 21N+1 of high concentration for ohmic connection in correspondence to the part of the polysilicon pattern 21G1 that constitutes the end part of the gate electrode 23G2P in the device region 21B. Further, in the interlayer insulation film 23, there is formed an opening 23B exposing the n+-type ohmic region 21N+1 and the foregoing end part of the gate electrode 23G1P, and the gate electrode 23G2P is connected to the shallow well 21NW via the n+-type ohmic region 21N+1 by filling the opening 23B with the via-contact VC2 of a metal plug.

As a result, the p-channel MOS transistor PMOS1 and the n-channel MOS transistor NMOS2 perform the dynamic threshold operation respectively.

The polysilicon pattern 21G1 is formed with a contact hole 23C in the interlayer insulation film 23 in correspondence to the device isolation region 21I between the device region 21A and the device region 21B, and the signal wiring pattern 24A formed on the interlayer insulation film 23 and supplied with the signal IN1 is connected to the polysilicon pattern 21G1 electrically by filling the contact hole 21C by the via-contact VC5 of a metal plug. While not illustrated, the polysilicon pattern 21G1 is formed with a low-resistance silicide layer thereon, and thus, there arises no such a problem as increase of electric resistance at the part of the polysilicon pattern 21G1 where the gate electrode 23G1N doped to the n-type and the gate electrode 23G1P doped to the p-type are connected. In the plan view of FIG. 4, it should be noted that the via-contact CV5, being formed right underneath the wiring pattern WP formed on the interlayer insulation film 24, is not illustrated.

Figure 8:
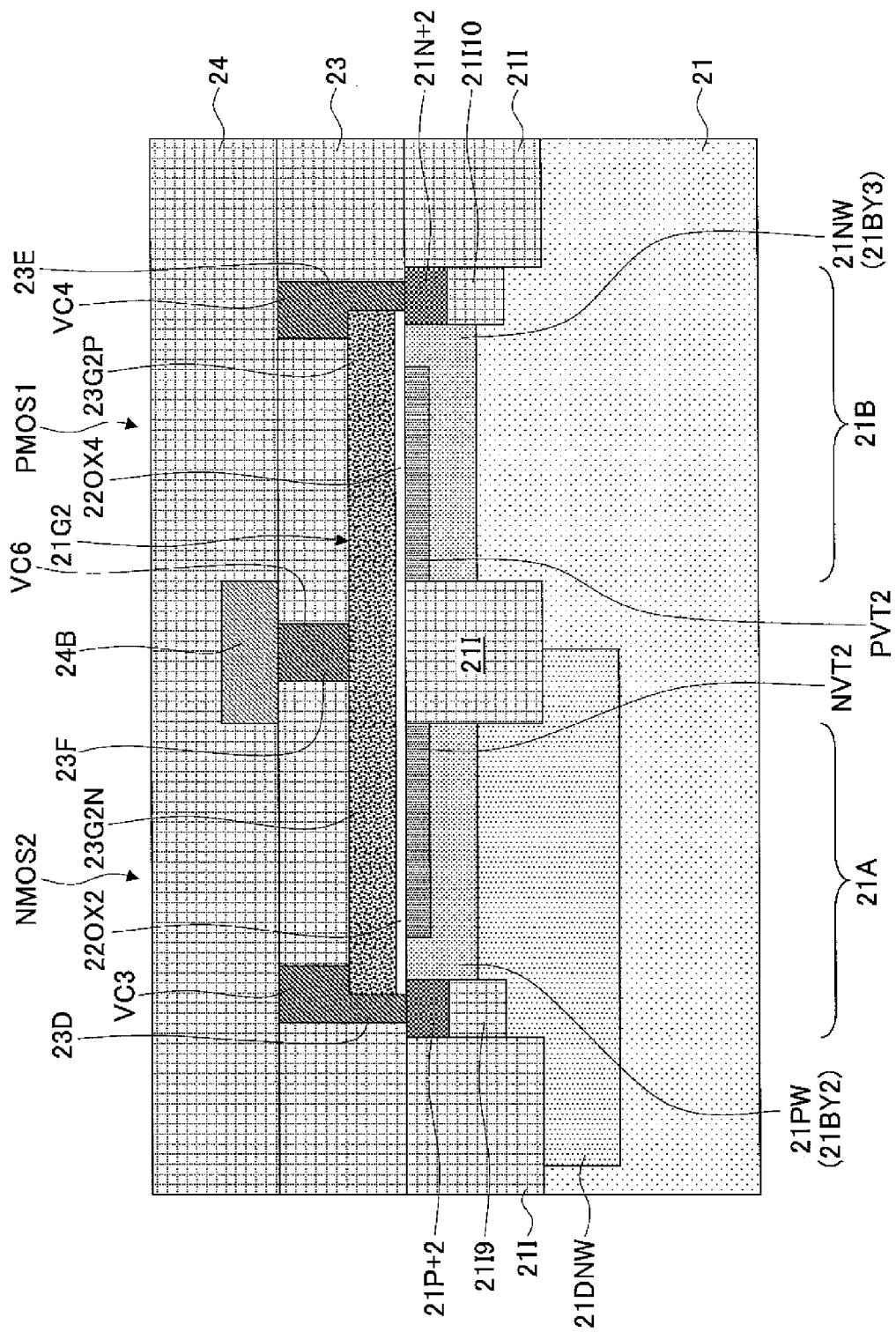
FIG. 8 is a cross-sectional diagram taken along a line D-D' of FIG. 4.

FIG. 8 shows the cross-section of the semiconductor logic circuit 20 taken along a line D-D' of FIG. 4.

Referring to FIG. 8, it can be seen that the shallow p-type well 21PW including therein the channel dope region NVT2 is formed right underneath the gate electrode 23G2N constituted by a part of the polysilicon pattern 21G2, and the shallow p-type well 21PW is formed with a p-type region 21P+2 of high concentration for ohmic connection in correspondence to the part of the polysilicon pattern 21G2 that constitutes the gate electrode 23G2N in the device region 21A. Further, in the interlayer insulation film 23, there is formed an opening 23A exposing the p type ohmic region 21P+2 and the foregoing end part of the gate electrode 23G2N, and the gate electrode 23G2N is connected to the shallow well 21PW via the p-type ohmic region 21P2 by filling the opening 23A with the via-contact VC3 of a metal plug.

Similarly, the shallow n-type well 21NW including therein the channel dope region PVT2 is formed right underneath the gate electrode 23G2P constituted by a part of the polysilicon pattern 21G1 in the device region 21B, and the shallow n-type well 21NW is formed with an n-type region 21N+1 of high concentration for ohmic connection in correspondence to the part of the polysilicon pattern 21G1 that constitutes the end part of the gate electrode 23G2P in the device region 21B. Further, in the interlayer insulation film 23, there is formed an opening 23E exposing the n-type ohmic region 21N+2 and the foregoing end part of the gate electrode 23G1P, and the gate electrode 23G1P is connected to the shallow well 21NW via the n-type ohmic region 21N+2 by filling the opening 23E with the via-contact VC4 of a metal plug.

As a result, the p-channel MOS transistor PMOS1 and the n-channel MOS transistor NMOS2 perform the dynamic threshold operation respectively.

The polysilicon pattern 21G2 is formed with a contact hole 23F in the interlayer insulation film 23 in correspondence to the device isolation region 21I between the device region 21A and the device region 21B, and the signal wiring pattern 24B formed on the interlayer insulation film 23 and supplied with the signal IN2 is connected to the polysilicon pattern 21G2 electrically by filling the contact hole 23F by the via-contact VC6 of a metal plug. While not illustrated, the polysilicon pattern 21G2 is formed with a low-resistance silicide layer thereon, and thus, there arises no such a problem as increase of electric resistance at the part of the polysilicon pattern 21G2 where the gate electrode 23G2N doped to the n-type and the gate electrode 23G2P doped to the p-type are connected.

FIG. 9 is a cross-sectional view taken along a line E-E' in the plan view of FIG. 4.

Referring to FIG. 9, it can be seen that the wiring pattern WP extends on the interlayer insulation film 24 while bridging over the via-contact VC5 formed on the polysilicon pattern 21G1 and the signal wiring pattern 24A and is connected to the p-type diffusion region 21DP1 via the via-contact VC9 and further to the n-type diffusion region 21DN1 via the via-contact VC10.

Further, in the cross-sectional diagram of FIG. 9 too, it can be seen that the insulation region 21I5 of a silicon oxide film is formed right underneath the n-type well 21NW and the p-type diffusion region 21DP, and hence the p-type diffusion region 21DP2 formed therein and that the insulation region 21I1 of a silicon oxide film is formed right underneath the p-type well 21PW and the n-type diffusion region 21DN1 formed therein.

With the semiconductor logic circuit device 20 of such a construction, the gate electrode 21G1N of the n-channel MOS transistor NMOS1 shown in FIG. 5 is electrically connected to the body 21BY1 formed of the p-type well 21PW and extending right underneath the channel region 21CH1 by the via-contact VC1 and the p-type ohmic region 21P+1 as shown in FIG. 7, and because of this, the n-channel MOS transistor NMOS1 becomes a Dt-MOS transistor that performs a low voltage operation and shows a dynamic threshold operation explained in FIG. 2 characterized by low Off current and large On current.

Further, with the semiconductor logic circuit device 20 of such a construction, the gate electrode 23G2N of the n-channel MOS transistor NMOS2 shown in FIG. 5 is electrically connected to the body 21BY2 formed of the p-type well 21PW and extending right underneath the channel region 21CH2 by the via-contact VC3 and the p-type ohmic region 21P+2 as shown in FIG. 8, and because of this, the n-channel MOS transistor NMOS2 also becomes a Dt-MOS transistor that performs a low voltage operation and shows a dynamic threshold operation explained in FIG. 2 characterized by low Off current and large On current.

Further, with the semiconductor logic circuit device 20 of such a construction, the gate electrode 23G1P of the p-channel MOS transistor PMOS1 shown in FIG. 6 is electrically connected to the body 21BY3 formed of the n-type well 21NW and extending right underneath the channel region 21CH3 by the via-contact VC4 and the n-type ohmic region 21N+2 as shown in FIG. 8, and because of this, the p-channel MOS transistor PMOS1 becomes a Dt-MOS transistor that performs a low voltage operation and shows a dynamic threshold operation explained in FIG. 2 characterized by low Off current and large On current.

Further, with the semiconductor logic circuit device 20 of such a construction, the gate electrode 23G2P of the p-channel MOS transistor PMOS2 shown in FIG. 6 is electrically connected to the body 21BY4 formed of the n-type well 21NW and extending right underneath the channel region 21CH4 by the via-contact VC2 and the n-type ohmic region 21N+1 as shown in FIG. 7, and because of this, the p-channel MOS transistor PMOS2 becomes a Dt-MOS transistor that performs a low voltage operation and shows a dynamic threshold operation explained in FIG. 2 characterized by low Off current and large On current.

In the n-channel MOS transistor NMOS1, in which the insulation regions 21I2 and 21I1 of a silicon oxide film are formed respectively right underneath the n-type diffusion region 21SN1 constituting the source region thereof and the n-type diffusion region 21DN1 constituting the drain region thereof, the junction capacitance associated with these diffusion regions are reduced, and improvement is attained in the operational speed while decreasing the junction leakage current at the same time.

Similarly, in the n-channel MOS transistor NMOS2, in which the insulation regions 21I3 and 21I2 of a silicon oxide film are formed respectively right underneath the n-type diffusion region 21SN2 constituting the source region thereof and the n-type diffusion region 21DN2 constituting the drain region thereof, the junction capacitance associated with these diffusion regions are reduced, and improvement is attained in the operational speed while decreasing the junction leakage current at the same time.

Thereby, it should be noted that the bottom edge of the p-type well 21PW constituting the body 21BY1 and the body 21BY2 is formed at a depth not exceeding the bottom edge of the insulation regions 21I1-21I3. Because of this, the body 21BY1 and the body 21BY2 are isolated electrically, and there occurs no interference between the input signal IN1 and the input signal IN2. Further, because the bottom edges of the n-type diffusion regions 21DN1, 21SN1, 21DN2 and 21SN2 are formed at a level shallower than the bottom edge of the p-type well 21PW, there occurs no short circuit between these diffusion regions and the underlying deep n-type well 21DNW.

In the n-channel MOS transistor PMOS1, in which the insulation regions 21I4 and 21I5 of a silicon oxide film are formed respectively right underneath the p-type diffusion region 21SP1 constituting the source region thereof and the p-type diffusion region 21DP1 constituting the drain region thereof, the junction capacitance associated with these diffusion regions are reduced, and improvement is attained in the operational speed while decreasing the junction leakage current at the same time.

Similarly, in the p-channel MOS transistor PMOS2, in which the insulation regions 21I6 and 21I5 of a silicon oxide film are formed respectively right underneath the p-type diffusion region 21SP2 constituting the source region thereof and the p-type diffusion region 21DP2 constituting the drain region thereof, the junction capacitance associated with these diffusion regions are reduced, and improvement is attained in the operational speed while decreasing the junction leakage current at the same time.

Thereby, it should be noted that the bottom edge of the n-type well 21NW constituting the body 21BY3 and the body 21BY4 is formed at a depth not exceeding the bottom edge of the insulation regions 21I4-21I6, and because of this, the body 21BY3 and the body 21BY4 are isolated electrically. Thus, there occurs no interference between the input signal IN1 and the input signal IN2. Further, because the bottom edges of the p-type diffusion regions 21DP1, 21SP1, 21DP2 and 21SP2 are formed at a level shallower than the bottom edge of the p-type well 21NW, there occurs no short circuit between these diffusion regions and the underlying p-type well silicon bulk substrate 21.

As explained previously with reference to FIG. 4, the n-channel MOS transistor NMOS1 shares the source diffusion region 21SN1 with the drain region 21DN2 of the n-channel MOS transistor NMOS2 in the device region 21A, and because of this, it becomes possible to dispose the MOS transistors NMOS1 and NMOS2 with a close mutual distance. Thus, it becomes possible to reduce the area of the device region 21A.

Similarly, in the device region 21B, too, the p-channel MOS transistor PMOS1 is constructed to share the drain diffusion region 21DP1 thereof with the drain region 21DP2 of the p-channel MOS transistor PMOS2, and because of this, it becomes possible to dispose the MOS transistors PMOS1 and PMOS2 with a close mutual separation. Thus, it becomes possible to reduce the area of the device region 21B.

Further, with the semiconductor logic circuit device 20 of such a construction, it becomes possible to integrate a Dt-MOS transistor with an ordinary MOS transistor not having a Dt-MOS transistor structure on the same semiconductor bulk substrate, without changing the construction of the ordinary MOS transistor such as forming a via-contact for fixing the body voltage.

Further, according to the present embodiment, it will be noted that there is formed no insulation region such as the insulation region 21I1-21I8 right underneath the polysilicon pattern 21G1 as represented in the cross-sectional diagram of FIG. 7 or FIG. 8. Because of this, the depth of the body is not restricted by the insulation region of silicon oxide film in any of the foregoing n-channel MOS transistors NMOS1 and NMOS2 and the p-channel MOS transistors PMOS1 and PMOS2, and it becomes possible to reduce the electric resistance of the bodies 21BY1-21BY2 to which the input signals are applied. Thus, it becomes possible to improve the operational speed of these transistors.

Next, fabrication process of the semiconductor logic circuit 20 will be explained.

Figure 10A:
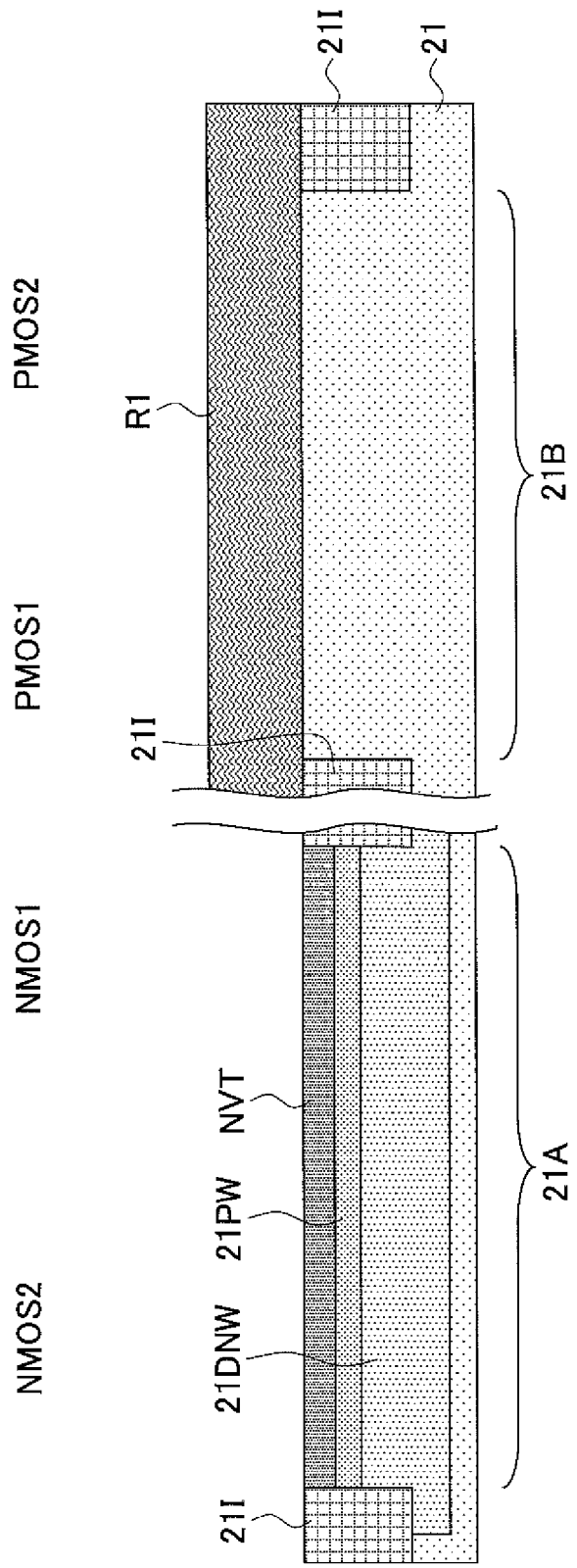
FIGS. 10A-10V are cross-sectional diagrams representing a fabrication process of the semiconductor logic circuit device of FIG. 4.

In FIG. 10A, the left side part of the broken line represents the cross-sectional diagram along the line A-A' of FIG. 4, while the right side part represents the cross-sectional diagram taken along the line B-B' of FIG. 4. The same applies to the subsequent drawings.

Referring to FIG. 10A, there is provided a p-type monocrystalline silicon bulk substrate 21 of a (100) surface orientation such that the device regions 21A and 21B are defined by the device isolation region 21I of STI type having a bottom edge at the depth of 200 nm-400 nm, for example, and a resist pattern R1 is formed thereon so as to cover the device region 21B. Further, while using the resist pattern R1 as a mask, phosphorus (P) is introduced into the silicon bulk substrate 21 by an ion implantation process conducted under the acceleration voltage of 400 keV-2 MeV with a dose of $2 \times 10^{12}$ cm$^{-2}$-$1 \times 10^{14}$ cm$^{-2}$. With this, the deep n-type well 21DNW is formed with a depth deeper than the bottom edge of the device isolation region 21I.

Further, while using the same resist pattern R1 as a mask, an ion implantation of boron (B) is conducted into the silicon bulk substrate 21 under the acceleration voltage of 5 keV-20 keV and the dose of $1\times10^{12}$ cm$^{-2}$-$5\times10^{13}$ cm$^{-2}$. With this, there are formed a shallow p-type well 21PW and further a p-type injection region NVT for channel doping of the n-channel MOS transistors NMOS1 and NMOS2 in the surface part of the silicon bulk substrate 21 with a bottom edge at the depth of 30 nm-100 nm, which is shallower than the bottom edge of the device isolation region 21I (a typical source/drain region has a thickness of about 20 nm-60 nm, and a buried layer has a thickness of 30 nm-150 nm. Thus, it is adjusted such that the well depth is included in the depth range of the buried layer). In the example of FIG. 10A, it is illustrated that the p-type injection region NVT is formed at the surface part of the p-type well 21PW. However, as explained previously, it is possible to use the p-type well 21PW also as the p-type injection region NVT.

Figure 10B:
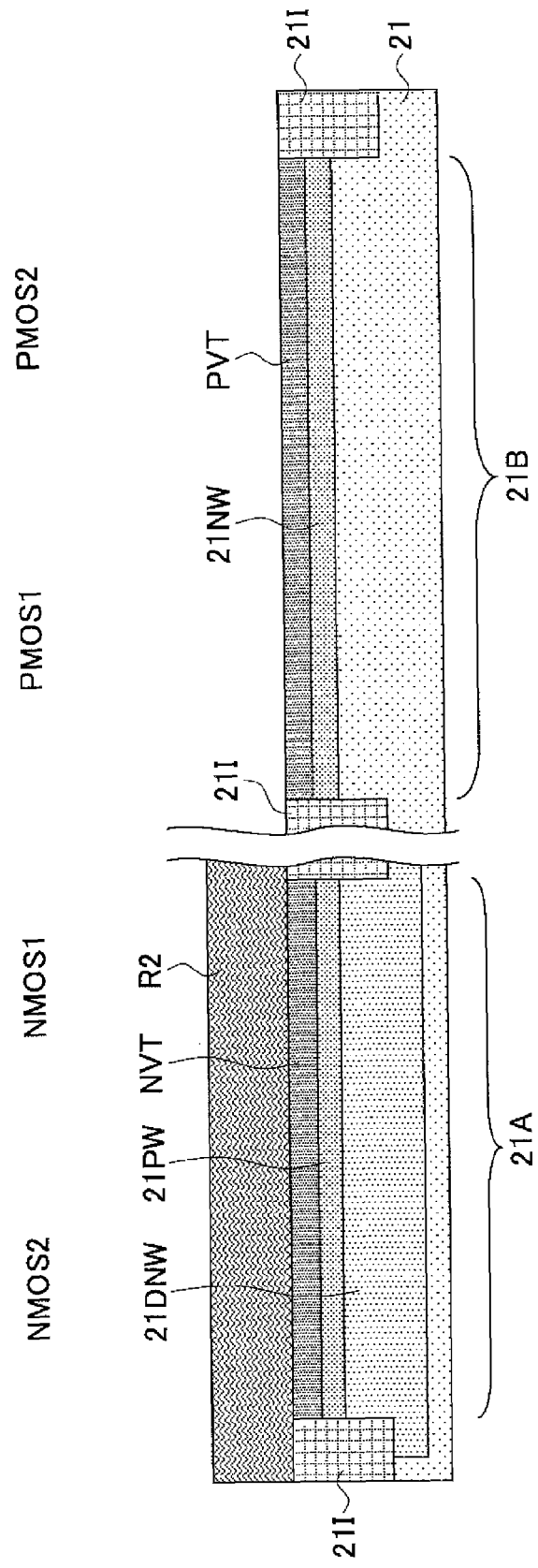

FIG. 10B is a cross-sectional diagram taken along the cross-section of FIG. 10A.

Referring to FIG. 10B, the device region 21A is covered by another resist pattern R2 after the step of FIG. 10A, and ion implantation of arsenic (As) is conducted into the silicon bulk substrate 21 while using the resist pattern R2 as a mask under the acceleration voltage of 20 keV-120 keV and the dose of $1\times10^{12}$ cm$^{-2}$-$5\times10^{13}$ cm$^{-2}$, such that there is formed a shallow n-type well and an n-type injection region PVT for channel doping of the p-channel MOS transistors PMOS 1 and PMOS 2 with a depth of the bottom edge of 30 nm-50 nm, which is shallower than the bottom edge of the device isolation region 21I (a typical source/drain region has a thickness of about 20 nm-60 nm and a buried layer has a thickness of 30-150 nm. Thus, it is adjusted that such that the well depth is within the depth range of the buried layer). In the example of FIG. 10B, too, it is illustrated that the n-type injection region PVT is formed at the surface part of the n-type well 21NW. However, as explained previously, it is possible to use the n-type well 21NW also as the n-type injection region PVT.

Figure 10C:
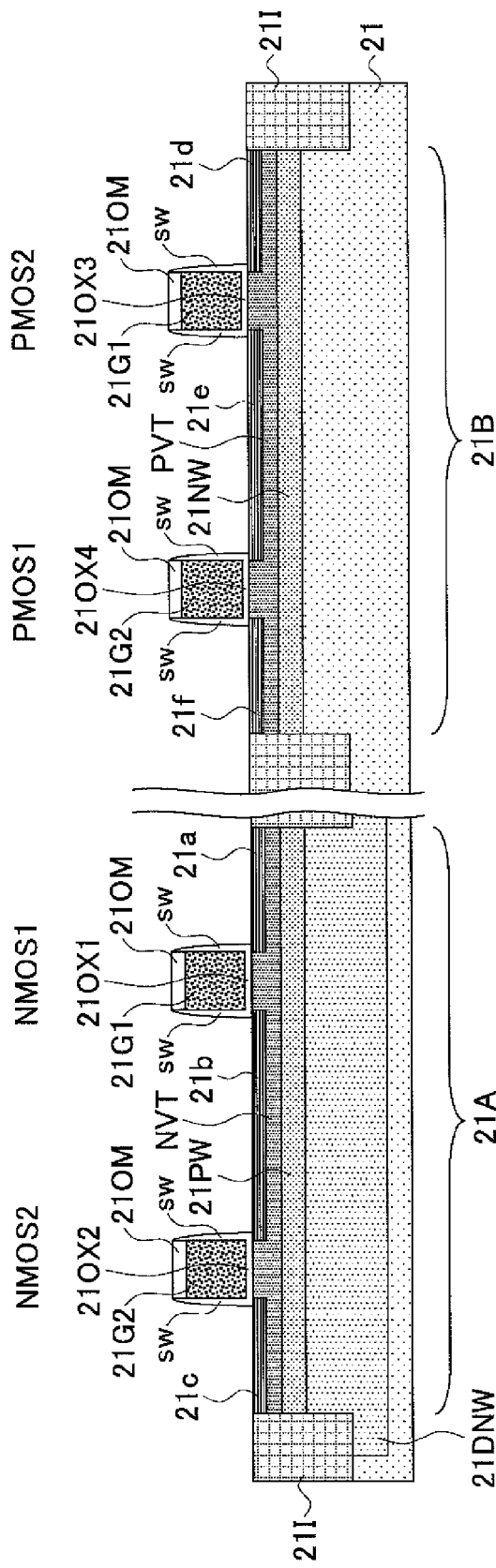
Figure 10D:
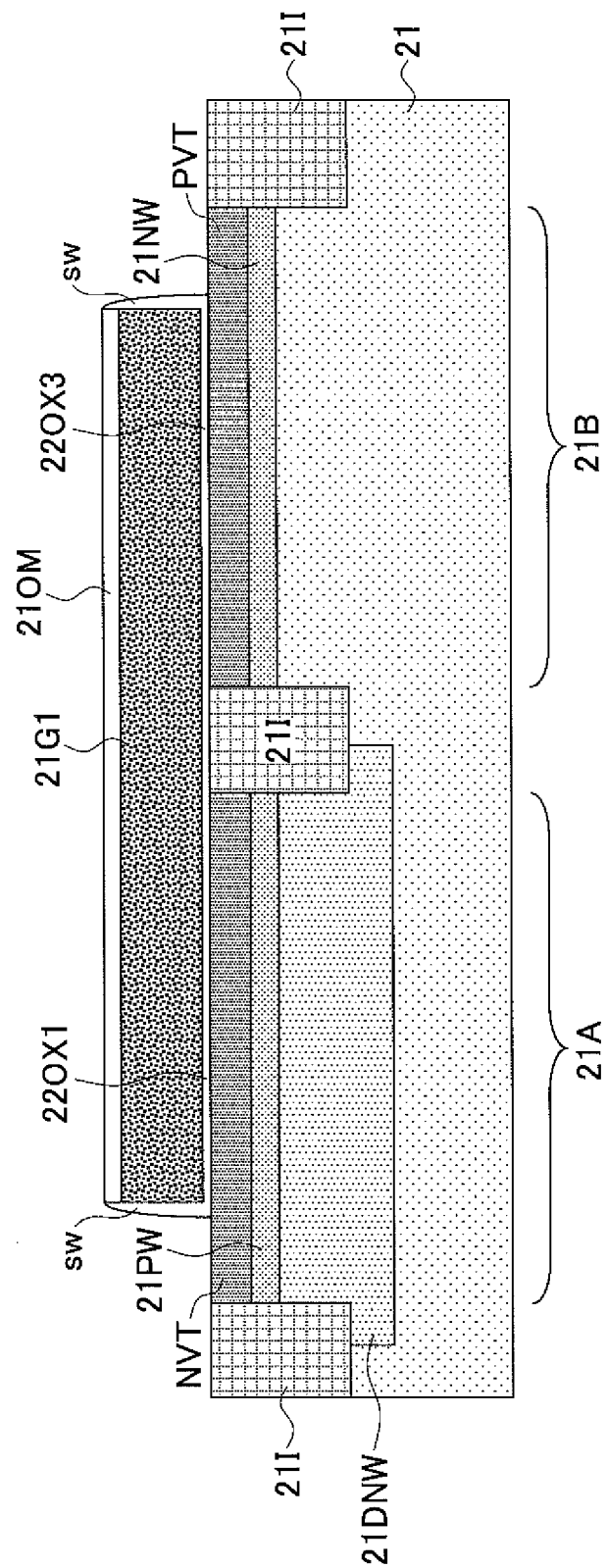

FIG. 10C is a cross-sectional diagram taken along the same cross-sections A-A' and B-B' of FIG. 10A while FIG. 10D is a cross-sectional diagram taken along the line C-C' of FIG. 4 for step of FIG. 10C.

Referring to FIG. 10C, there are formed, after the step of FIG. 10B, the polysilicon patterns 21G1 and 21G2 in the device region 21A shown at the left side of the broken line via respective gate insulation films 22Ox1 and 22Ox2. With this, it can be seen that the polysilicon patterns 21G1 and 21G2 are formed also in the device region 21B at the right side of the broken line of FIG. 10C via the respective gate insulation films 22Ox3 and 22Ox4. Here, it should be noted that the polysilicon patterns 21G1 and 21G2 are formed by patterning a polysilicon film while using a hard mask pattern 210M of a silicon oxide film or a silicon nitride film as a mask. The hard mask pattern 210M is left on the polysilicon patterns 21G1 and 21G2 until the steps of FIGS. 10M and 10N as will be explained later.

The polysilicon patterns 21G1 and 21G2 have sidewall insulation films sw of a silicon oxide film or a silicon nitride film of the thickness of 5-20 nm on the respective sidewall surfaces, wherein it should be noted that, in the step of FIG. 10C, ion implantation of As is conducted in the device region 21A while using the polysilicon patterns 21G1 and 21G2 as a mask while using the acceleration voltage of 1 keV-5 keV and the dose such as $1\times10^{13}$ cm$^{-2}$-$2\times10^{15}$ cm$^{-2}$ to form the n-type diffusion regions 21a-21c constituting the source/drain extension regions on the surface of the silicon bulk substrate 21 that constitutes the device region 21A, such that the n-type diffusion region 21b is located between the polysilicon patterns 21G1 and 21G2 and that the n-type diffusion region 21a is located at an outer side of the polysilicon pattern 21G1 with regard to the n-type diffusion region 21b and the n-type diffusion region 21c is located at an outer side of the polysilicon pattern 21G2 with regard to the n-type diffusion region 21b. When forming the n-type diffusion regions 21a-21c, the device region 12B is covered by a resist pattern not illustrated.

Further, in the step of FIG. 10C, B is introduced into the device region 21B by an ion implantation process under the acceleration voltage of 0.1 keV-1 keV and the dose such as $1\times10^{12}$ cm$^{-2}$-$2\times10^{15}$ cm$^{-2}$ while using the polysilicon patterns 21G1 and 21G2 as a mask to form the p-type diffusion regions 21d-21f constituting the source/drain extension regions on the surface of the silicon bulk substrate constituting the device region 21B, such that the p-type diffusion region 21e is located between the polysilicon patterns 21G1 and 21G2 and such that the p-type diffusion region 21d is located at an outer side of the polysilicon pattern 21G1 as compared with the p-type diffusion region 21e and the p-type diffusion region 21f is located at an outer side of the polysilicon pattern 21G2 as compared with the p-type diffusion region 21e. When forming the p-type diffusion regions 21d-21f, the device region 12A is covered by a resist pattern not illustrated.

Referring to FIG. 10D, it can be seen that the deep n-type well 21DNW is formed in the silicon bulk substrate 21 in correspondence to the device region 21A and that the polysilicon pattern 21G1 extends from the device region 21A to the device region 21B across the device isolation region 21I dividing the device region 21A and the device region 21B. Further, in the device region 21A, it can be seen that the gate insulation film 22Ox1 is interposed between the surface of the silicon bulk substrate 21 and the polysilicon pattern 21G1 and that the gate insulation film 22Ox2 is interposed between the surface of the silicon bulk substrate 21 and the polysilicon pattern 21G2 in the device region 21B. Further, the both ends of the polysilicon pattern 21G1 are covered by the sidewall insulation films identical with the sidewall insulation film sw. Further, while not illustrated, a structure similar to that of FIG. 10D is formed also in the cross-section along the line D-D' of FIG. 4.

Figure 10E:
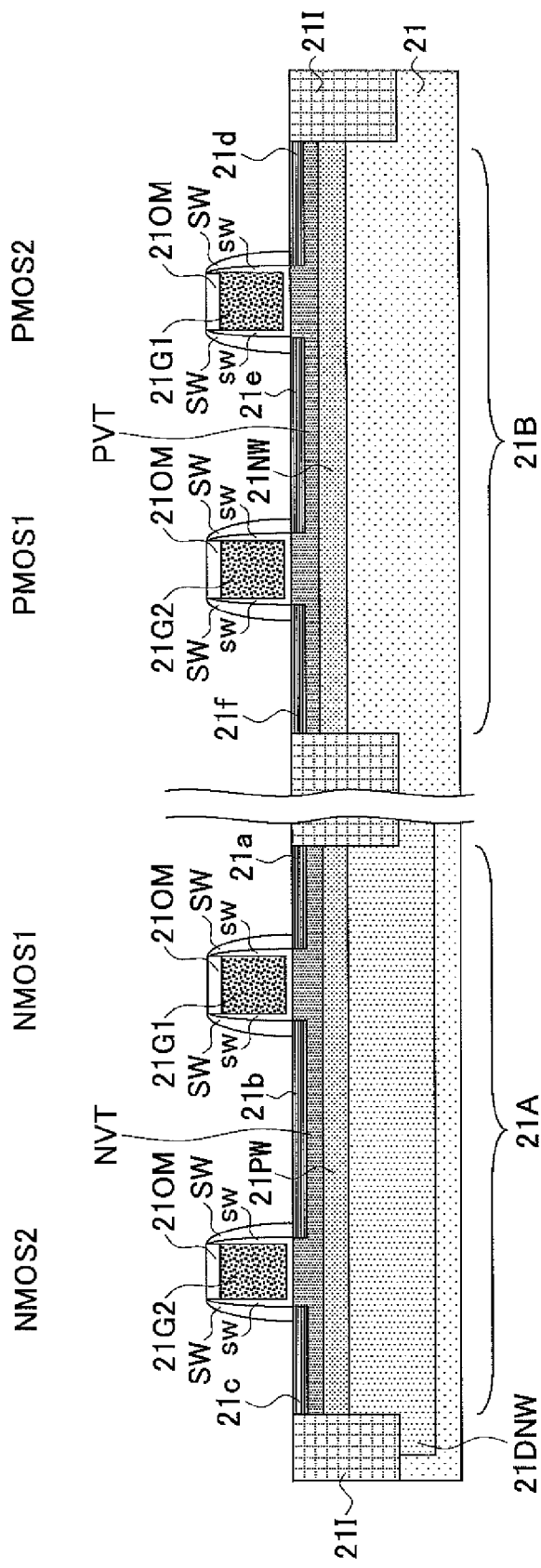
Figure 10F:
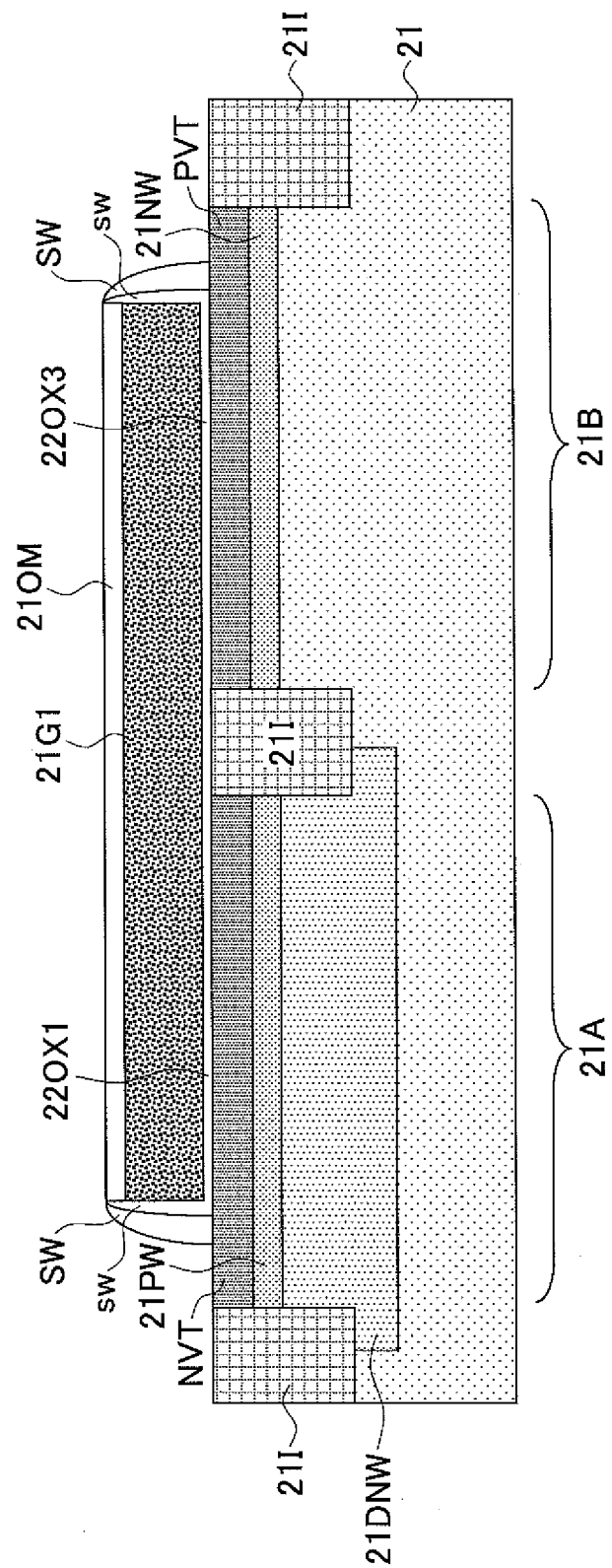

FIG. 10E is a cross-sectional diagram taken along the lines A-A' and B-B' of FIG. 10A, while FIG. 10F is a cross-sectional diagram taken along the line C-C' of FIG. 4 and showing the process of FIG. 10E.

Referring to FIG. 10E, there are formed an outer sidewall insulation films SW of a silicon oxide film or a silicon nitride film on the polysilicon patterns 21G1 and 21G2 after the steps of FIGS. 10C and 10D so as to cover the sidewall insulation films sw by a deposition of a silicon oxide film or silicon nitride film of the thickness of 20 nm-50 nm followed by an etchback process. As a result, the outer sidewall insulation films SW are formed to cover the inner sidewall insulation films sw also at the end parts of the polysilicon pattern 21G1 as represented in FIG. 10F. Further, while not illustrated, a structure similar to that of FIG. 10D is formed also in the cross-section taken along the line D-D' of FIG. 4. With the present embodiment, the insulation patterns SB1 and SB2 constituting the silicide block as explained previously with reference to FIG. 4 are formed simultaneously to the sidewall insulation films SW so as to extend laterally from the respective polysilicon patterns 21G1 and 21G2, by adding a mask process to the etchback process of FIGS. 10E and 10F for forming the sidewall insulation films SW.

Figure 10G:
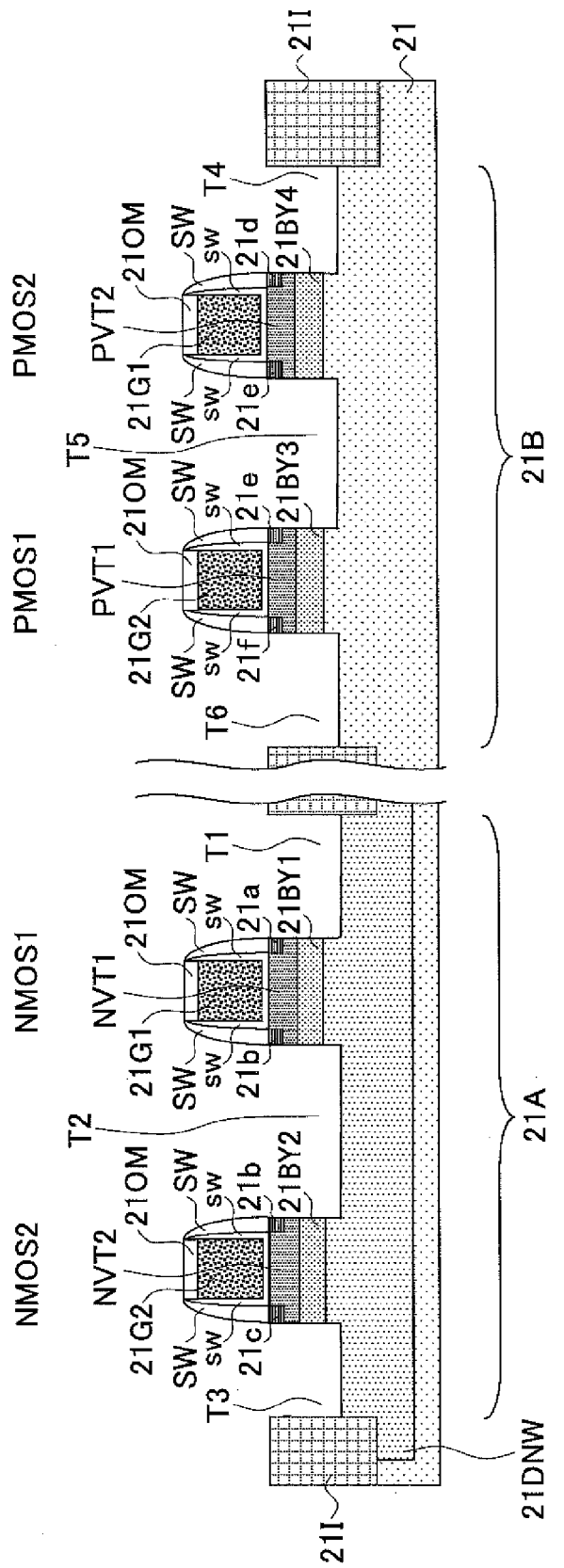
Figure 10H:
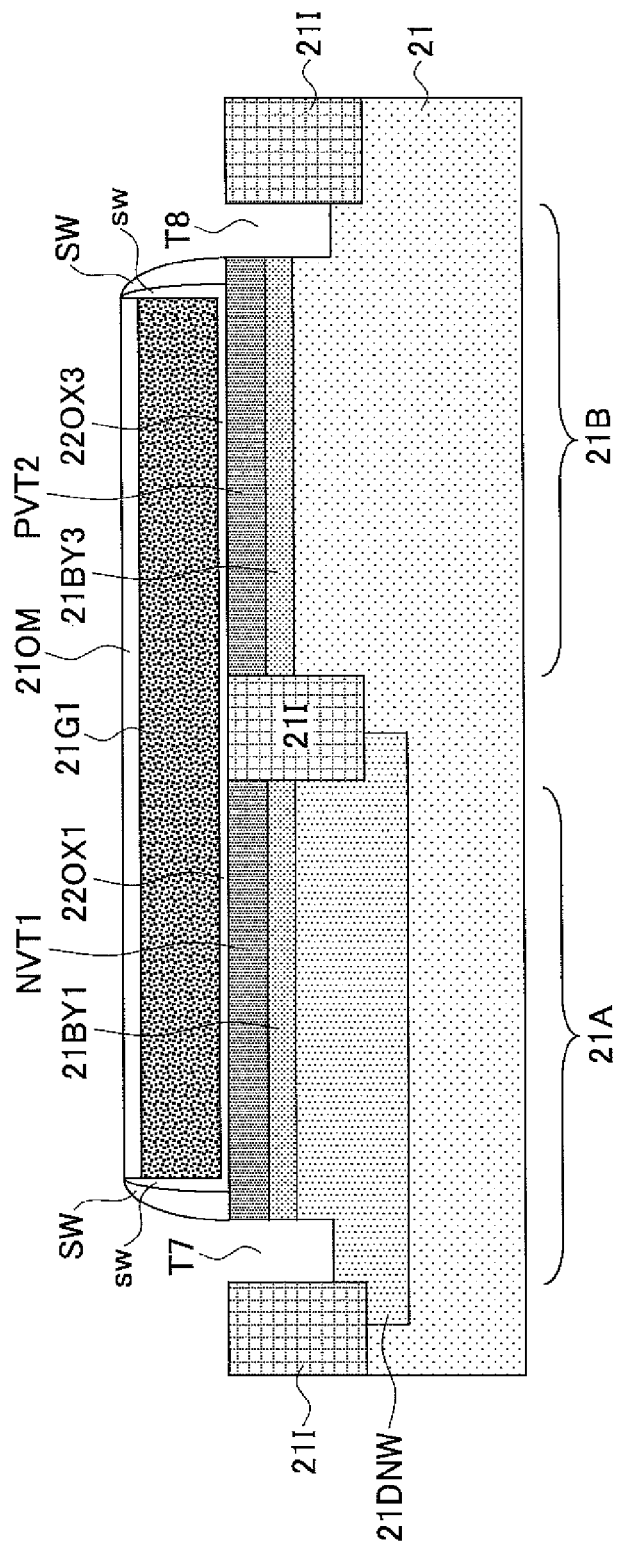

FIG. 10G is a cross-sectional diagram taken along the same cross-sections A-A' and B-B' of FIG. 10A, while FIG. 10H is a cross-sectional diagram taken along a line C-C' of FIG. 4 during the process of FIG. 10G.

Referring to FIG. 10G, the surface of the silicon bulk substrate 21 is subjected to a dry etching process conducted by an RIE method after the step of FIGS. 10E and 10F while using the sidewall insulation films SW and the polysilicon patterns 21G1 and 21G2 covered with a hard mask pattern 21OM as a mask, and there are formed trenches T1, T2 and T3 exceeding the bottom edge of the p-type well 21PW and reaching the deep n-type well 21DNW in the device region 21A, such that the trench T2 is located between the polysilicon patterns 21G1 and 21G2 and such that the trench T1 is located at an outer side of the polysilicon pattern 21G1 with regard to the trench T2 and the trench T3 is located at an outer side of the polysilicon pattern 21G2 with regard to the trench T2.

As a result of such formation of the trenches T1-T3 in the device region 21A, the shallow p-type well 21PW is split into the first body region 21BY1 and the second body region 21BY2 as represented in FIG. 10G. Likewise, the p-type injection region NVT thereon is split into the channel dope region NVT1 on the body 21BY1 and the channel dope region NVT2 on the body 21BY2.

At the same time, in the device region 21B, there are formed trenches T4, T5 and T6 exceeding the bottom edge of the n-type well 21NW by the dry etching process, such that the trench T5 is located between the polysilicon patterns 21G1 and 21G2 and that the trench T4 is located at an outer side of the polysilicon pattern 21G1 with regard to the trench T5 and the trench T6 is formed at an outer side of the polysilicon pattern 21G2 with regard to the trench T5. As an example, the trenches T1-T6 may be formed with a depth of 70 nm from the surface of the silicon bulk substrate 21.

As a result of such formation of the trenches T4-T6 in the device region 21B, the shallow n-type well 21NW is split into the third body region 21BY3 and the fourth body region 21BY4 as represented in FIG. 10G. Likewise, the n-type injection region PVT thereon is split into the channel dope region PVT1 on the body 21BY3 and the channel dope region PVT2 on the body 21BY4.

Further, at the time of the step of FIG. 10G, the silicon bulk substrate 21 is subjected also to a dry etching process at the both ends of the polysilicon pattern 21G1 with the hard mask pattern 21OM covering the polysilicon pattern 21G1 and the sidewall insulation films SW serving as a self-alignment mask, and as a result, there is formed a trench T7 in the device region 21A in correspondence to the end part of the polysilicon pattern 21G1 and there is further formed a trench T8 in the device region 21B in correspondence to the end part of the polysilicon pattern 21G2, with a depth identical with the depth of the trenches T1-T6.

While explanation is omitted, a similar structure to FIG. 10H is formed also in the cross-section D-D' of FIG. 4.

Figure 10I:
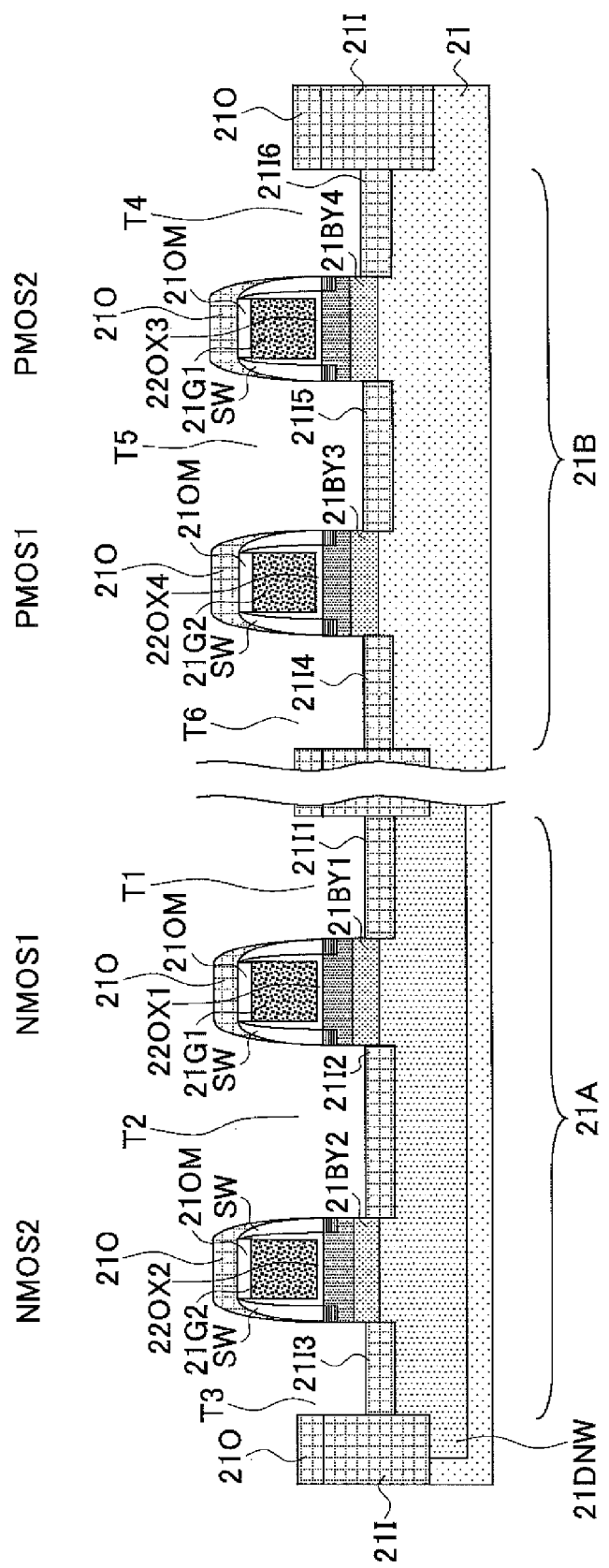
Figure 10J:
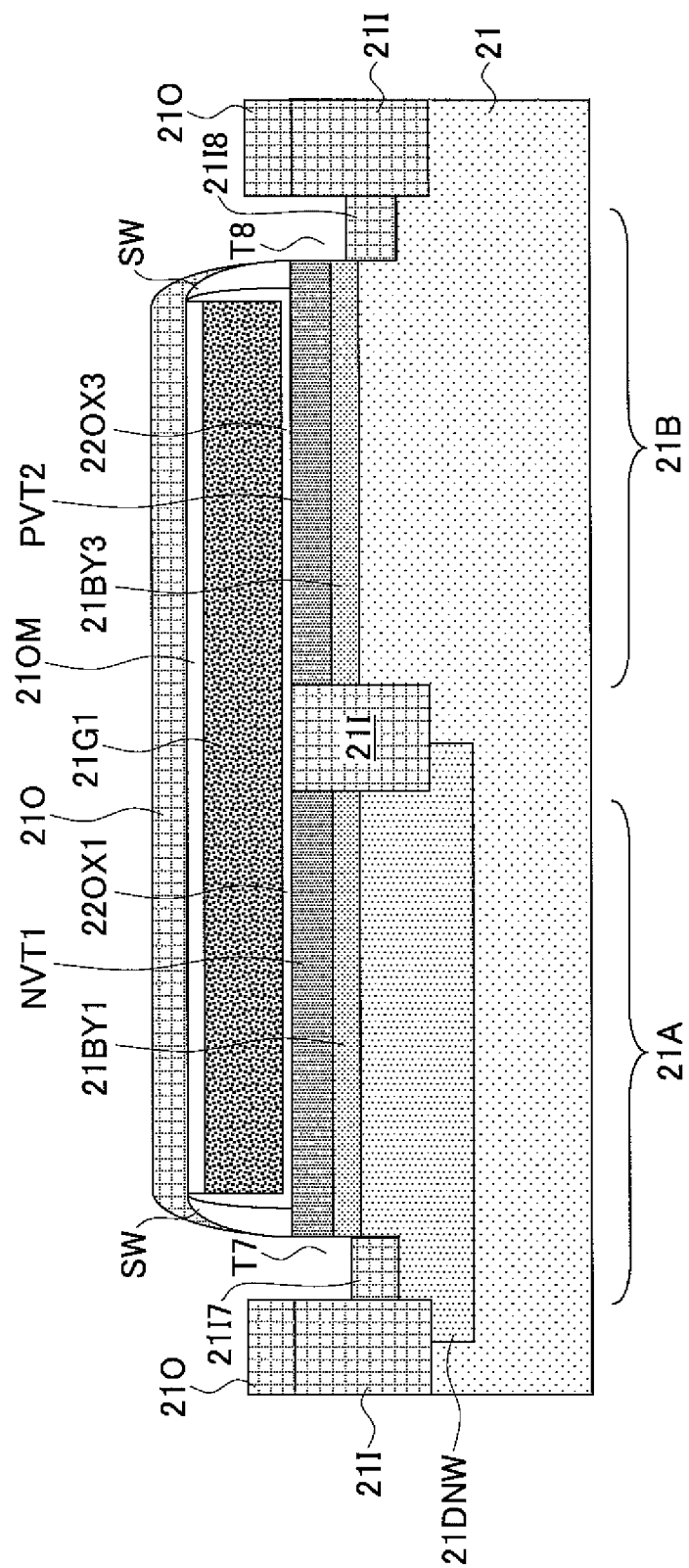

FIG. 10I is a cross-sectional diagram taken along the lines A-A' and B-B' of FIG. 10A, while FIG. 10J is a cross-sectional diagram taken along a line C-C' of FIG. 4 for showing the process of FIG. 10I.

Figure 10K:
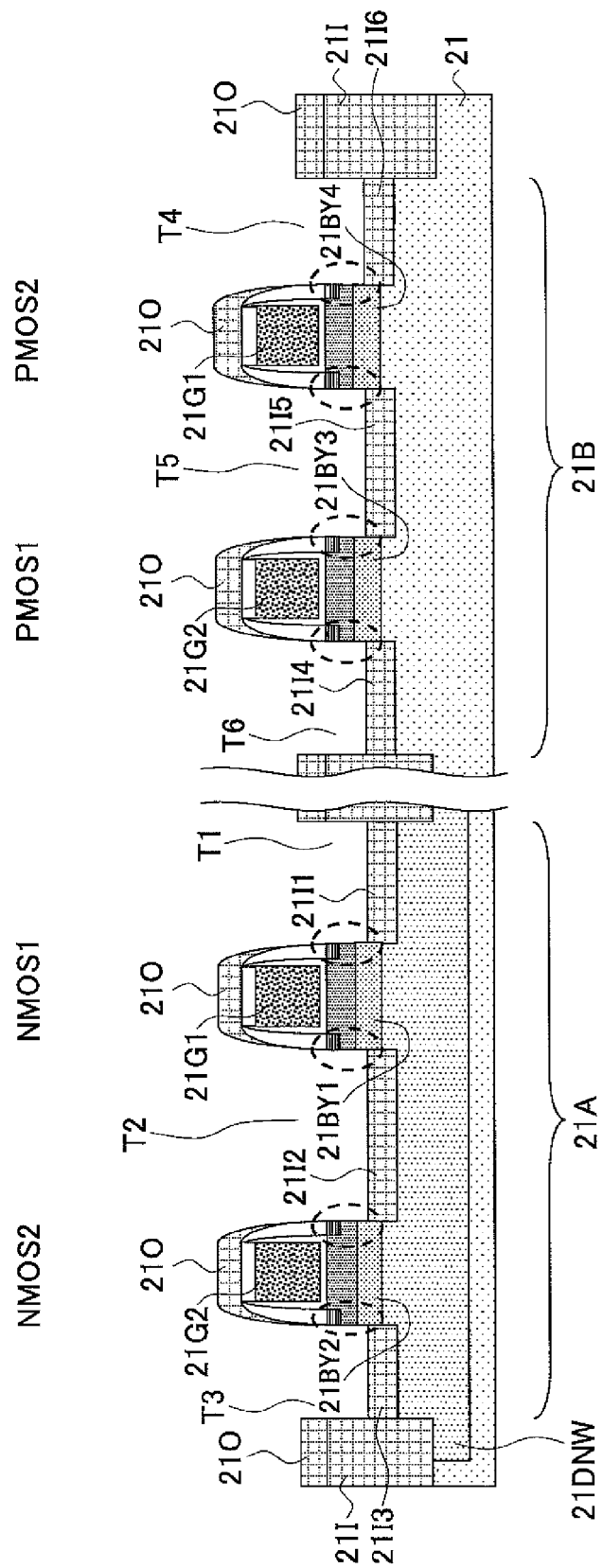
Figure 10L:
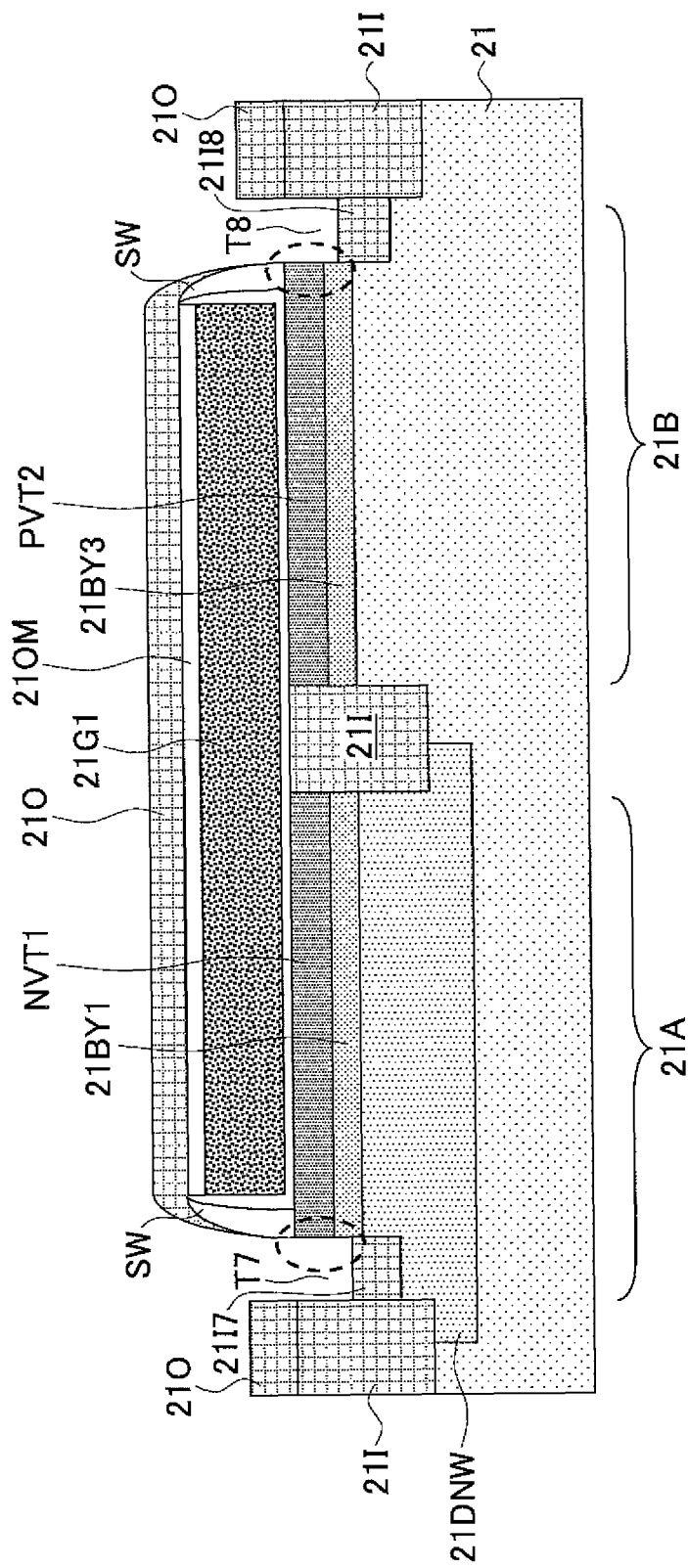

Referring to FIG. 10I, a silicon oxide film is deposited on the structure of FIG. 10G after the step of FIGS. 10G and 10H by a film forming method such as a reactive sputtering process that has anisotropy and causes preferential deposition in the direction perpendicular to the substrate surface, such that the insulation regions 21I1, 21I2, 21I3, 21I4, 21I5 and 21I6 noted before are formed respectively on the bottom of the trenches T1, T2, T3, T4, T5 and T6, with a thickness of 20 nm-50 nm, for example, in such a manner that the top edges thereof exceed the bottom edge of the shallow p-type well 21PW, and hence the bottom edge of the body 21BY1, and further the bottom edge of the shallow n-type well 21NW, and hence the bottom edge of the body 21BY3. Thereby, the thickness of the insulation regions 21I1, 21I2, 21I3, 21I4, 21I5 and 21I6 is set to a thickness that exceeds the bottom edges of the shallow p-type well 21PW and the shallow n-type well 21NW even after the etching process to be explained below with reference to FIGS. 10K and 10L is conducted.

With the formation of the insulation regions 21I1, 21I2, 21I3, 21I4, 21I5 and 21I6, the insulation regions 21I9 and 21I10 explained previously with reference to FIG. 8 are formed also in the cross-section of FIG. 10J in the manner to fill the trenches T7 and T8 with the thickness exceeding the bottom edges of the shallow p-type well 21PW, and hence the body 21BY1, and also the n-type well 21NW, and hence the body 21BY3.

While the details are omitted, a structure similar to that of FIG. 10J is formed also in the cross-section D-D', and thus, the insulation region 21I9 is formed in the device region 21A in correspondence to the end of the polysilicon pattern 21G2 and the insulation region 21I10 is formed in the device region 21B in correspondence to the end of the polysilicon pattern 21G2.

Further, with the formation of the insulation regions 21I1-21I10, there is formed a silicon oxide film 21O on the polysilicon patterns 21G1 and 21G2 so as to cover the sidewall insulation films SW and further the hard mask patterns 21OM. A similar silicon oxide film 21O is formed also on the device isolation structure 21I.

In the step of FIGS. 10I and 10J, it is also possible to form the insulation regions 21I1-21I10 by ion implantation of oxygen followed by a thermal annealing process as will be explained later with reference to embodiments.

FIG. 10K is a cross-sectional diagram taken along the same cross-sections A-A' and B-B' of FIG. 10A, while FIG. 10L is a cross-sectional diagram taken along a line C-C' of FIG. 4 during the process of FIG. 10K.

In the process of FIGS. 10K and 10L, the structure represented in FIGS. 10I and 10J is immersed into a HF etchant for a short time, and the silicon oxide film deposited at the time of formation of the insulation regions 21I1-21I10 is removed from the exposed sidewall surfaces, circled by broken lines in FIGS. 10K and 10L, of the partially filled trenches T1-T8 by a wet etching process. As a result, a fresh silicon surface is exposed.

In the wet etching process of FIG. 10K and FIG. 10L, the silicon oxide film constituting the insulation regions 21I1, 21I2, 21I3, 21I4, 21I5 and 21I6 also experiences etching. However, the film thickness loss for these insulation regions 21I1, 21I2, 21I3, 21I4, 21I5 and 21I6 can be made negligible by conducting the immersion into the HF etchant for only a short time. Anyway, the insulation regions 21I1, 21I2, 21I3, 21I4, 21I5 and 21I6 are formed so as to exceed the bottom edge of the shallow p-type well 21PW and hence the bodies 21BY1 and 21BY2 of p-type in the device region 21A or the bottom edge of the shallow n-type well 21NW and hence the bodies 21BY3 and 21BY4 in the device region 21B even after the wet etching process of FIGS. 10K and 10L as explained previously.

Figure 10M:
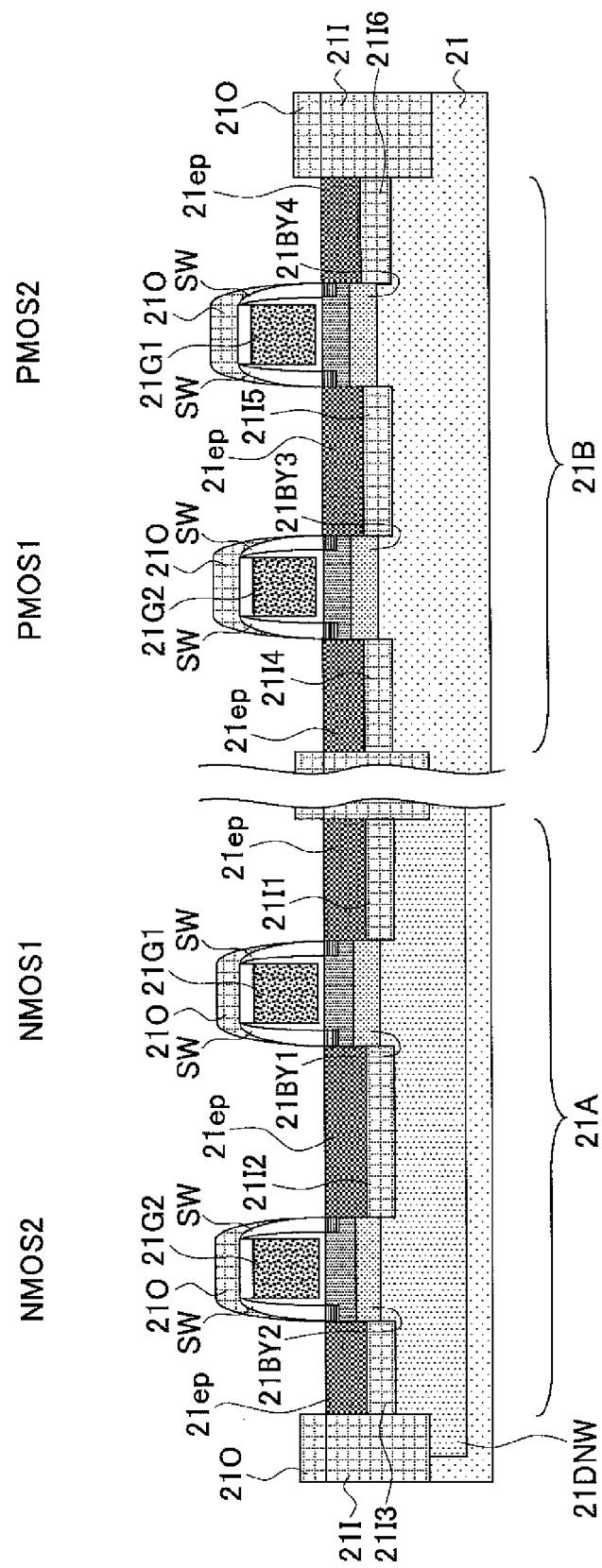
Figure 100:
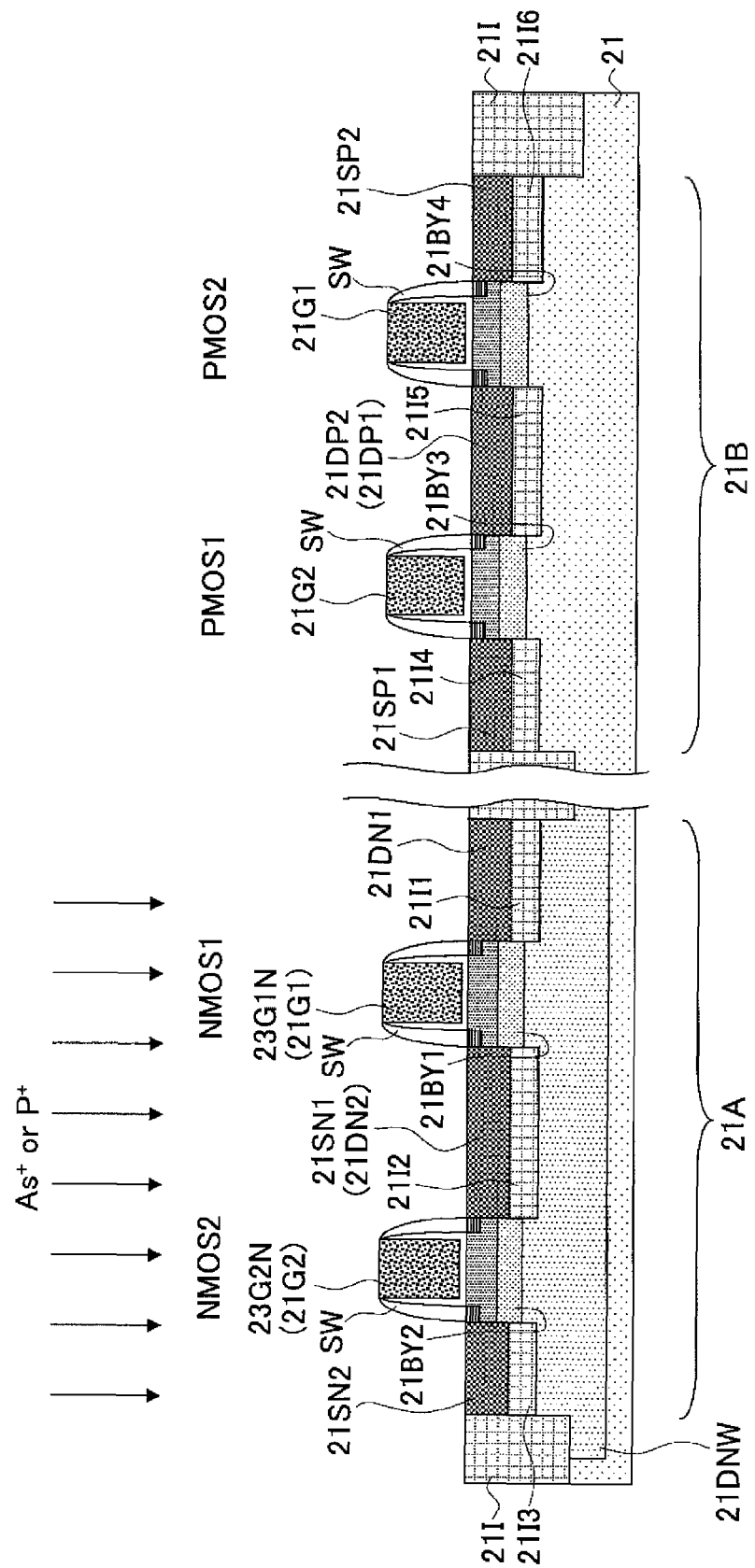

FIG. 10M is a cross-sectional diagram taken along the same cross-sections A-A' and B-B' of FIG. 10A, while FIG. 10N is a cross-sectional diagram taken along a line C-C' of FIG. 4 during the process of FIG. 10M.

Referring to FIGS. 10M and 10N, there is conducted a lateral epitaxial growth of a monocrystalline silicon epitaxial layer 21ep after the step of FIGS. 10K and 10L in the trenches T1-T8 by starting from the silicon surface of the monocrystalline silicon bulk substrate 21 exposed at the sidewall surfaces of the trenches T1-T8 at the substrate temperature of 700° C.-800° C., and with this, the trenches T1-T8 are filled.

It should be noted that in the step of FIGS. 10M and 10N, these monocrystalline silicon epitaxial layer 21ep is not yet doped to any of the p-type or n-type. In the step of FIGS. 10M and 10N, illustration of formation of the epitaxial layer 21ep is omitted as the formation thereof in the trenches T9 and T10 is the same as in the case of the cross-sectional diagram of FIG. 10N.

Figure 11A:
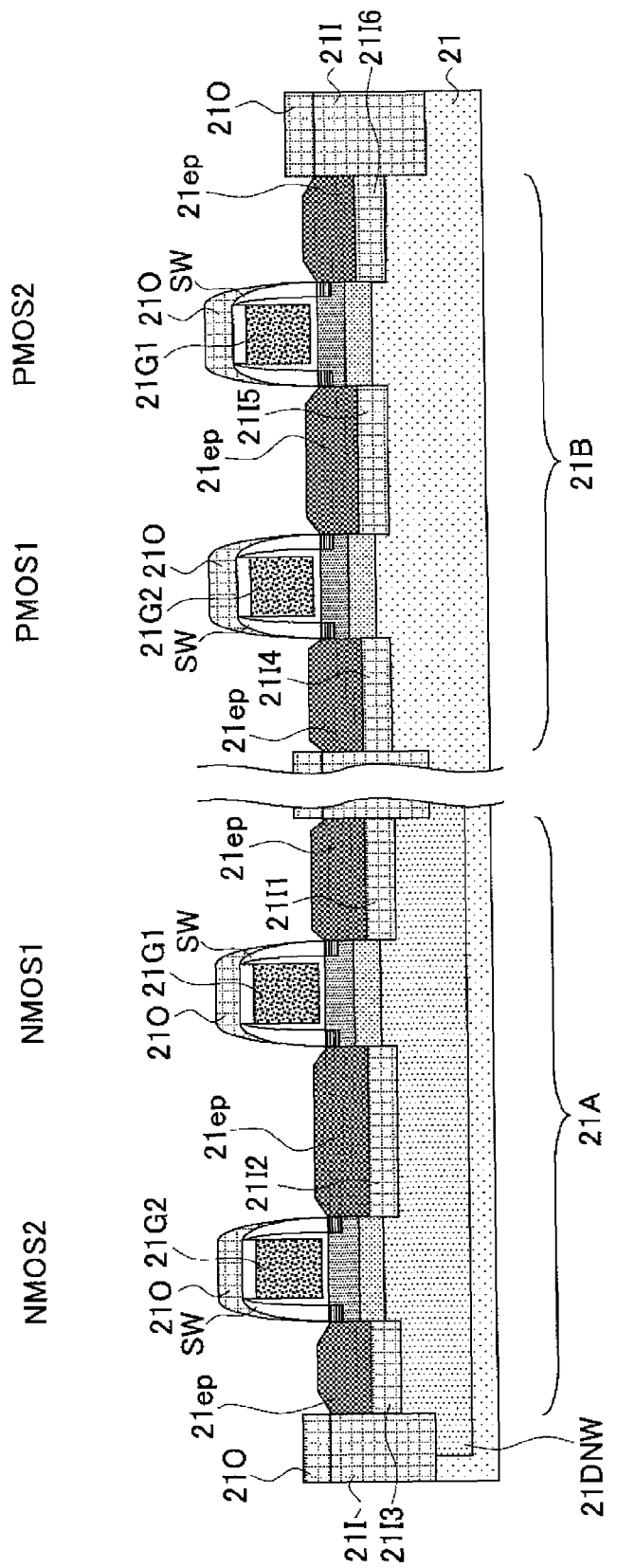
FIGS. 11A and 11B are diagrams representing a modification of the first embodiment.
Figure 11B:
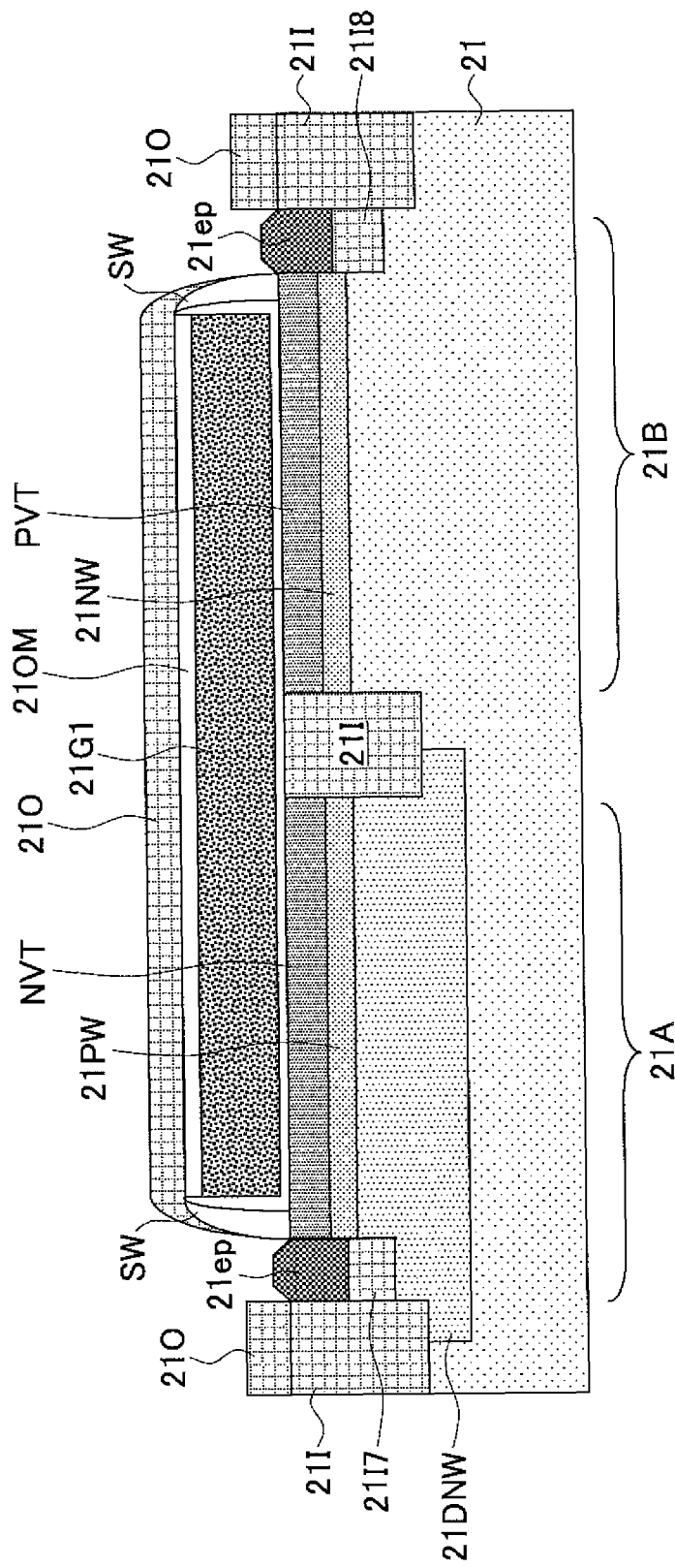

While it is illustrated in the step of FIGS. 10M and 10N that the top surface of the respective silicon epitaxial layers are coincident to the top surface of the silicon bulk substrate 21, it is also possible to form these monocrystalline silicon epitaxial layers to have the top surface exceeding the top surface of the silicon bulk substrate 21. In such a case, there may be formed facets in the respective silicon epitaxial layers by Si crystal surfaces as represented in FIGS. 11A and 11B. However, no problem is caused with this.

Further, it is possible to set the extending direction of the polysilicon patterns 21G1 and 21G2 formed on the monocrystalline silicon bulk substrate of the (100) surface orientation to the <100> direction in anticipation of such a growth of the monocrystalline silicon epitaxial layer 21ep, such that the sidewall surfaces of the trenches T1-T10 expose the Si (100) surface.

Further, while not illustrated, it is also possible to form a monocrystalline SiC epitaxial layer, characterized by a lattice constant smaller than that of Si that constitutes the silicon bulk substrate 21 particularly in the device region 21A in place of the monocrystalline silicon epitaxial layer 21ep and attain improvement of the operational speed of the n-channel MOS transistors NMOS1 and NMOS2 by applying a uniaxial tensile stress to the channel regions of these transistors.

Further, it is also possible to form a monocrystalline SiGe epitaxial layer of larger lattice constant than the silicon bulk substrate 21 in the device region 21B in place of the monocrystalline silicon epitaxial layer 21ep and attain improvement of the operational speed of the p-channel MOS transistors PMOS1 and PMOS2 by applying a uniaxial compressive stress to the channel region of these MOS transistors.

Further, it is possible to reduce the temperature of the epitaxial growth in each of the trenches T1-T10 by forming a monocrystalline SiGe mixed crystal layer in place of the monocrystalline silicon epitaxial layer 21ep with a Ge concentration that does not affect the channel stress of the n-channel MOS transistors NMOS1, NMOS2 and the p-channel MOS transistors PMOS1 and PMOS2.

FIG. 10O is a cross-sectional diagram taken along the lines A-A' and B-B' of FIG. 10A while FIG. 10P is a cross-sectional diagram taken along the line C-C' of FIG. 4 for showing the process of FIG. 10O.

Figure 12A:
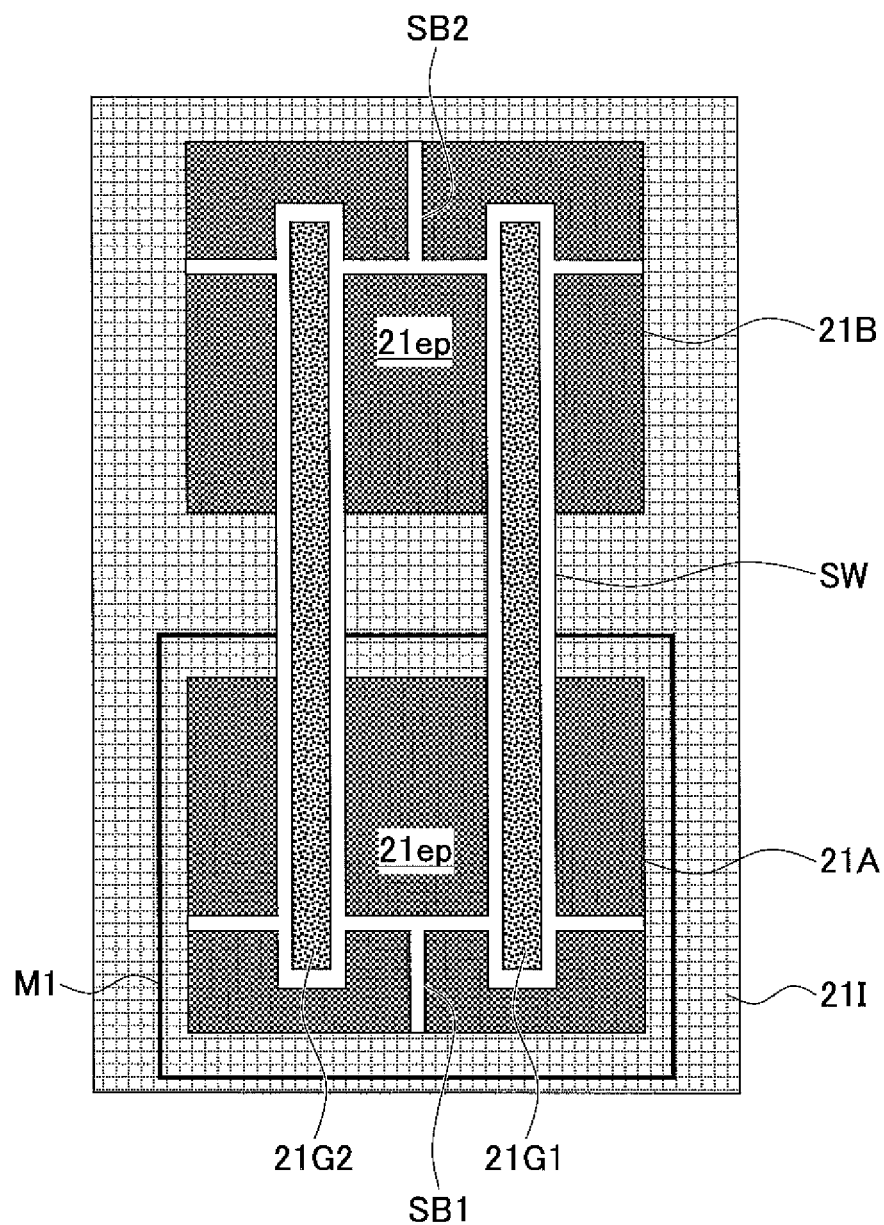
FIGS. 12A-12D are diagrams explaining the ion implantation process of FIGS. 10O-10R.
Figure 12B:
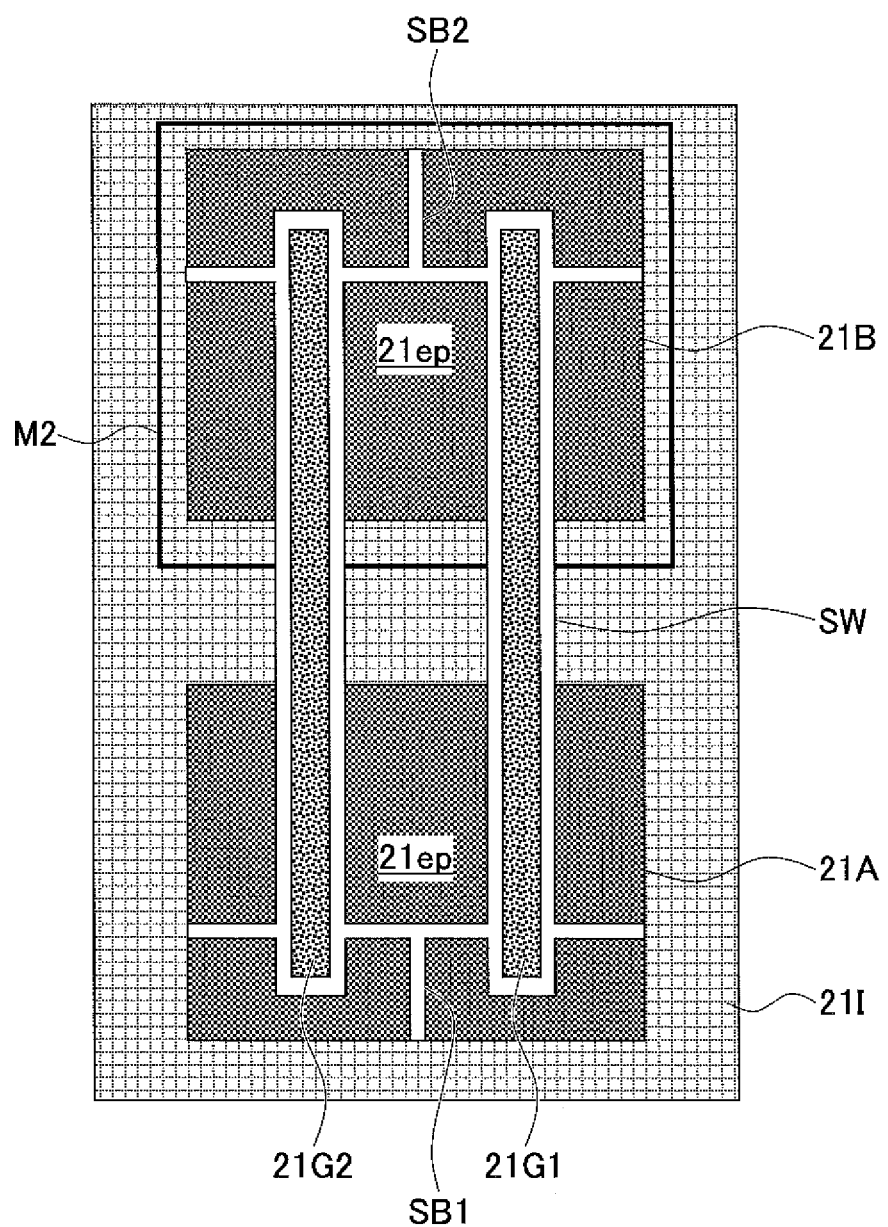

Referring to FIGS. 10O and 10P, the silicon oxide film 21O is removed together with the underlying hard mask pattern 21OM by a wet etching process, for example, after the step of FIGS. 10L and 10M, and a p-type impurity element such as B is introduced into the entirety of the device region 21A by ion implantation while using the ion injection mask M1 illustrated in FIG. 12A. With this, the entirety of the monocrystalline silicon epitaxial layer 21ep in the device region 21A including a part of the polysilicon patterns 21G1 and 21G2 is doped to the p-type with a concentration similar to that of the p-type well. Next, as represented in FIG. 12B, an n-type impurity element such as As or P is introduced into the entirety of the device region 21B by ion implantation while using an ion implantation mask M2 illustrated in FIG. 12B, and the entirety of the monocrystalline silicon epitaxial layer 21ep in the device region 21B is doped to the n-type with a concentration similar to that of the n-type well 21NW.

Figure 12C:
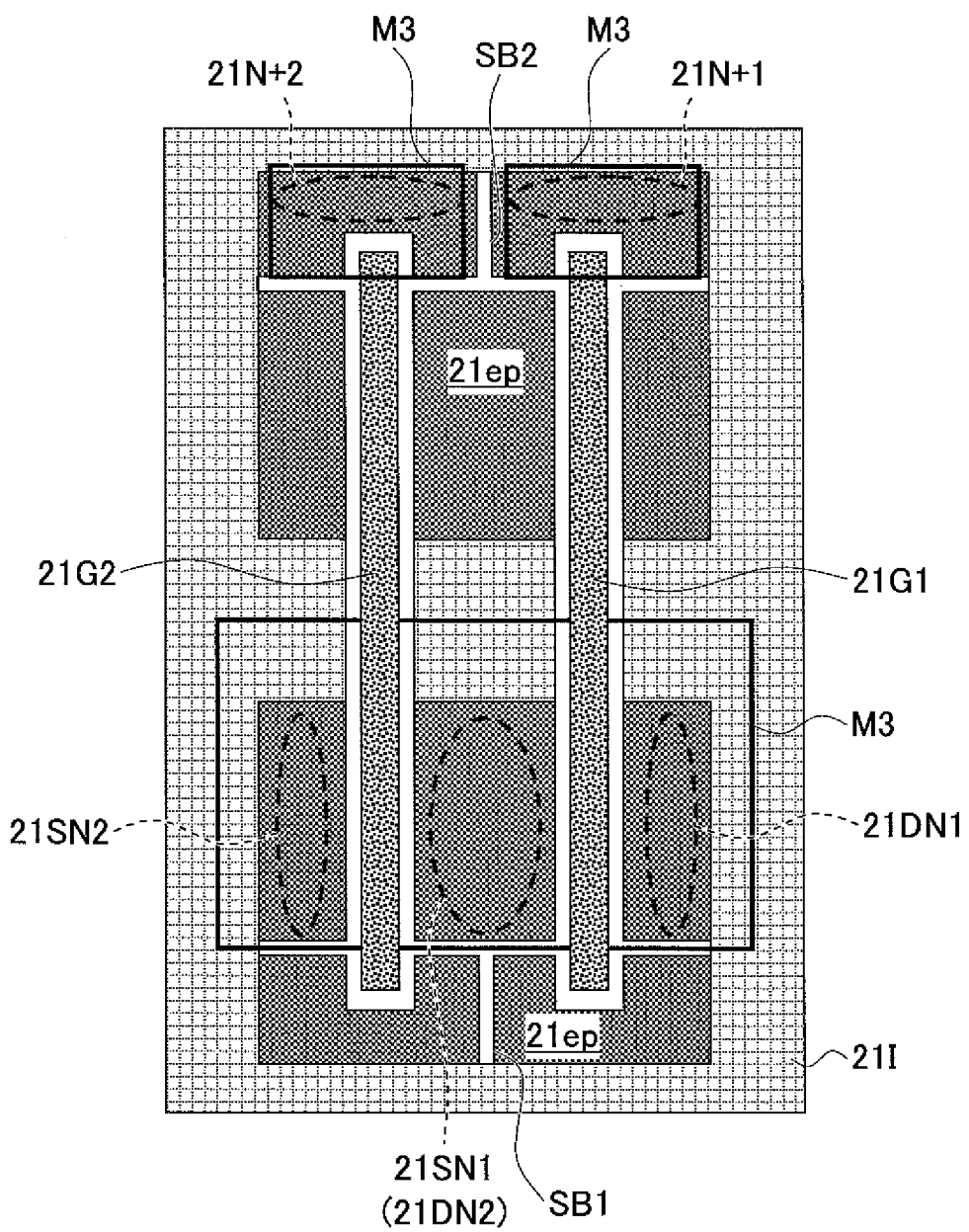

Further, in the step of FIGS. 10O and 10P, an n-type impurity element such as As or P is introduced into the monocrystalline silicon epitaxial layer 21ep at both lateral sides of the polysilicon patterns 21G1 and 21G2 in the device region 21A while using an ion implantation mask M3 illustrated in FIG. 12C with high concentration, and with this, the silicon monocrystalline regions 21DN1 and 21SN1, and hence the silicon monocrystalline region 21DN2, and further the silicon monocrystalline region 21SN2 are doped to the n$^+$-type. In the case P is introduced, the ion implantation process may be conducted under the acceleration voltage of 10 keV for example with the dose of about $6 \times 10^{15}$ cm$^{-2}$, while in the case As is introduced, the ion implantation process may be conducted under the acceleration voltage of 10 keV for example with the dose of about $6 \times 10^{15}$ cm$^{-2}$.

In the step of FIGS. 10O and 10P, it should be noted that the ion implantation of the same n-type impurity element takes place also in the part of the monocrystalline epitaxial layer 21e of the device region 21B in the vicinity of the tip end part of the polysilicon patterns 21G1 and 21G2 at the same time, and as a result, the ohmic regions 21N+1 and 21N+2 doped to the n$^+$-type are formed similarly to the diffusion regions 21SN1, 21DN1, 21SN2 and 21DN2. It should be noted that the ohmic regions 21N+1 and 21N+2 are isolated electrically as can be seen from the shape of the mask M3 of FIG. 12C, and because of this, there occurs no electrical interference between the bodies 21BY1 and 21BY2 in the device region 21A.

Further, with the foregoing ion implantation, the part of the polysilicon patterns 21G1 and 21G2 extending through the device region 21A is doped to the n$^+$-type, and with this, the n-type polysilicon gate electrodes 23G1N and 23G2N of the n-channel MOS transistors NMOS1 and NMOS2 are formed.

Figure 10Q:
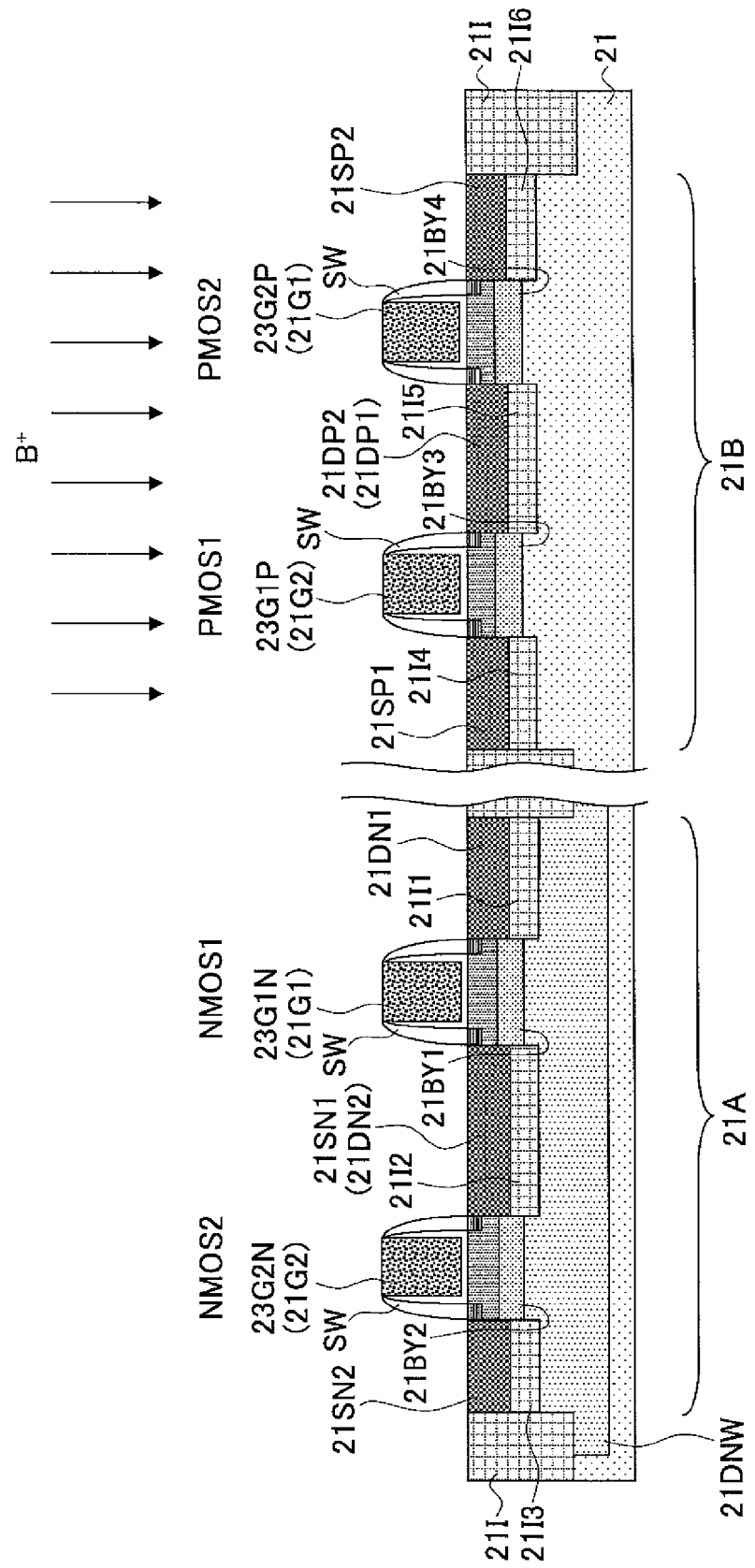

FIG. 10Q is a cross-sectional diagram taken along the lines A-A' and B-B' of FIG. 10A while FIG. 10R is a cross-sectional diagram taken along the line C-C' of FIG. 4 for showing the process of FIG. 10Q.

Figure 12D:
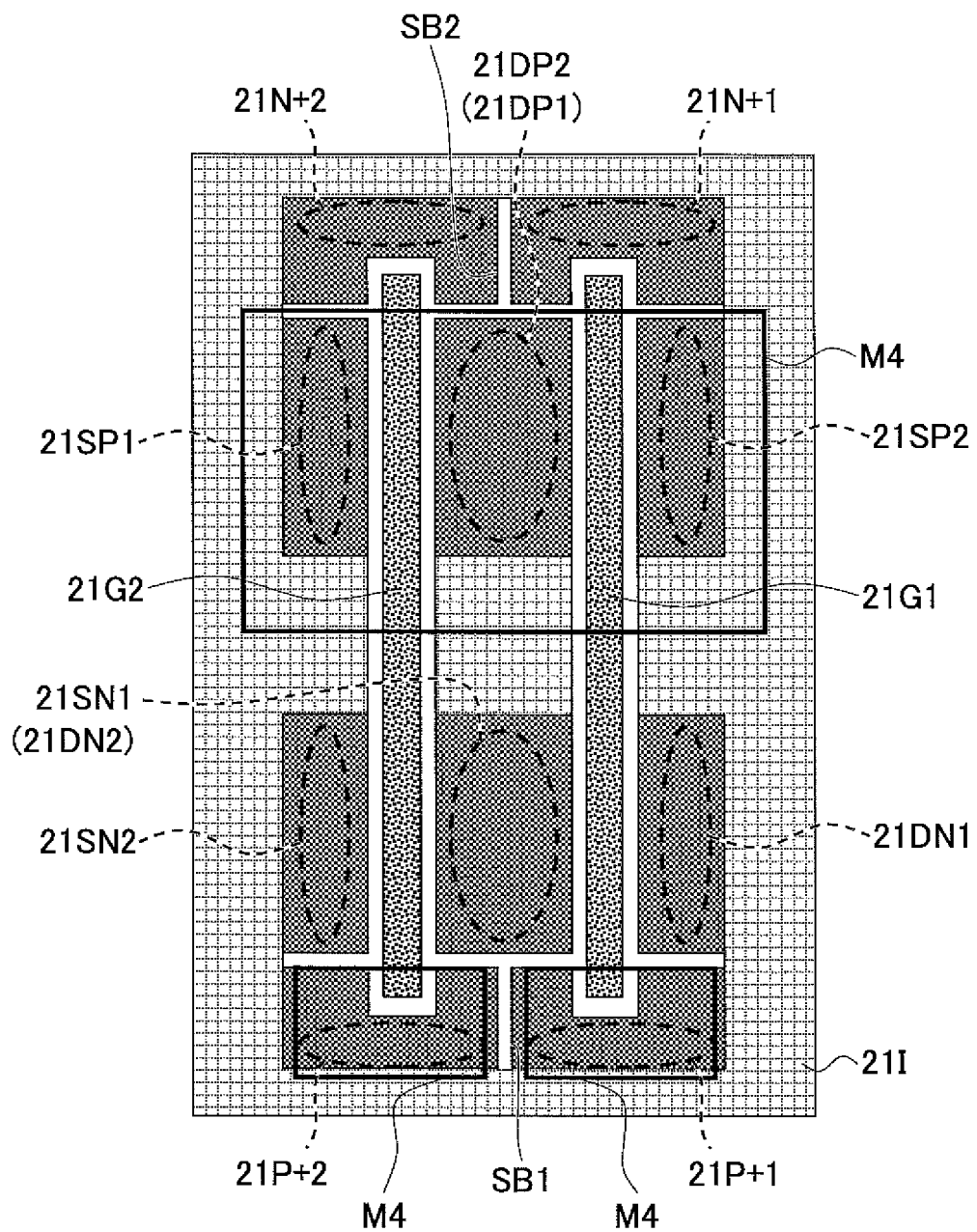

Referring to FIG. 10Q, a p-type impurity element such as B is introduced into the device region 21B after the step of FIGS. 10O and 10P with high concentration while using an ion implantation mask M4 shown in FIG. 12D, and with this, the silicon monocrystalline regions 21SP2 and 21DP2, and hence the silicon monocrystalline region 21DP1, and further the silicon monocrystalline region 21SP1 are doped to the p$^+$-type. The foregoing ion implantation may be conducted for example under the acceleration voltage of 3 keV and the dose of about $5 \times 10^{15}$ cm$^{-2}$.

In the step of FIGS. 10Q and 10R, it should be noted that the ion implantation of the same p-type impurity element takes place also in the device region 21A in the vicinity of the tip end part of the polysilicon patterns 21G1 and 21G2 at the same time, and as a result, the ohmic regions 21P+1 and 21P+2 doped to the p$^+$-type are formed similarly to the diffusion regions 21SP1, 21DP1, 21SP2 and 21DP2. It should be noted that the ohmic regions 21P+1 and 21P+2 are isolated electrically as can be seen from the shape of the mask M4 of FIG. 12D, and because of this, there occurs no electrical interference between the bodies 21BY3 and 21BY4 in the device region 21B.

Further, with the foregoing ion implantation, the part of the polysilicon patterns 21G1 and 21G2 extending through the device region 21B is doped to the p$^+$-type, and with this, the p-type polysilicon gate electrodes 23G1P and 23G2P of the p-channel MOS transistors PMOS1 and PMOS2 are formed.

It should be noted that the process of FIGS. 10Q and 10R can be conducted before the process of FIGS. 10O and 10P.

Referring to FIGS. 12A and 12B, it can be seen that the device regions 21A and 21B are defined on the silicon bulk substrate 21 by the device isolation region 21I, and the polysilicon patterns 21G1 and 21G2 extend from the device region 21A to the device region 21B while crossing the intervening device isolation region 21I.

Further, in the device region 21A, there is formed a depression continuously surrounding the polysilicon patterns 21G1 and 21G2 by the trenches T1-T3 and the trenches T7 and T9 formed in the process of FIGS. 10I and 10J, wherein the depression is filled, after being formed with the insulation regions 21I1-21I10 at the bottom thereof in the process of FIGS. 10K and 10L, with the monocrystalline silicon regions 21DN1 and 21SN1, and hence 21DN2, and 21SN2, continuously as a result of the lateral epitaxial growth in the process of FIGS. 10M and 10N.

Likewise, in the device region 21B, there is formed a depression continuously surrounding the polysilicon patterns 21G1 and 21G2 by the trenches T4-T6 and the trenches T8 and T10 formed in the process of FIGS. 10I and 10J, wherein the depression is filled, after being formed with the insulation regions 21I1-21I10 at the bottom thereof in the process of FIGS. 10K and 10L, with the monocrystalline silicon regions 21SP1 and 21DP1, and hence 21DP2, and 21SP2, continuously as a result of the lateral epitaxial growth in the process of FIGS. 10M and 10N.

Thus, in the process of FIGS. 10O and 10P, an ion implantation process of the n-type impurity element is conducted via the mask M3 after a preliminary ion implantation process using the masks M1 and M2, and the part of the monocrystalline silicon regions 21DN1, 21SN1, and hence 21DN2, and 21SN2 and the part of the polysilicon patterns 21G1 and 21G2 extending through the device region 21A, and further the ohmic regions 21N+1 and 21N+2 of the device region 21B are doped to the $n^+$-type similarly to the diffusion regions 21SN1, 21DN1, 21DN2 and 21SN2.

Further, in the process of FIGS. 10Q and 10R, an ion implantation of the p-type impurity element is conducted through the mask M4, and as a result, the part of the monocrystalline silicon regions 21SP1, 21DP1 and hence 21DP2, and 21SP2 and the part of the polysilicon patterns 21G1 and 21G2 extending through the device region 21B and further the ohmic regions 21P+1 and 21P+2 in the device region 21A are doped to the $p^+$-type similarly to the diffusion regions 21SP1, 21DP1, 21DP2 and 21SP2.

Figure 10S:
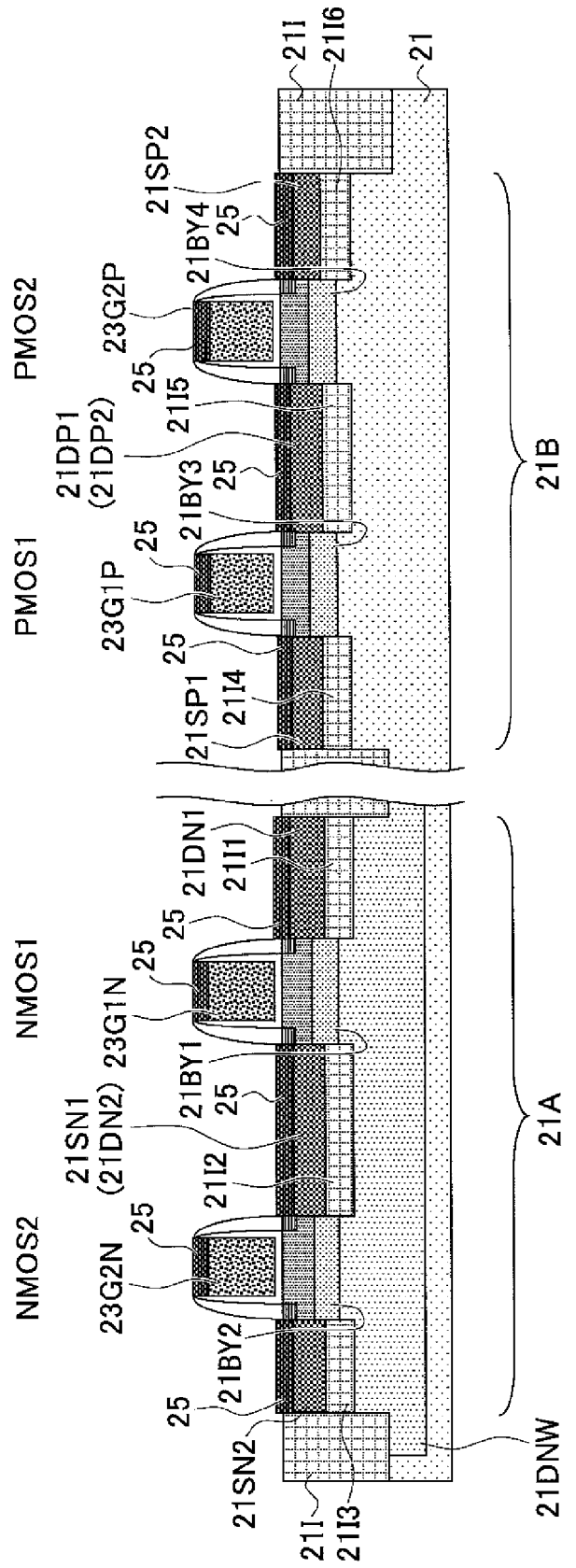
Figure 10T:
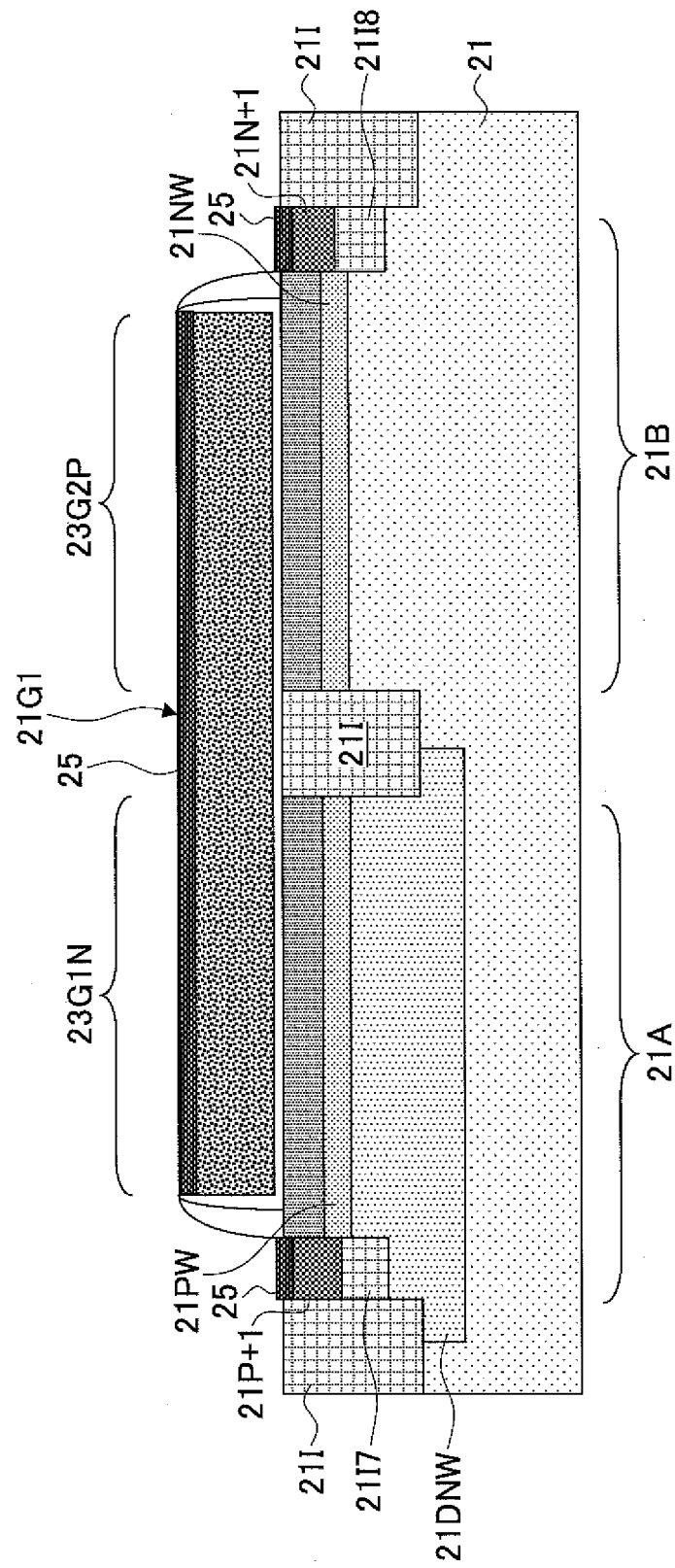

FIG. 10S is a cross-sectional diagram taken along the same cross-sections A-A' and B-B' of FIG. 10A while FIG. 10T is a cross-sectional diagram taken along the line C-C' of FIG. 4 during the process of FIG. 10S.

Referring to FIGS. 10S and 10T, there is formed, after the process of FIGS. 10Q and 10R, a silicide layer 25 of nickel silicide, for example, on the exposed surfaces of the polysilicon patterns 21G1 and 21G2, on the exposed surfaces of the monocrystalline silicon regions 21DN1, 21SN1, and hence 21DN2, and 21SN2, on the exposed surfaces of the monocrystalline silicon regions 21SP1, 21DP1, and hence 21DP2, and 21SP2, and further on the exposed surfaces of the $n^+$-type ohmic regions 21N+1 and 21N+2 and on the exposed surfaces of the $p^+$-type ohmic regions 21P+1 and 21P+2, by an ordinary salicide process.

Figure 10U:
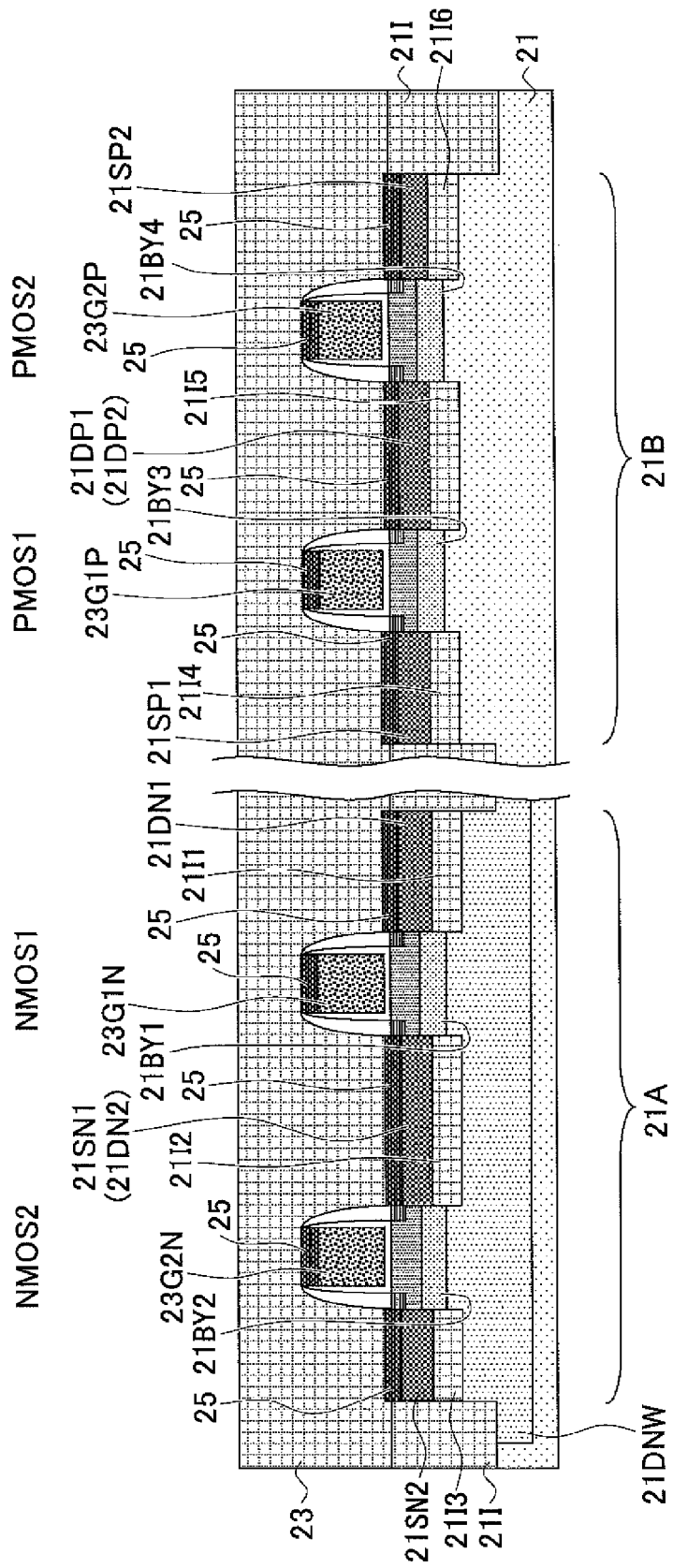
Figure 10V:
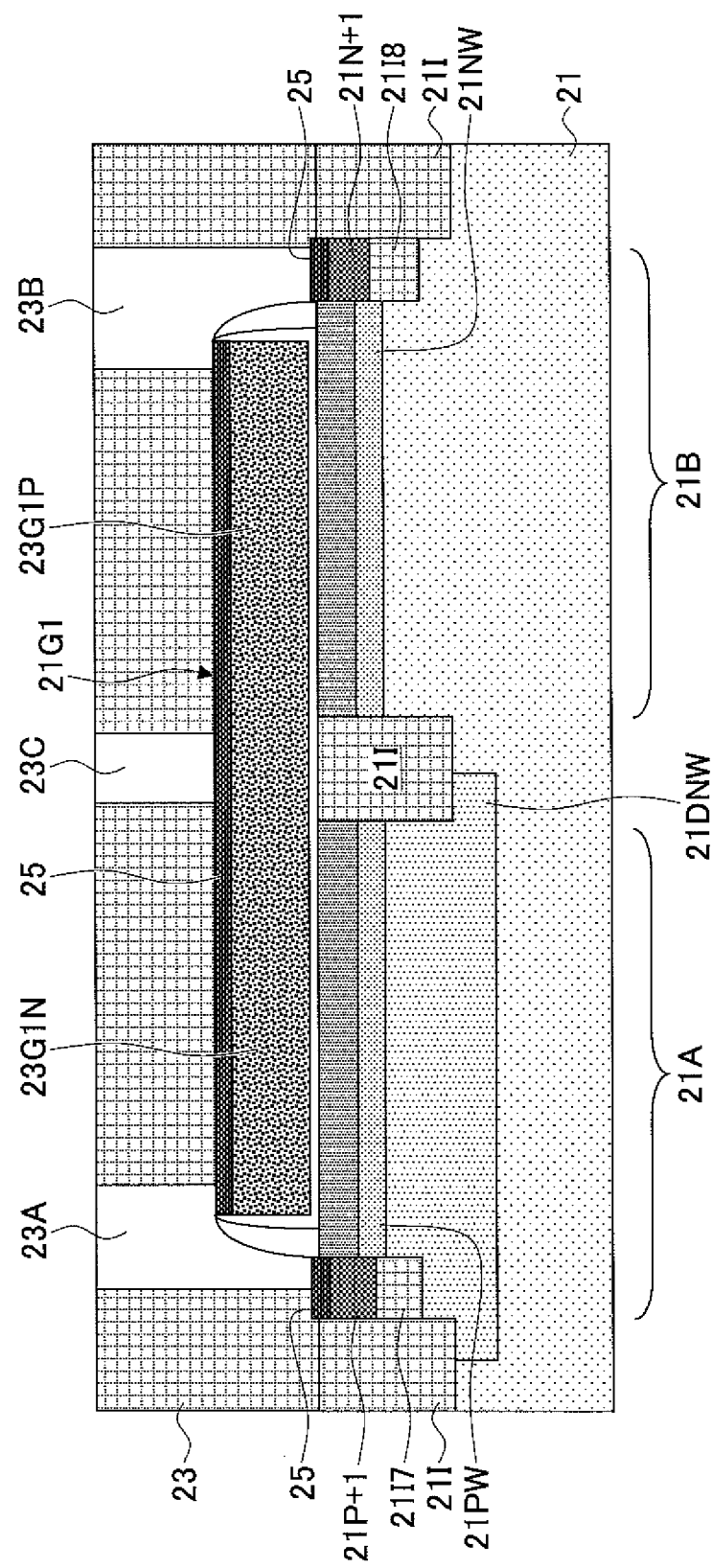

Further, in the process of FIGS. 10U and 10V, conducted subsequent to the process of FIGS. 10S and 10T, formation of the interlayer insulation film 23 is conducted over the silicon bulk substrate 21 so as to cover the gate electrodes 23G1N, 23G2N, 23G1P and 23G2P, and formation of the openings 23A and 23B explained previously is conducted in the interlayer insulation film 23 as illustrated in FIG. 10V such that the $p^+$-type ohmic region 21P+1 and the $n^+$-type ohmic region 21N+1 are exposed. Similarly, the openings 23D and 23E explained previously are formed also in the cross-section taken along the lines D-D' so as to expose the $p^+$-type ohmic region 21P+2 and the $n^+$-type ohmic region 21N+2. Reference should be made to the cross-sectional diagram of FIG. 8.

Further, in the cross-sectional diagram of FIG. 10V, it can be seen that the contact hole 23C is formed in the interlayer insulation film 23 on the device isolation insulation film 21I between the device regions 21A and 21B for the signal IN1 in correspondence to the polysilicon pattern 21G1. Further, while not illustrated, the contact hole 23F for the signal IN2 is formed over the device isolation insulation film 21I between the device regions 21A and 21B in correspondence to the polysilicon pattern 21G2. Reference should be made to the cross-sectional diagram of FIG. 8.

Further, by filling the openings 23A-23C with a metal plug of tungsten, for example, formation of the via-contacts VC1, VC2 and VC5 explained with reference to FIG. 7 is attained. Similarly, by filling the openings 23D-23F with a metal plug of tungsten, for example, formation of the via-contacts VC3, VC4 and VC6 explained with reference to FIG. 8 is attained.

Further, after formation of the signal wiring patterns 24A and 24B as necessary, the interlayer insulation film 24 is formed on the structure of FIGS. 10U and 10V. Further, after formation of the via-contacts VC7-VC11, the semiconductor logic circuit device 20 having the cross-section of FIGS. 5-9 and the layout explained with reference to FIG. 4 is obtained.

In the aforementioned fabrication process of the semiconductor logic circuit 20, it should be noted that the processes of FIGS. 10A-10F and FIGS. 10O-10R are identical to the fabrication process of ordinary, non-dynamic threshold MOS transistors. Thus, according to the present embodiment, it becomes possible to form MOS transistors performing non-dynamic threshold operation on the same semiconductor bulk substrate simultaneously to the semiconductor logic circuit device 20. Thereby, as noted previously, there is no need of changing the construction of the ordinary MOS transistors, when forming the MOS transistors performing non-dynamic threshold operation, such as providing a contact hole for fixing the body potential.

Figure 13A:
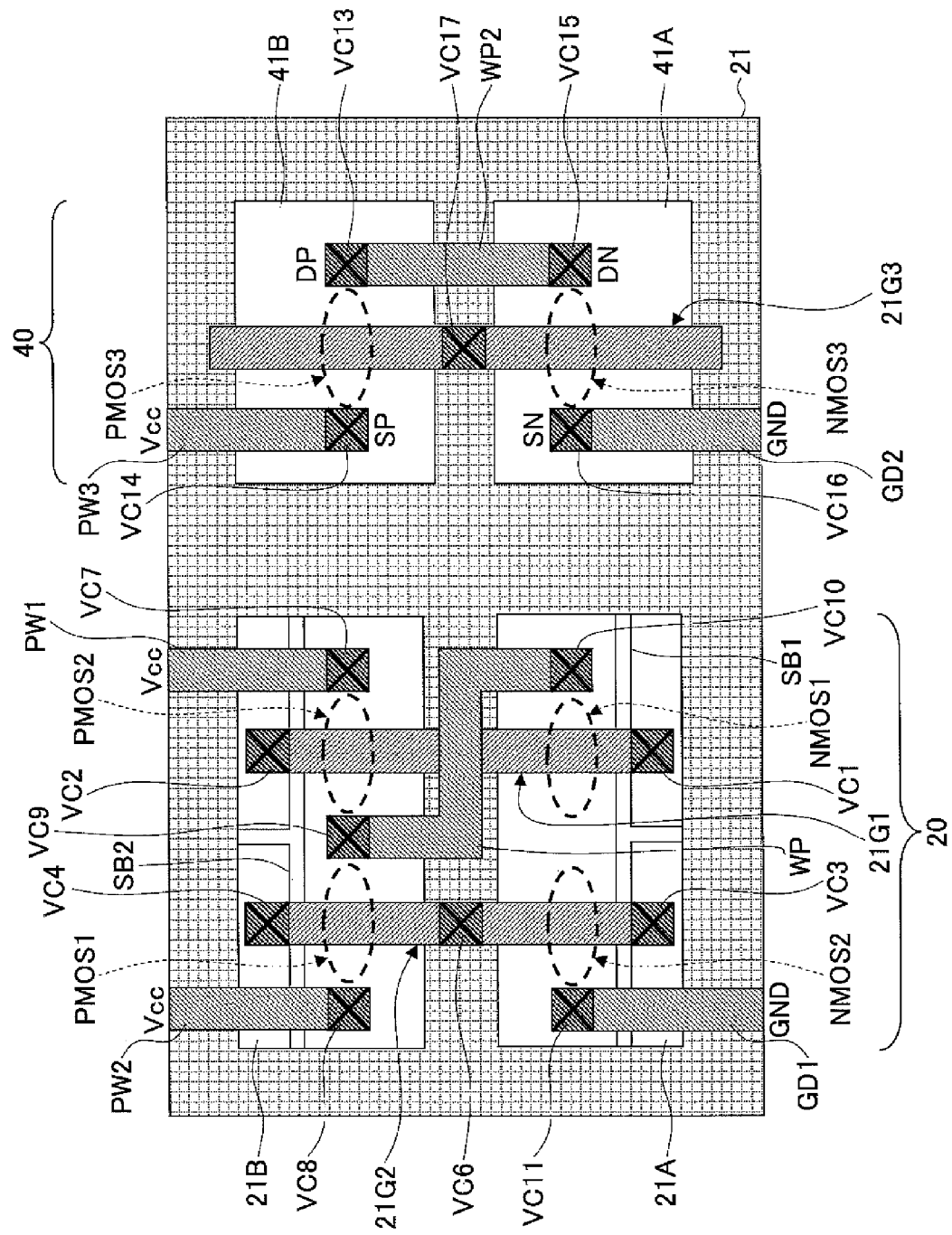
FIGS. 13A-13F are plan view diagrams showing a further modification of the first embodiment.

Thus, as represented in FIG. 13A, it is possible to integrate easily a CMOS device 40, for example, on the same silicon bulk substrate on which the semiconductor logic circuit device 20 of FIG. 4 is formed.

Referring to FIG. 13A, it can be seen that the NAND circuit 20 explained previously with reference to FIG. 4 is formed on the device regions 21A and 21B, wherein device regions 41 and 41B are defined on the same silicon bulk substrate 21 by the device isolation region 21I, and the polysilicon pattern 21G3 extends from the device region 41A to the device region 41B over the device isolation region 21i intervening between the device regions 41A and 41B.

The polysilicon pattern 21G3 is doped to $n^+$-type in the device region 41A and constitutes the gate electrode of the n-channel MOS transistor NMOS3. Thus, in the device region 41A, there are formed a source SN and a drain DN by $n^+$-type diffusion regions at both lateral sides of the polysilicon pattern 21G3, wherein the source SN is connected to the ground power supply GND via a via-contact VC16 and a ground wiring pattern GD2.

Similarly, the polysilicon pattern 21G3 is doped to $p^+$-type in the device region 41B and constitutes the gate electrode of the p-channel MOS transistor PMOS3. Thus, in the device region 41A, there are formed a source SP and a drain DP by p+-type diffusion regions at both lateral sides of the polysilicon pattern 21G3, wherein the source SP is connected to the power supply Vcc via a via-contact VC14 and a ground wiring pattern PW3. Further, the drain DP of the p-channel MOS transistor PMOS3 is connected to the drain of the n-channel MOS transistor NMOS 3 via a via-contact VC13, a local wiring pattern WP2 and a via-contact VC15, wherein the n-channel MOS transistor NMOS3 and the p-channel MOS transistor pMOS3 constitutes the CMOS device 40.

In each of the n-channel MOS transistor NMOS3 an the p-channel MOS transistor PMOS3, the gate electrode is not connected to the body and the MOS transistor performs a non-dynamic threshold operation.

Thus, with the present embodiment, it becomes possible to integrate easily a circuit that uses a Dt-MOS transistor and a circuit that uses a non Dt-MOS transistor on the same substrate while using a silicon bulk substrate.

Further, while not illustrated, it is also possible to construct the n-channel MOS transistor NMOS2 and the p-channel MOS transistor PMOS3 constituting the CMOS device 40 to have a Dt-MOS construction in the construction of FIG. 13A. In this case, the gate electrode 21G3 of the n-channel MOS transistor NMOS3 is merely connected to the body thereof by a via-contact. Likewise, the gate electrode of the p-channel MOS transistor PMOS3 is merely connected to the body thereof by a via-contact.

In the present embodiment, the depth of the bottom edge of the p-type well 21PW and the depth of the bottom edge of the n-type well 21NW are not necessarily coincident but may be changed with each other. Further, while the insulation regions 21I1-21I10 inevitably have the same depth with the process of FIGS. 10A-10V, it is possible to change the depth of the insulation regions 21I1-21I10 between the device regions 21A and 21B when the insulation regions 21I1-21I10 are formed by ion implantation of oxygen as will be explained later with reference to other embodiments, by way of changing the acceleration voltage of the oxygen ions between the device regions 21A and 21B.

Figure 13B:
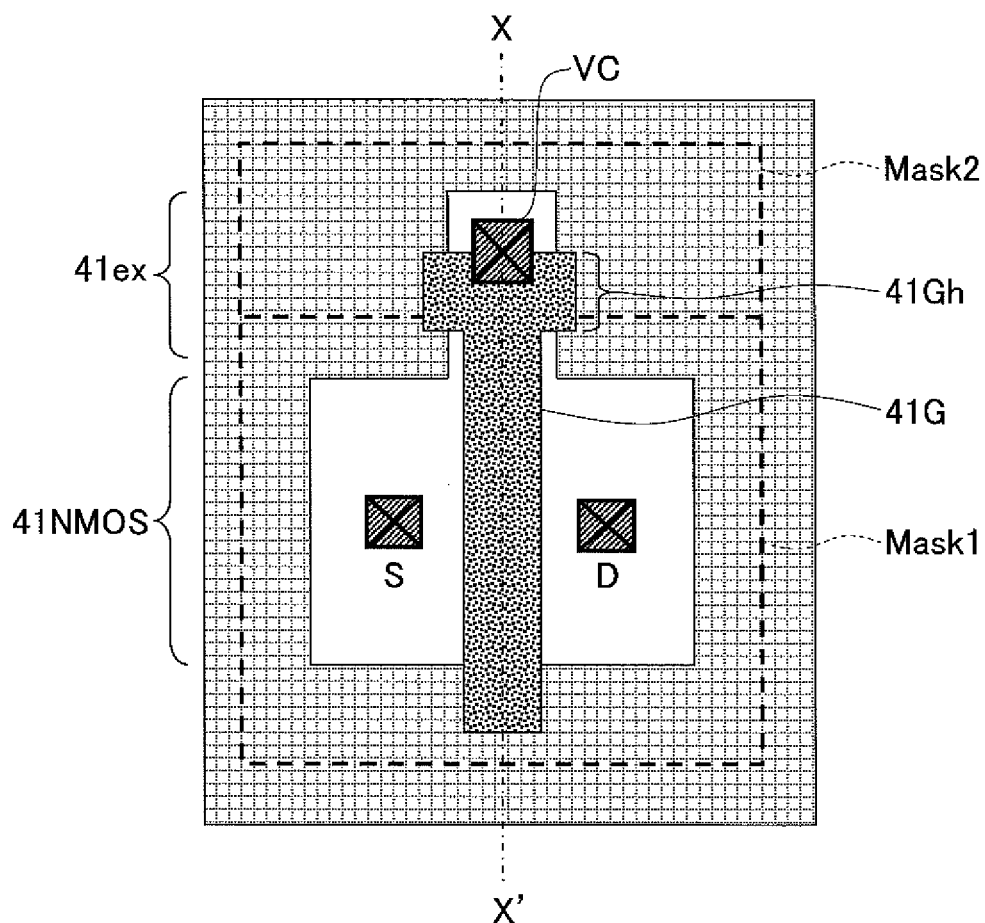
Figure 13C:
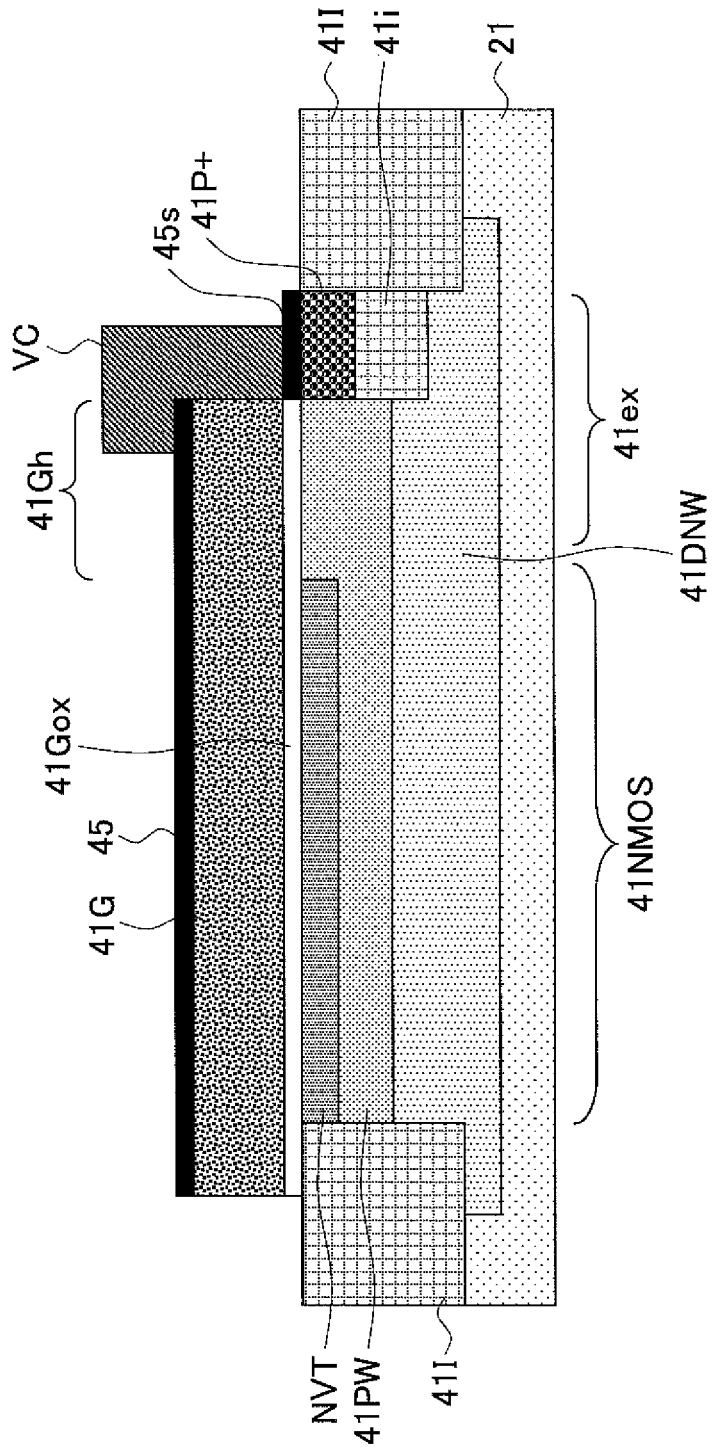

FIG. 13B represents the plan view of a single n-channel Dt-MOS transistor used with the semiconductor logic integrated circuit 20 in the present embodiment, while FIG. 13C represents a cross-sectional diagram of the MOS transistor of FIG. 13B taken along a line X-X'.

Referring to FIGS. 13B and 13C, there is formed a deep n-type well 41DNW under the device region 41NMOS defined with a device isolation structure 41I, which corresponds to the device isolation structure 21I, in correspondence to the deep n-type well 21DNW, and there is formed a p-type well 41PW above the deep n-type well 41DNW right underneath the polysilicon pattern 41G that corresponds to the polysilicon pattern 21G1 and constitutes the gate electrode of the re-channel MOS transistor 40, in such a manner to extend along the polysilicon pattern 41G. Further, a channel dope region NVT of p-type is formed in the surface of the p-type well 41PW. The gate electrode 41G is formed on the device region 41NMOS via a gate insulation film 41Gox.

In the device region 41NMOS, there are formed a source diffusion region of n+-type and a drain diffusion region of n+-type at a first side and an opposite side of the gate electrode 41G while using a Mask1 represented in FIG. 13B as an ion implantation mask, wherein the source and drain regions are formed with a source contact S and a drain contact D, respectively. Further, the gate electrode 41G is doped to n+-type in the device region 41NMOS. According to the present embodiment, the n-channel MOS transistor has an insulation pattern not illustrated similar to the insulation patterns 21I1-21I3 right underneath the source diffusion region and the drain diffusion region similarly to the n-channel MOS transistors NMOS1 or NMOS2 of which cross-section was represented previously in FIG. 5, and the source diffusion region and the drain diffusion region are formed epitaxially by a regrowth process on such insulation patterns.

Meanwhile, with the present embodiment, the device region 41NMOS defined by the device isolation region 41I has an extension part 41ex in a part thereof, wherein a head part 41Gh of the gate electrode 41G is formed on the extension part 41ex so as to cover the extension part 41ex partially via the gate insulation film 41Gox.

Further, the head part 41Gh of the gate electrode 41G and the extension part 41ex are doped to the p+-type by using a MASK2 represented in FIG. 13B as an ion implantation mask.

Underneath the extension part 41ex, there is formed an insulation pattern 41i similar to the insulation patterns 21I7-21I10 of the previous embodiment in continuation with the device isolation structure 21I, and the epitaxial layer of silicon formed on the insulation pattern 41i by a regrowth process constitutes the extension part 41ex.

Further, there is formed a silicide layer 45 on the surfaces of the polysilicon pattern 41G and the source/drain diffusion regions in the device region 41NMOS and further on the surface of the extension part 41ex, and the gate electrode 41G is connected to the extension part 41ex by a via-plug VC.

With the present embodiment, the silicide layer 45s formed on the extension region 41ex is isolated from the silicide layer 45 formed on the surface of the device region 41NMOS by the head part 41Gh of the polysilicon pattern 41G, and it becomes possible to avoid the short circuit between the via-contact VC and the source diffusion region or drain diffusion region without forming the silicide block patterns SB1 or SB2 of the previous embodiment.

Further, it is possible to form a p-channel Dt-MOS transistor similarly. In this case, however, the deep n-type well 41DNW is not used. The construction of the p-channel Dt-MOS transistor would be obvious from the explanation of the explanation of previous embodiments made with reference to FIGS. 13B and 13C and FIGS. 10A-10C, and thus, further explanation will be omitted.

Figure 13D:
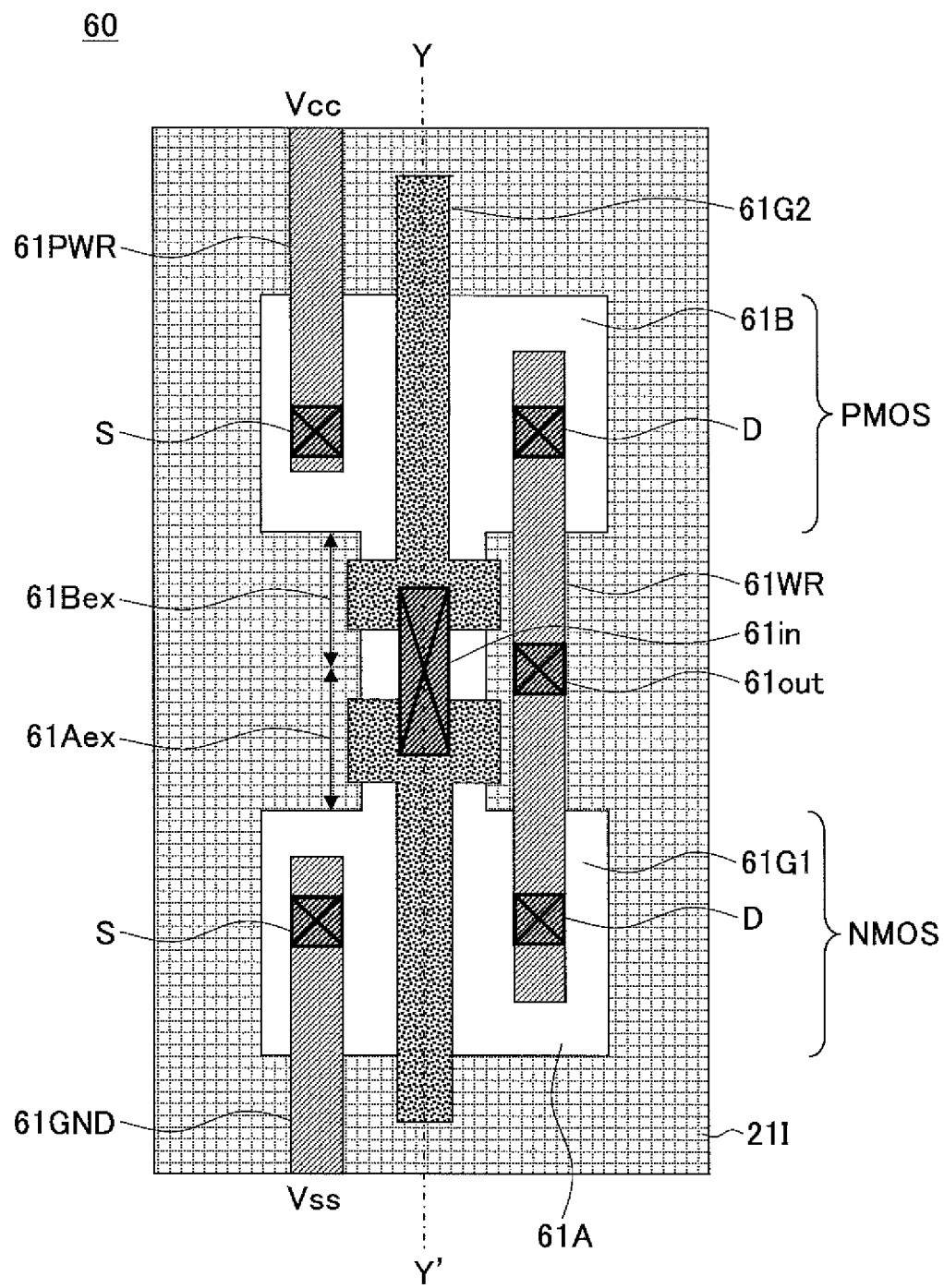
Figure 13E:
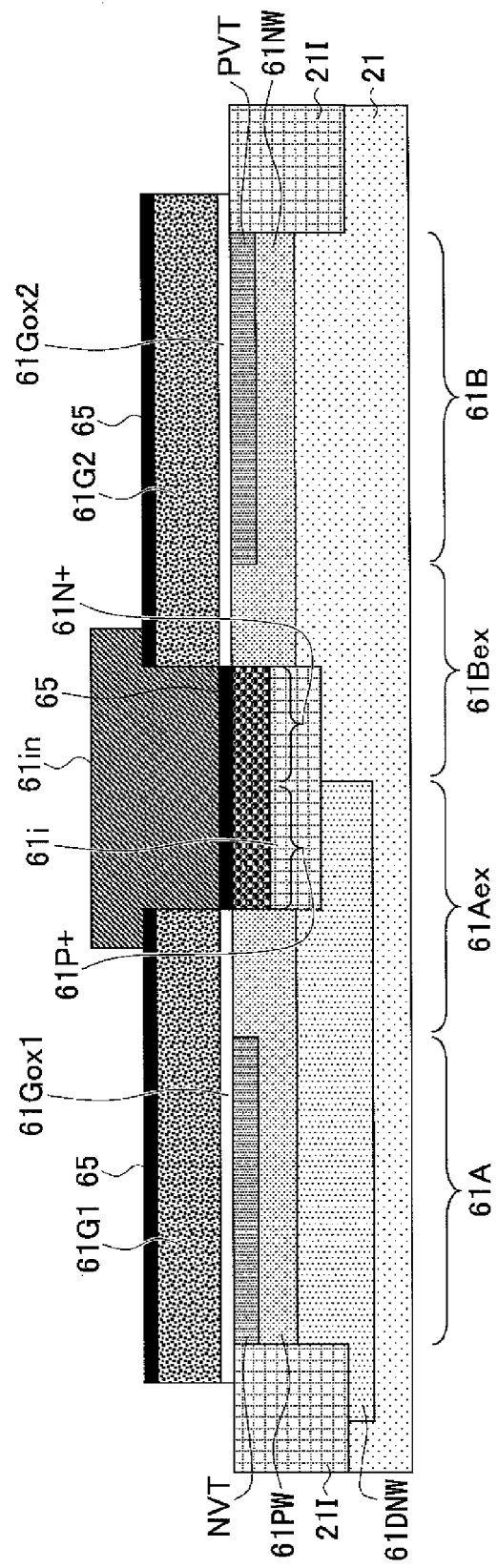

FIG. 13D is a plan view diagram showing the layout of an inverter 60 that uses the n-channel Dt-MOS transistor 41 of FIGS. 13B and 13C and a corresponding p-channel Dt-MOS transistor, while FIG. 13E represents a cross-sectional diagram taken along a line Y-Y' of FIG. 13D.

Referring to FIGS. 13D and 13E, the inverter 60 comprises an n-channel Dt-MOS transistor NMOS of the construction similar to that of the re-channel Dt-MOS transistor NMOS1 or NMOS2 of FIG. 5 and a p-channel Dt-MOS transistor PMOS of the construction similar to that of the p-channel Dt-MOS transistor PMOS1 or PMOS2 of FIG. 6, wherein the re-channel Dt-MOS transistor NMOS is formed in a device region 61A defined on the silicon substrate 21 by the device isolation region 21 while the p-channel Dt-MOS transistor PMOS is formed in a device region 61B defined on the silicon substrate 21 by the device isolation region 21I.

The device region 61A has an extension part 61Aex in a part thereof, while the device region 61B has an extension part 61Bex in a part thereof, wherein the extension parts 61Aex and 61Bex are connected with each other, and thus, the device region 61A and the device region 61B forms a single active region. The device region 61A, including the extension part 61Aex, is formed with a deep n-type well 61DNW in a lower part thereof in correspondence to the deep n-type well 21DNW.

On the device region 61A, there extends a polysilicon gate electrode 61G1 via a gate insulation film 61Gox1 including the extension part 61Aex, and there extends a p-type well 61PW right underneath the polysilicon gate electrode 61G1 in correspondence to the p-type well 21PW. Similarly, there extends a polysilicon gate electrode 61G2 on the device region 61B via a gate insulation film 61Gox2 including the extension part 61Bex, and there extends an n-type well 61NW right underneath the polysilicon gate electrode 61G2 in correspondence to the p-type well 21NW.

Further, similarly to the previous embodiments, there is formed a channel dope region NVT on the surface of the p-type well 61PW for the re-channel MOS transistor NMOS, and there is further formed a channel dope region PVT on the surface of the n-type well 61NW for the p-channel MOS transistor PMOS.

With the inverter 60 of the present embodiment, there is formed an insulation pattern 61i similar to the insulation patterns 21I7-21I10 of the previous embodiment underneath the extension parts 61Aex and 61Bex in continuation, wherein there is formed an epitaxial layer of silicon on the insulation pattern 61i by a regrowth process to form the extension parts 61Aex and 61Bex. Thereby, the silicon epitaxial layer is doped to the $p^+$-type in the extension part 61Aex to form an ohmic contact region 61P+ and further to the $n^+$-type in the extension part 61Bex to form an ohmic contact region 61N+.

The polysilicon gate electrodes 61G1 and 61G2 have respective surfaces formed with a silicide layer 65, wherein the silicide layer 65 is formed also on the surface of the ohmic contact regions 61P+ and 61N+ continuously from the ohmic contact region 61+ to the ohmic contact region 61N+. Further, a via-plug 61in is formed on the ohmic contact regions 61P+ and 61N+ so as to bridge between the gate electrodes 61G1 and 61G2.

Thus, by supplying an input voltage signal to the via-plug 61in and connecting the drain region D of the p-channel Dt-MOS transistor PMOS to the drain region D of the n-channel Dt-MOS transistor NMOS via a wiring pattern 61WR and further supplying a supply voltage Vcc to the source region S of the p-channel MOS transistor PMOS by a power wiring patter 61PWR and by grounding the drain region D of the n-channel MOS transistor NMOS as represented in FIG. 13D, the device of FIG. 13D operates as an inverter.

In the present embodiment, too, the silicide layer 65 formed on the ohmic contact regions 61P+ and 61N+ is isolated from the silicide layer formed on the source region S or drain region D of the device region 61A or from the silicide layer formed on the source region S or drain region D of the device region 61B by the gate insulation film 61Gox1 right underneath the polysilicon gate electrode 61G or the gate insulation film 61Gox2 right underneath the polysilicon gate electrode 61G2, and thus, there is no need of forming the silicide block pattern SB1 or SB2 as in the previous embodiment.

Figure 13F:
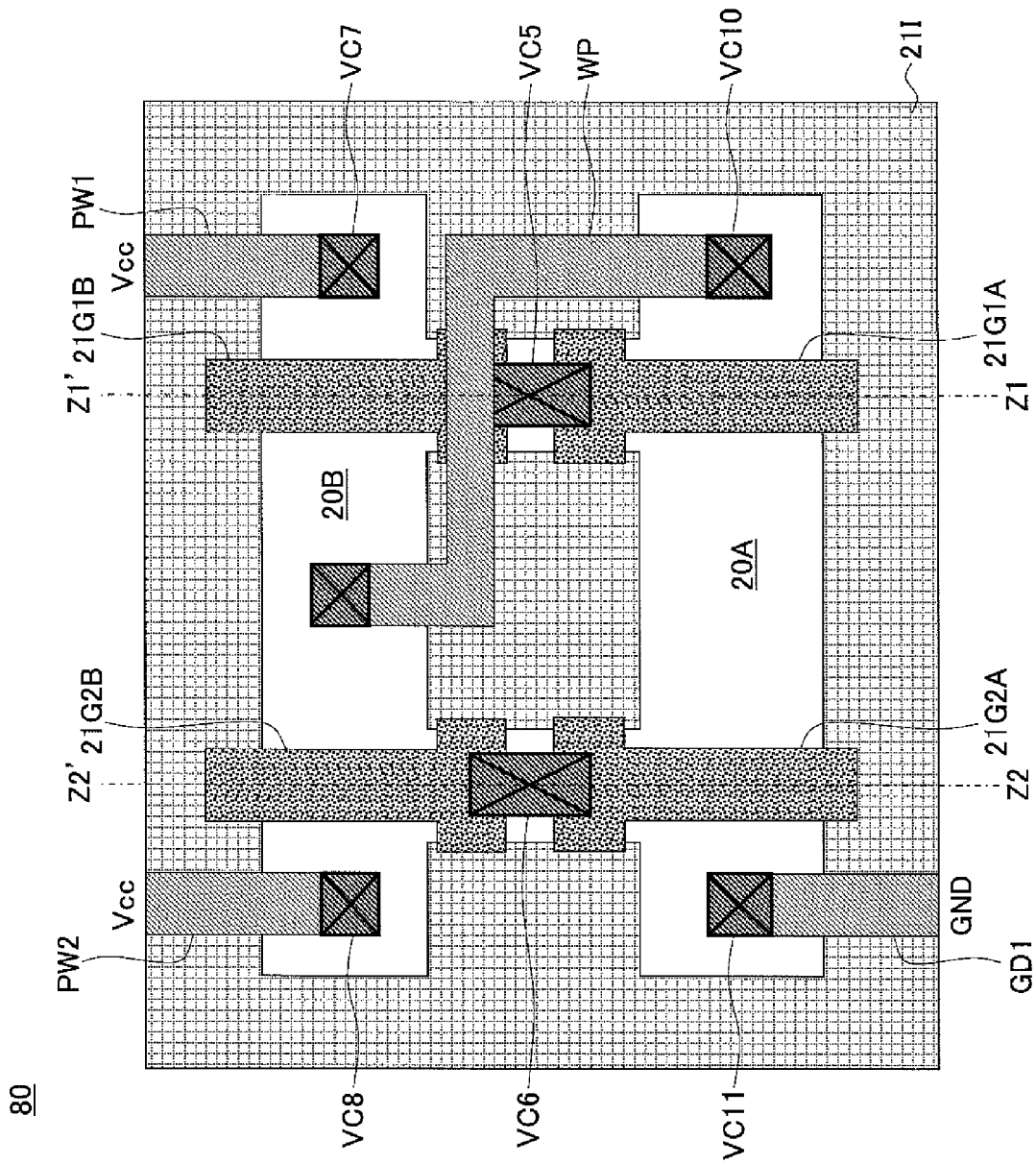

Further, FIG. 13F shows the construction of a dual input NAND device 80 that uses an inverter structure of FIGS. 13D and 13E according to a modification of the dual input NAND device 40 of FIG. 4. In FIG. 13, those parts explained before are designated by the corresponding reference numerals and the description thereof will be omitted.

In the modification of FIG. 13F, there are provided two polysilicon patterns 21G1A and 21G1B in place of the polysilicon pattern 21G1 of FIG. 4. Further, there are used two polysilicon patterns 21G2A and 21G2B in place of the polysilicon pattern 21G2.

Thereby, it should be noted that with the present embodiment, the cross-section taken along the lines Z1-Z1' or Z2-Z2' in FIG. 13F has a structure similar to that of the cross-section of FIG. 13E, and thus, the via-contact VC5 constitute the first signal input terminal and at the same time connects the polysilicon patterns 21G1A and 21G1B respectively to the p-type ohmic region 21P+1 and to the n-type ohmic region 21N+1. Similarly, the via-contact VC6 constitutes the second input terminal and at the same time connects the polysilicon patterns 21G2A and 21G2B respectively to the p-type ohmic region 21P+2 and to the n-type ohmic region 21N+2. With this, the present embodiment eliminates the via-contacts VC1-VC2 in FIG. 4.

Further, with the present modification, there is no need of forming the silicide block patterns SB1 and SB2 as in the embodiment of FIG. 4.

As a result, it becomes possible according to the present modification to reduce the area of the dual input NAND device of FIG. 4.

Second Embodiment

While the first embodiment has formed the insulation regions 21I1-21I10 in the silicon bulk substrate 21 by forming a trench and depositing a silicon oxide film in the trench thus formed, it is also possible to form the insulation regions 21I1-21I10 by way of ion implantation of oxygen ions as will be explained below.

Figure 14A:
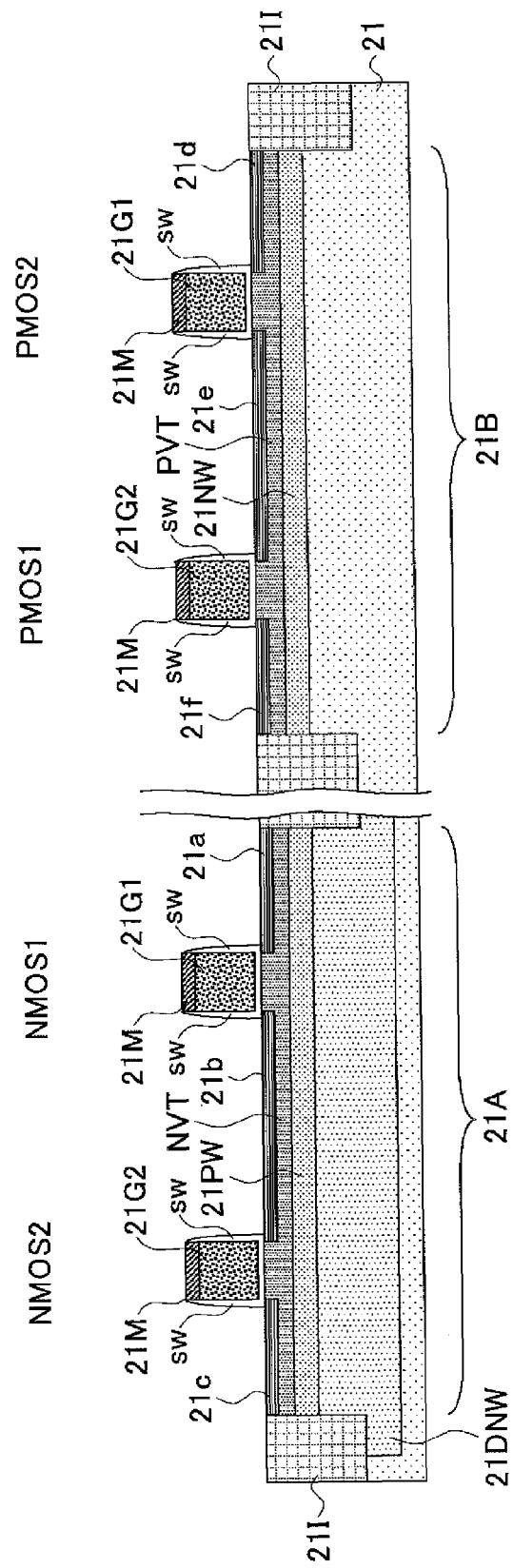
FIGS. 14A-14C are cross-sectional diagrams representing a fabrication process of the semiconductor logic circuit device of FIG. 4 according to a second embodiment.

FIG. 14A corresponds to the process of FIGS. 10C and 10D noted previously, wherein the present embodiment forms a cover film 21M blocking injection of oxygen ions on the surface of the polysilicon patterns 21G1 and 21G2 in place of the hard mask pattern 21OM by a tungsten (W) film for example with a thickness of 30 nm-50 nm.

Figure 14B:
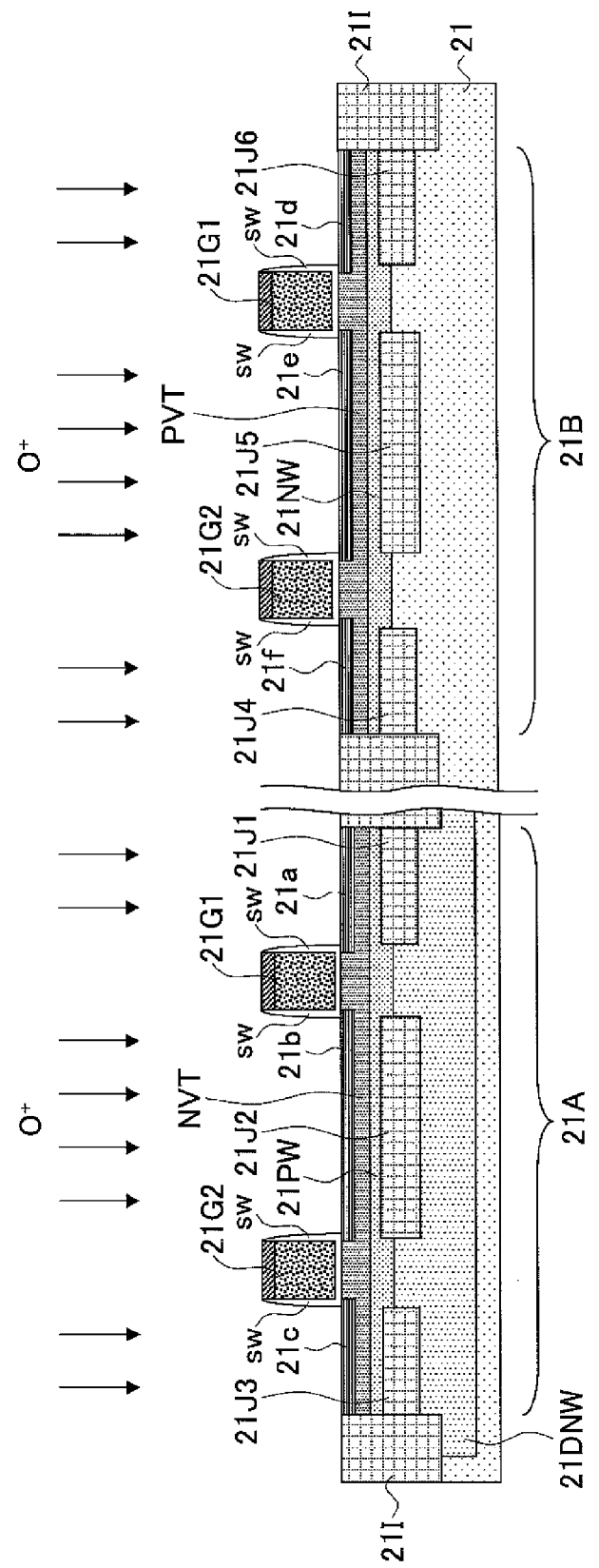

Further, in the step of FIG. 14B, oxygen ions O+ are introduced into the structure of FIG. 14A by an ion implantation process while using the cover film 21M as a mask under the acceleration voltage of 10 kev-60 keV and a dose of $1 \times 10^{16}$ $cm^{-2}$ or more to form oxygen doped regions 21J1-21J6 in correspondence to the insulation regions 21I1-21I6. While not illustrated, similar oxygen doped regions are formed also in correspondence to other insulation regions 21I7-21I10. The depth of the oxygen doped regions 21J1-21J6 can be controlled by the acceleration voltage, and thus, it becomes possible to control the top edge of the oxygen doped regions 21J1-21J6 at the depth of 27 nm by using an acceleration voltage of 10 keV, for example. Further, in the case of using the acceleration voltage of 60 keV, it is possible to control the top edge of the oxygen doped regions 21J1-21J6 at the depth of 140 nm.

Further, by conducting a rapid thermal annealing (RTA) process to the structure thus introduced with the oxygen ions at the temperature of 1050° C. or by conducting a millisecond thermal annealing (MSA) process with an energy of 20 mJ/cm2 or more, the introduced oxygen atoms are caused to react with Si atoms, and the oxygen doped regions 21J1-21J6 are converted respectively to the insulation regions 21I1-21I6 of silicon oxide film. The insulation regions 21I7-21I10 are formed similarly.

Figure 14C:
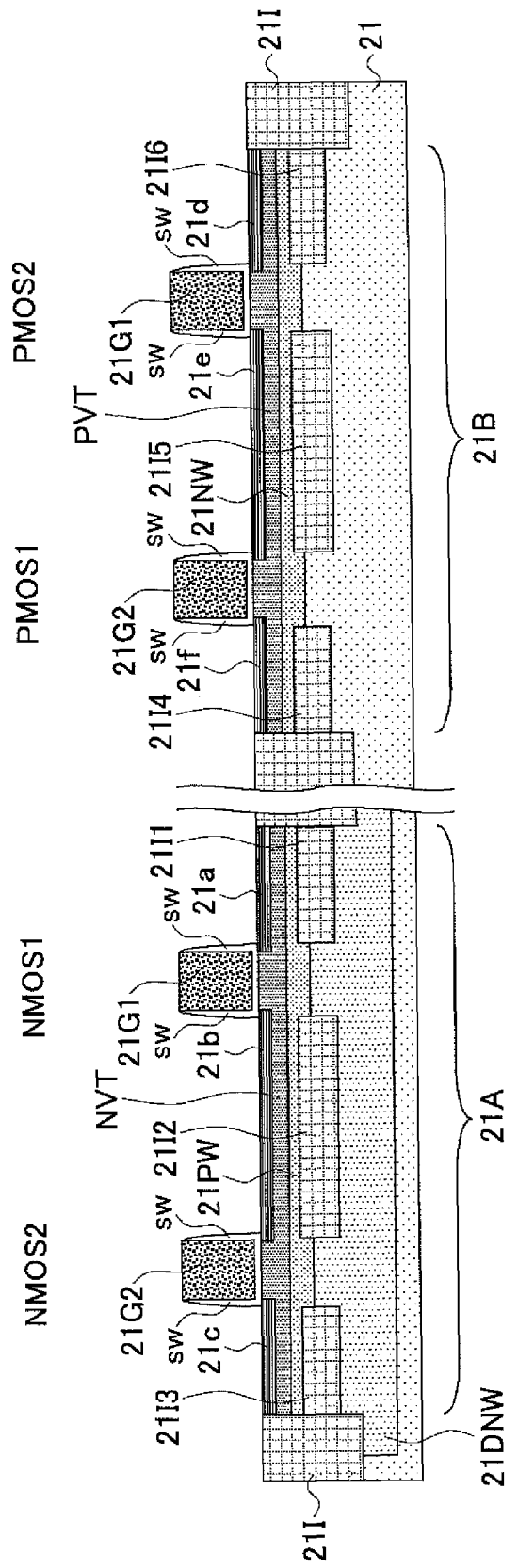

Next, in the step of FIG. 14C, the cover film 21M is removed and the structure shown in FIG. 14C is obtained. Thus, by conducting the process of FIGS. 10O and 10P and thereafter to this structure, it becomes possible to fabricate the semiconductor logic circuit 20 of FIG. 4.

Third Embodiment

FIGS. 15A-15D represent a third embodiment. It should be noted that FIGS. 15A-15D represent the process that follow the process of FIGS. 10G and 10H and replace the process of FIGS. 10I-10N.

Figure 15A:
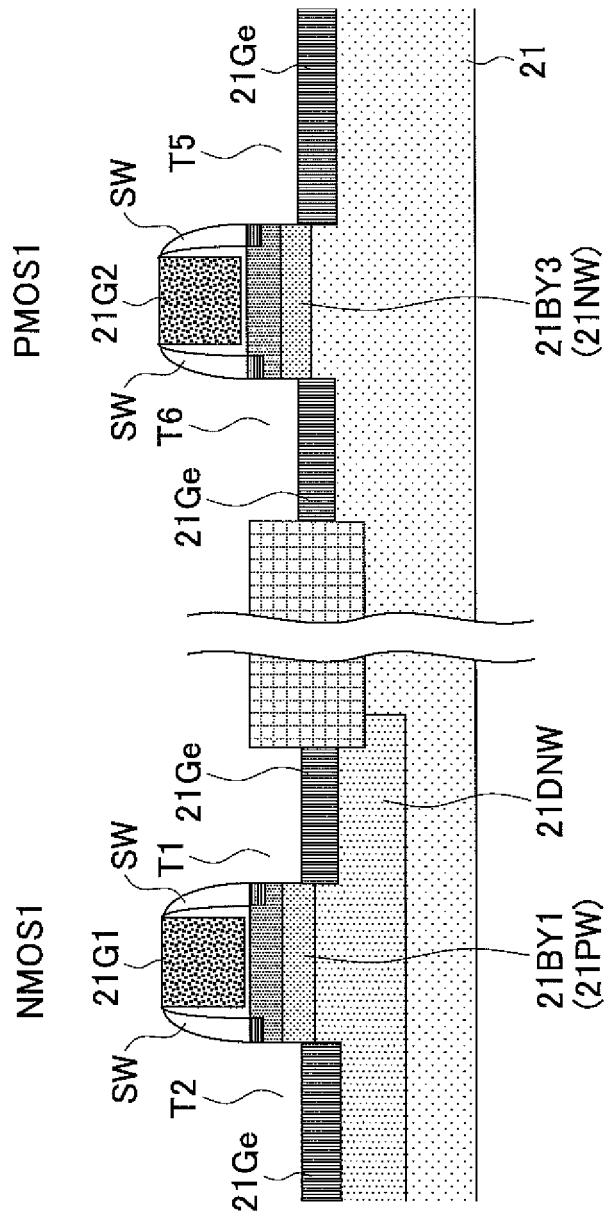
FIGS. 15A-15D are cross-sectional diagrams representing the fabrication process of the semiconductor logic circuit device of FIG. 4 according to the third embodiment.

Referring to FIG. 15A, the present embodiment forms a layer 21Ge, which is a consecutive stack of a SiGe mixed crystal layer, a Ge layer and a SiGe mixed crystal layer formed in the lower part of the trenches T1-T8 after the process of FIGS. 10G and 10H, by a sputtering process or CVD process, with such a thickness, such that the top edge of the layer 21G2 exceeds the top edge of the p-type well 21PW or the n-type well 21NW. The layer 21Ge thus formed allows easy formation of a silicon epitaxial layer thereon in view of the fact that there exists a SiGe mixed crystal layer between the underlying silicon substrate and the Ge layer and that the SiGe mixed crystal layer is formed further on the Ge layer.

In FIG. 15A, it should be noted that the re-channel MOS transistor NMOS1 represents a part of the A-A' cross-section in FIG. 4 while the p-channel MOS transistor PMOS1 represents a part of the B-B' cross-section in FIG. 4.

Figure 15B:
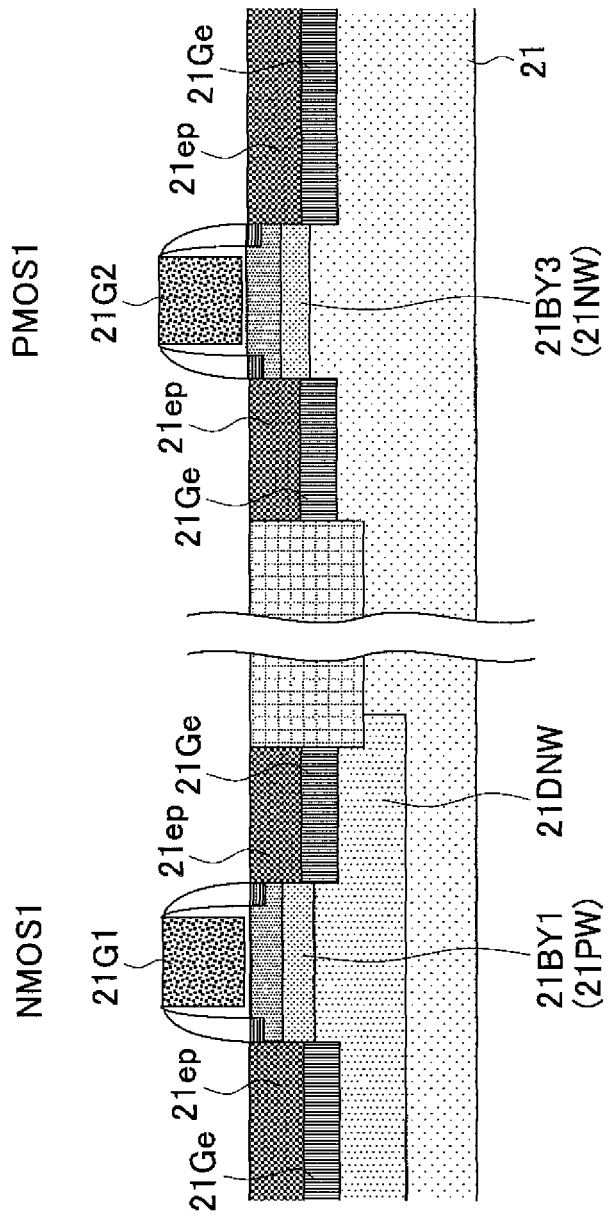

Next, in the step of FIG. 15B, the present embodiment forms the monocrystalline silicon epitaxial layer 21ep on the layer 21Ge by an epitaxial growth process. It should be noted that the formation of the monocrystalline silicon epitaxial layer 21ep can be conducted under the condition explained previously with reference to FIGS. 10M and 10N.

Figure 15C:
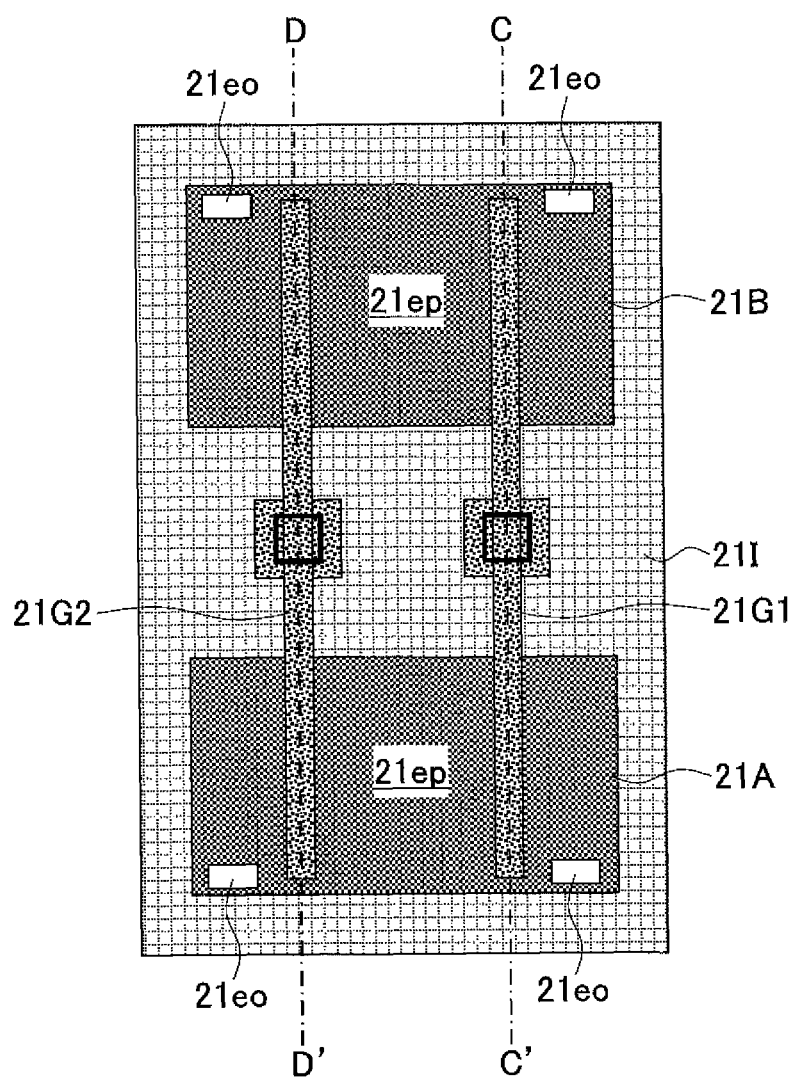

Next, in the step of FIG. 15C, the present embodiment forms an opening 21eo in the monocrystalline silicon epitaxial layer 21ep in each of the device regions 21A and 21B so as t expose the Ge layer the underlying layer 21Ge, and the silicon bulk substrate 21 is annealed in an oxygen ambient at the temperature of 600°. As a result, the Ge layer constituting the layer 21Ge is vaporized in the form of GeO and is expelled to the outside of the system from the opening 21eo.

Figure 15D:
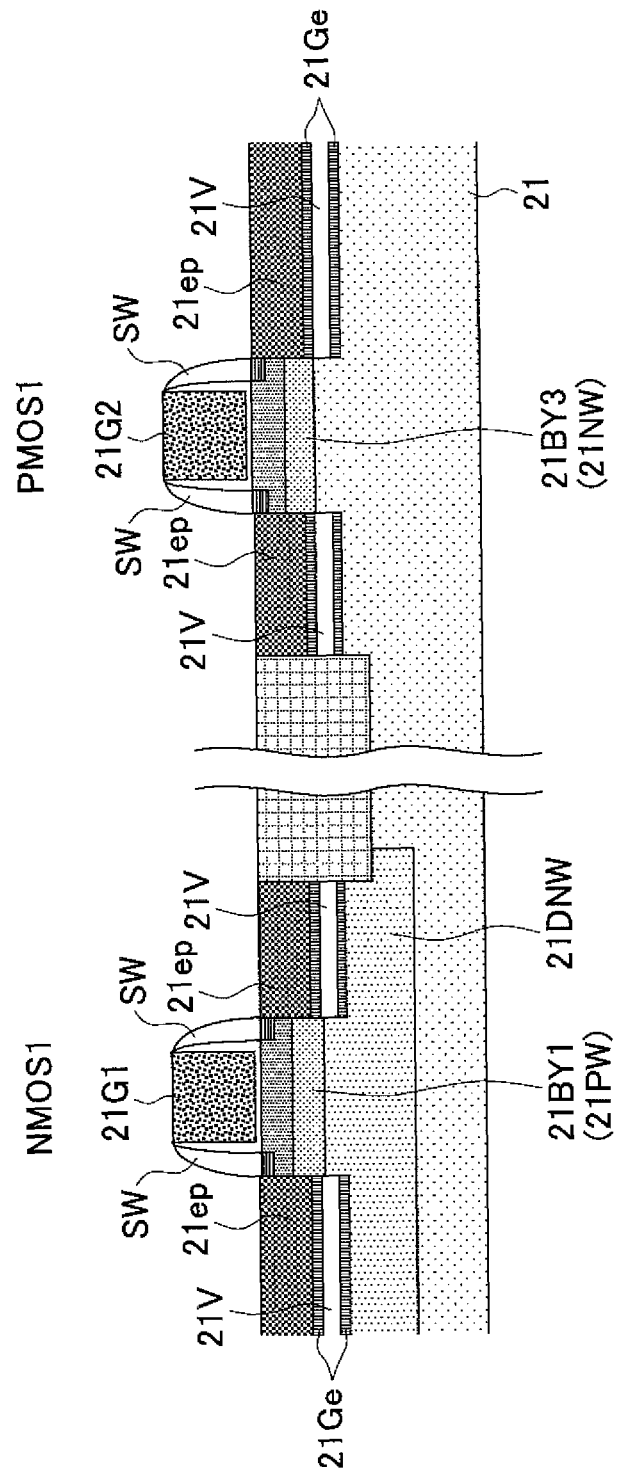

As a result, there is formed a space 21V underneath the monocrystalline silicon epitaxial layer 21ep in the present embodiment as represented in FIG. 15D in place of the insulation regions 21I1-21I10 of the previous embodiments. The space 21V thus formed exhibits an insulation function similar to those of the insulation regions 21I1-21I10, except that, because of the specific dielectric constant of 1.0, the space 21V provides preferable effects of further reduced parasitic capacitance and further improved operational speed for the n-channel MOS transistors NMOS1 and NMOS2 and the p-channel MOS transistor PMOS1 and PMOS2.

In FIG. 15D, the layer 21Ge remaining in the structure corresponds to the SiGe mixed crystal layer contained in the stacked structure.

Fourth Embodiment

Figure 16:
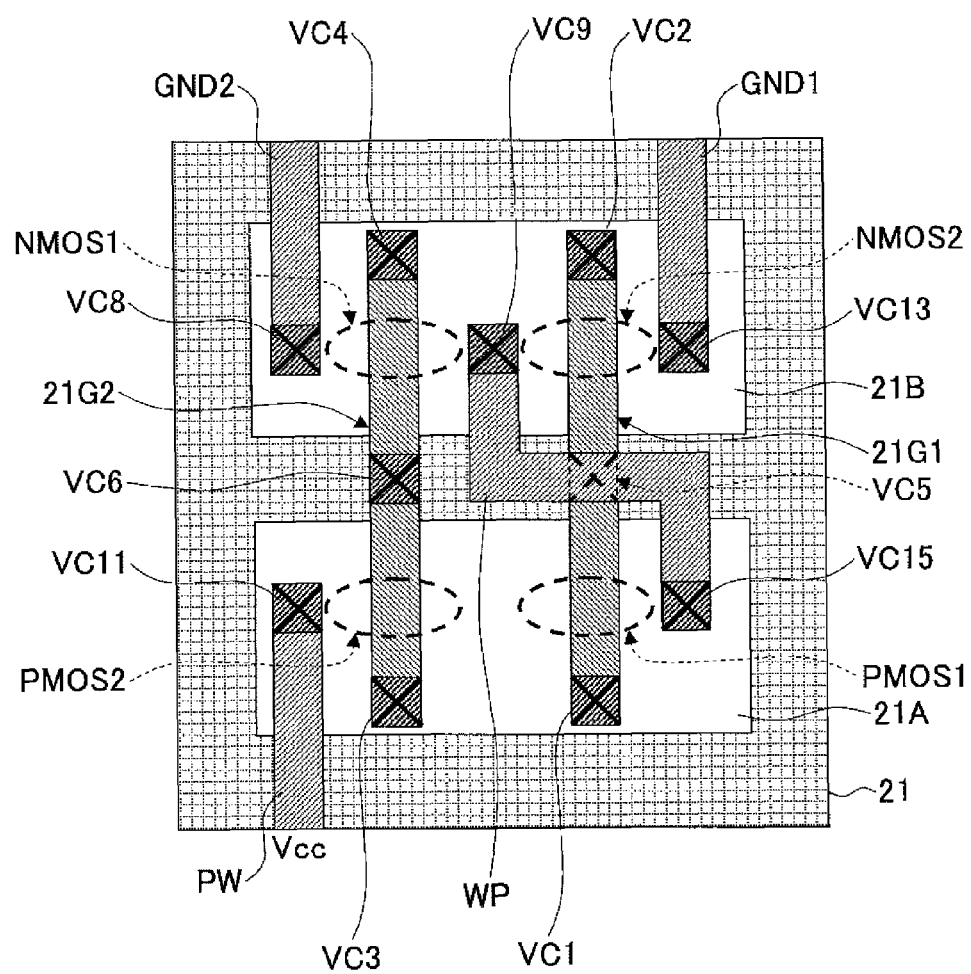
FIG. 16 is a plan view diagram representing the layout of the semiconductor logic integrated circuit device according to the fourth embodiment.

FIG. 16 is a plan view diagram representing the construction of a logic integrated circuit device according to a fourth embodiment. In FIG. 16, those parts explained before are designated by the same reference numerals and the description thereof will be omitted.

Referring to FIG. 16, the semiconductor logic circuit device 60 according to the present embodiment is an NOR circuit device and has the construction in which the device regions 21A and 21B are exchanged and the n-channel MOS transistor NSMO1 and the p-channel MOS transistor PMOS2 are exchanged and the n-channel MOS transistor NMOS2 and the p-channel MOS transistor PMOS1 are exchanged in the construction of FIG. 4. In the present embodiment, too, the n-channel MOS transistor NMOS1 and the re-channel MOS transistor NMOS2, and the p-channel MOS transistor PMOS1 and the p-channel MOS transistor PMOS2 are Dt-MOS transistors and are formed on a silicon bulk substrate.

Other constructions and advantages are as explained in the first embodiment and further explanation will be omitted.

Fifth Embodiment

The present invention should not be limited to those explained with first through fourth embodiments.

For example, the construction of FIG. 4 in which the n-channel MOS transistors NMOS1 and NMOS2 of the Dt-MOS construction are connected in series, or the construction of FIG. 16 in which the p-channel MOS transistors PMOS1 and PMOS2 of the Dt-MOS construction are connected in series, can be used independently as a semiconductor device such as a transfer gate, for example.

Figure 17:
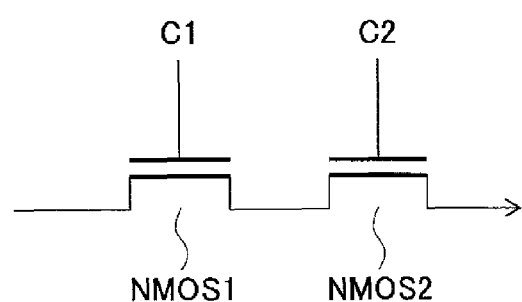
FIG. 17 is an equivalent circuit diagram representing a transfer gate according to a fifth embodiment.

FIG. 17 represents an equivalent circuit diagram of a transfer gate formed by these Dt-MOS transistors NMOS1 and NMOS2.

Referring to FIG. 17, it becomes possible to transfer a signal such as electric charge from one end to the other end in the Dt-MOS transistors NMOS1 and NMOS2 by supplying control signals C1 and C2 to the respective gate electrodes consecutively. Further, a similar transfer gate can be realized also by using Dt-MOS transistors PMOS1 and PMOS2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A semiconductor device, comprising:
a semiconductor substrate including a device region and a device isolation region;
a first dynamic threshold MOS transistor formed in the device region; and
a second dynamic threshold MOS transistor formed in the device region,
the device region including a well having a first conductivity type,
the first dynamic threshold MOS transistor having a first gate electrode formed on a surface of the semiconductor substrate via a first gate insulation film, a first diffusion region formed in the well at a first side of the first gate electrode, and a second diffusion region formed in the well at a second side of the first gate electrode opposite to the first diffusion region,
the second dynamic threshold MOS transistor having a second gate electrode formed on the surface of the semiconductor substrate via a second gate insulation film at the second side of the gate electrode, a third diffusion region formed in the well at a side of the second gate electrode closer to the first gate electrode, and a fourth diffusion region formed in the well at a side of the second gate electrode opposite to the third diffusion region,
the first and second gate electrodes and the first through fourth diffusion regions having a second conductivity type opposite to the first conductivity type, the second diffusion region and the third diffusion region being formed by a common diffusion region formed in the well, first through fourth insulation regions being formed respectively underneath the first through fourth diffusion regions in contact with respective bottom edges of the first through fourth diffusion regions, the second insulation region and the third insulation region being formed by a common insulation region, there extending a first body region of the first conductivity type and constituting a body of the first dynamic threshold MOS transistor along the first gate electrode between the first insulation region and the second insulation region as a part of the device region, there extending a second body region of the first conductivity type and constituting a body of the second dynamic threshold MOS transistor along the second gate electrode between the third insulation region and the fourth insulation region as a part of the device region, the first gate electrode being connected to the first body region electrically, the second gate electrode being connected to the second body region electrically, the first through fourth insulation regions having respective bottom edges located lower than bottom edges of the first and second body regions, the first and second body regions having respective bottom edges located lower than the bottom edges of the first through fourth diffusion regions.

2. The semiconductor device as claimed in claim 1, wherein the first gate electrode is connected to a first ohmic connection region formed in the first body region and having the first conductivity type, the second gate electrode is connected to a second ohmic connection region formed in the second body region and having the first conductivity type, the first ohmic connection region and the second ohmic connection regions are isolated with each other electrically in the well.

3. The semiconductor device as claimed in claim 2, wherein the first gate electrode and the first ohmic connection region are connected with each other by a first metal plug, and wherein the second gate electrode and the second ohmic connection region are connected with each other by a second metal plug.

4. The semiconductor device as claimed in claim 2, wherein the first through fourth diffusion regions and the first and second ohmic connection regions are formed by a regrowth epitaxial layer.

5. The semiconductor device as claimed in claim 2, wherein the first through fourth diffusion regions and the first and second ohmic connection regions are formed by a regrowth epitaxial layer of SiGe or SiC.

6. The semiconductor device as claimed in claim 1, wherein the first through fourth insulation regions are formed of a silicon oxide film.

7. The semiconductor device as claimed in claim 1, wherein the first through fourth insulation regions form a void.

8. The semiconductor device as claimed in claim 1, wherein there is defined another device region on the surface of the semiconductor substrate, and wherein there is formed, in the another device region, a MOS transistor having a gate electrode insulated electrically from the another device region.

9. A semiconductor logic circuit device, comprising:
a semiconductor substrate defined with a first device region and a second device region by a device isolation region;
a first dynamic threshold MOS transistor formed in the first device region;
a second dynamic threshold MOS transistor formed in the first device region;
a third dynamic threshold MOS transistor formed in the second device region; and
a fourth dynamic threshold MOS transistor formed in the second device region, the first device region comprising a first well having a first conductivity type, the second device region including a second well having a second conductivity type opposite to the first conductivity type, the first dynamic threshold MOS transistor including: a first gate electrode formed on a surface of the semiconductor substrate in the first device region via a first gate insulation film; a first diffusion region formed in the first well at a first side of the first gate electrode; and a second diffusion region formed in the first well at a second side of the first gate electrode opposite to the first diffusion region, the second dynamic threshold MOS transistor including: a second gate electrode formed on the surface of the semiconductor substrate in the first device region via a second gate insulation film at the second side of the first gate electrode; a third diffusion region formed in the first well at a side of the second gate electrode closer to the first gate electrode; and a fourth diffusion region formed in the first well at a side of second gate electrode opposite to the third diffusion region, the first and second gate electrodes and the first through fourth diffusion regions having the second conductivity type, the second diffusion region and the third diffusion region being formed by a common diffusion region formed in the first well, first through fourth insulation regions being formed respectively underneath the first through fourth diffusion regions in contact with respective bottom edges of the first through fourth diffusion regions, the second insulation region and the third insulation region being formed by a common insulation region, there extending a first body region of the first conductivity and constituting a body of the first dynamic threshold MOS transistor along the first gate electrode between the first insulation region and the second insulation region as a part of the first device region, there extending a second body region of the first conductivity and constituting a body of the second dynamic threshold MOS transistor along the second gate electrode between the third insulation region and the fourth insulation region as a part of the first device region, the third dynamic threshold MOS transistor including: a third gate electrode formed on the surface of the semiconductor substrate in the second device region via a third gate insulation film; a fifth diffusion region formed in the second well at a first side of the third gate electrode; and a sixth diffusion region formed in the second well at a second side of the third gate electrode opposite to the fifth diffusion region, the fourth dynamic threshold MOS transistor including: a fourth gate electrode formed on the surface of the semiconductor substrate in second device region via a fourth gate insulation film at the second side of the third gate electrode; a seventh diffusion region formed in the second well at a side of the fourth gate electrode closer to the third gate electrode; and an eighth diffusion region formed in the second well at a side of fourth gate electrode opposite to the seventh diffusion region, the third and fourth gate electrodes and the fifth through eighth diffusion regions having the first conductivity type, the sixth diffusion region and the seventh diffusion region being formed by a common diffusion region formed in the second well, fifth through eighth insulation regions being formed respectively underneath the fifth through eighth diffusion regions in contact with respective bottom edges of the fifth through eighth diffusion regions, the sixth insulation region and the seventh insulation region being formed by a common insulation region, there extending a third body region of the second conductivity type and constituting a body of the third dynamic threshold MOS transistor along the third gate electrode between the fifth insulation region and sixth insulation region as a part of the second device region, there extending a fourth body region of the second conductivity type and constituting a body of the fourth dynamic threshold MOS transistor along the fourth gate electrode between the seventh insulation region and eighth insulation region as a part of the second device region, the first gate electrode being connected to the first body region electrically, the second gate electrode being connected to the second body region electrically, the third gate electrode being connected to the third body region electrically, the fourth gate electrode being connected to the fourth body region electrically, the first through fourth insulation regions having respective bottom edges located lower than bottom edges of the first and second body regions, the fifth through eighth insulation regions having respective bottom edges located lower than bottom edges of the third and fourth body regions, the first and second body regions having respective bottom edges located lower than the bottom edges of the first through fourth diffusion regions, the third and fourth body regions having respective bottom edges located lower than the bottom edges of the fifth through eighth diffusion regions, the first gate electrode and the fourth electrode being formed by a first polysilicon pattern extending over the semiconductor substrate from the first device region to the second device region across the device isolation region, the second gate electrode and the third electrode being formed by a second polysilicon pattern extending over the semiconductor substrate from first device region to the second device region across the device isolation region, a multilayer interconnection structure including an interlayer insulation film and a wiring pattern over the semiconductor substrate.

10. The semiconductor logic circuit device as claimed in claim 9, wherein the multilayer interconnection structure comprises a first wiring pattern connecting the first diffusion region to a first power supply, a second wiring pattern connecting the second diffusion region to the sixth diffusion region, a third wiring pattern connecting the fifth diffusion region to a second power supply, and a fourth wiring pattern connecting the eighth diffusion region to the second power supply.

11. The semiconductor logic circuit device as claimed in claim 9, wherein there is defined a third device region on the surface of the bulk silicon substrate by the device isolation region, and wherein there is formed, in the third device region, a MOS transistor having a gate electrode insulated electrically from the third device region.

\* \* \* \* \*